United States Patent
Mizuno et al.

(10) Patent No.: US 8,549,999 B2
(45) Date of Patent: Oct. 8, 2013

(54) SCREEN PRINTING MACHINE AND PRINTING UNIT

(75) Inventors: Manabu Mizuno, Chiryu (JP); Takeshi Kondo, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 740 days.

(21) Appl. No.: 12/624,015

(22) Filed: Nov. 23, 2009

(65) Prior Publication Data

US 2010/0126363 A1    May 27, 2010

(30) Foreign Application Priority Data

Nov. 25, 2008  (JP) .................................. 2008-299197
Oct. 16, 2009  (JP) .................................. 2009-239632

(51) Int. Cl.
*B41F 15/14*   (2006.01)
*B41L 13/02*   (2006.01)

(52) U.S. Cl.
USPC .......................................... 101/126; 101/114

(58) Field of Classification Search
USPC .................. 101/114, 115, 126; 118/213, 301
IPC ................................... B41F 15/14; B41L 13/02
See application file for complete search history.

(56) References Cited

U.S. PATENT DOCUMENTS

| 5,123,345 | A   |   | 6/1992 | Wood |
| 5,623,872 | A   |   | 4/1997 | Tomomatsu |
| 6,202,551 | B1  | * | 3/2001 | Murakami ..................... 101/123 |
| 6,267,819 | B1  | * | 7/2001 | Doyle et al. .................. 118/213 |

FOREIGN PATENT DOCUMENTS

| CN | 1127193 A    | 7/1996 |
| CN | 1200186 A    | 11/1998 |
| CN | 101003199 A  | 1/2007 |
| JP | A 2000-168040 | 6/2000 |
| JP | A 2005-262689 | 9/2005 |
| WO | WO 97/08655  | 3/1997 |
| WO | WO 98/37741  | 8/1998 |

OTHER PUBLICATIONS

Feb. 8, 2013 Office Action issued in Chinese Patent Application No. 2009101783686 w/translation.

* cited by examiner

*Primary Examiner* — Leslie J Evanisko
(74) *Attorney, Agent, or Firm* — Oliff & Berridge, PLC

(57) ABSTRACT

A screen printing machine prints solder on circuit boards at predetermined printing positions. The screen printing machine includes a plurality of lanes arranged in a Y direction and each having a printing position, and a housing surrounding the printing positions and having replacement access ports which open in an X direction. The X direction is a direction in which the circuit boards are transferred, the Y direction is a generally horizontal direction which is generally perpendicular to the X direction, and a Z direction is a generally vertical direction which is generally perpendicular to the X direction and the Y direction. A replacement part disposed in the plurality of lanes is replaceable from the replacement access ports during a tooling change.

6 Claims, 27 Drawing Sheets ably long. Therefore, the production lines 105f and
SCREEN PRINTING MACHINE AND PRINTING UNIT

INCORPORATION BY REFERENCE

The disclosure of Japanese Patent Application No. 2008-299197 filed on Nov. 25, 2008 including the specification, drawings and abstract is incorporated herein by reference in its entirety. And the disclosure of Japanese Patent Application No. 2009-239632 filed on Oct. 16, 2009 including the specification, drawings and abstract is incorporated herein by reference in its entirety.

BACKGROUND OF THE INVENTION

1. Field of the Invention

The present invention relates to a screen printing machine and a printing unit that print solder on a circuit board on which electronic components are to be mounted.

2. Description of the Related Art

A screen printing machine is used to print solder on lands (circuit electrode portions) of a circuit board. Normally, one screen printing machine has a single printing position. Therefore, one screen printing machine can process only one circuit board at a time. With this in view, Japanese Patent Application Publication No. JP-A-2000-168040 and Japanese Patent Application Publication No. JP-A-2005-262689 each disclose a screen printing machine that can process two circuit boards at a time.

In recent years, production lines for circuit boards (a production line in which supply of circuit boards, printing of solder onto the circuit boards, and mounting of electronic components onto the circuit boards are performed sequentially) tend to have dual lanes. The screen printing machine according to each of JP-A-2000-168040 and JP-A-2005-262689 is used for a single-lane production line, in which only printing of solder onto circuit boards is performed on two circuit boards at a time. Thus, it is difficult for the screen printing machine according to each of JP-A-2000-168040 and JP-A-2005-262689 to be used for dual-lane production lines.

In dual-lane production lines, it is necessary to use two screen printing machines. FIG. 26 is a schematic view of a production line in which two screen printing machines are arranged in series (hereinafter occasionally referred to as "series production line"). FIG. 27 is a schematic view of a production line in which two screen printing machines are arranged in parallel (hereinafter occasionally referred to as "parallel production line"). In FIGS. 26 and 27, corresponding members are denoted by the same reference symbols.

The series production line is first described. As shown in FIG. 26, production lines 105f and 105r include a board supply device 100, a first screen printing machine 101, a second screen printing machine 102, and an electronic component mounting machine 103. The board supply device 100, the first screen printing machine 101, the second screen printing machine 102, and the electronic component mounting machine 103 are arranged in line along a transfer direction for circuit boards in which circuit boards are transferred (a direction from the left to the right).

The first screen printing machine 101 includes two board transfer sections 101f and 101r arranged side by side in the front-rear direction. Of the board transfer sections 101f and 101r, only the board transfer section 101f on the front side has a printing position 109f. The second screen printing machine 102 includes two board transfer sections 102f and 102r arranged side by side in the front-rear direction. Of the board transfer sections 102f and 102r, only the board transfer section 102r on the rear side has a printing position 109r.

For a circuit board 106f transferred through the production line 105f, solder is printed at the printing position 109f of the first screen printing machine 101. For a circuit board 106r transferred through the production line 105r, solder is printed at the printing position 109r of the second screen printing machine 102.

The parallel production line is then described. As shown in FIG. 27, production lines 105f and 105r include a board supply device 100, a first screen printing machine 101, a second screen printing machine 102, and an electronic component mounting machine 103. The first screen printing machine 101 and the second screen printing machine 102 are disposed side by side in the front-rear direction.

The first screen printing machine 101 includes a single board transfer section 110f. The board transfer section 110f has a printing position 111f. The second screen printing machine 102 includes a single board transfer section 110r. The board transfer section 110r has a printing position 111r.

For a circuit board 106f transferred through the production line 105f, solder is printed at the printing position 111f of the first screen printing machine 101. For a circuit board 106r transferred through the production line 105r, solder is printed at the printing position 111r of the second screen printing machine 102.

Conventionally, as described above, two screen printing machines (the first screen printing machine 101 and the second screen printing machine 102) are used for the dual-lane production lines 105f and 105r.

In the case where the first screen printing machine 101 and the second screen printing machine 102 are disposed in series as shown in FIG. 26, however, the total length of the production lines 105f and 105r in the left-right direction (the total dimension of the production lines 105f and 105r in the transfer direction for the circuit boards 106f and 106r) becomes accordingly long. Therefore, the production lines 105f and 105r occupy a large installation area on a floor of a plant. That is, the space efficiency is reduced. Meanwhile, in the case where the first screen printing machine 101 and the second screen printing machine 102 are disposed in parallel as shown in FIG. 27, the width of the production lines 105f and 105r in the front-rear direction (the dimension of the production lines 105f and 105r in a direction generally perpendicular to the transfer direction for the circuit boards 106f and 106r) becomes accordingly large. This also reduces the space efficiency. As described above, the use of two screen printing machines reduces the space efficiency. Also, portions of the lanes at which the screen printing machines forming the production lines are disposed cannot be straight because of the widths of the two screen printing machines (the dimensions of the two screen printing machines in the front-rear direction).

During a tooling change for the circuit boards 106f and 106r (a change in type of circuit boards to be produced), it is necessary to replace a replacement part such as a back-up plate, a back-up block or a back-up pin, a screen mask, and a squeegee in accordance with the type of the circuit boards 106f and 106r for each of the production lines 105f and 105r.

The production lines 105f and 105r are arranged side by side in the front-rear direction irrespective of whether the first screen printing machine 101 and the second screen printing machine 102 are arranged in series (FIG. 26) or in parallel (FIG. 27). That is, in either case, the two printing positions 109f and 109r (FIG. 26), or the two printing positions 111f and 111r (FIG. 27), are arranged side by side in the front-rear direction.

A housing of the first screen printing machine 101 is normally provided with a replacement access port that opens in a Y direction (toward an operation space 107*f*) for replacement of a replacement part. Likewise, a housing of the second screen printing machine 102 is normally provided with a replacement access port that opens in a Y direction (toward an operation space 107*r*) for replacement of a replacement part. Thus, in order to smoothly replace a replacement part in the production line 105*f* on the front side, it is preferable that an operator 108*f* approaches the replacement access port from the front side. Meanwhile, for replacement in the production line 105*r* on the rear side, it is preferable that an operator 108*r* approaches the replacement access port from the rear side.

Therefore, for smooth replacement of a replacement part, two operation spaces 107*f* and 107*r* are necessary on the front and rear sides of the production lines 105*f* and 105*r*, respectively, as shown in FIGS. 26 and 27. That is, large operation spaces 107*f* and 107*r* are necessary. Also from this point of view, the use of two screen printing machines reduces the space efficiency.

In order to avoid reduction in space efficiency, it is conceivable to provide only one of the operation spaces 107*f* and 107*r*. In the case where only one of the operation spaces 107*f* and 107*r* is provided, however, it is difficult for the operators 108*f* and 108*r* to replace a replacement part in a farther one of the production lines 105*f* and 105*r*. Specifically, it is difficult for the operator 108*f* staying on the front side of the production line 105*f* to replace a replacement part disposed in the production line 105*r* on the rear side. Meanwhile, it is difficult for the operator 108*r* staying on the rear side of the production line 105*r* to replace a replacement part disposed in the production line 105*f* on the front side.

Thus, if only the operation space 107*f*, of the operation spaces 107*f* and 107*r*, is provided, it is necessary to stop the production line 105*f* for convenience of operation when the operator 108*f* staying on the front side of the production line 105*f* replaces a replacement part in the production line 105*r* on the rear side. That is, it is necessary to stop not only the production line 105*r* but also the production line 105*f* which does not need replacement of a replacement part in the first place. This reduces the production efficiency for the circuit boards 106*f* and 106*r*. Likewise, if only the operation space 107*r*, of the operation spaces 107*f* and 107*r*, is provided, it is necessary to stop the production line 105*r* when the operator 108*r* staying on the rear side of the production line 105*r* replaces a replacement part in the production line 105*f* on the front side. This reduces the production efficiency for the circuit boards 106*f* and 106*r*.

SUMMARY OF THE INVENTION

A screen printing machine and a printing unit according to the present invention have been completed in view of the aforementioned issues. It is therefore an object of the present invention to provide a screen printing machine and a printing unit with a high space efficiency and a high production efficiency.

(1) In order to address the aforementioned issues, a first aspect of the present invention provides a screen printing machine including: a plurality of lanes arranged in a Y direction and each having a printing position at which solder is printed on a circuit board; and a housing surrounding the printing position and having a replacement access port which opens in an X direction. The X direction is a direction in which the circuit board is transferred. The Y direction is a generally horizontal direction which is generally perpendicular to the X direction. The Z direction is a generally vertical direction which is generally perpendicular to the X direction and the Y direction. A replacement part disposed in the plurality of lanes is replaceable from the replacement access port during a tooling change in which a type of the circuit board is changed.

The term "lane" as used herein refers to a part of a production line. That is, a board supply device, a screen printing machine, and an electronic component mounting machine are disposed along an exemplary production line for circuit boards in this order from the upstream side to the downstream side in the X direction. Each portion of the production line that is disposed in the board supply device, the screen printing machine, and the electronic component mounting machine is referred to as a lane. That is, each portion of the production line that is assigned to the respective devices forming the production line is referred to as a lane.

The lane in the screen printing machine has a printing position. In the lane, a circuit board is transferred to the printing position, solder is printed on the circuit board at the printing position, and the circuit board is transferred from the printing position.

The screen printing machine according to the present invention includes a plurality of lanes arranged in the Y direction and a plurality of printing positions. Therefore, the screen printing machine can be used for a plurality of production lines. Also, solder can be printed on a plurality of circuit boards in parallel. Thus, it is possible to suppress an increase in total length of the screen printing machine in the X direction (total length of the screen printing machine in the transfer direction for the circuit boards), and hence in total length of the production lines in the X direction. This allows the screen printing machine according to the present invention to achieve a high space efficiency.

According to the screen printing machine of the present invention, during a tooling change, a replacement part can be replaced from a side in the X direction (the upstream side and/or the downstream side in the transfer direction for the circuit boards) via the replacement access port. This allows an operator to perform replacement work for a replacement part from either of both sides of the screen printing machine in the Y direction. Thus, it is necessary to provide an operation space only on one side, rather than on both sides, of the screen printing machine in the Y direction. This also allows the screen printing machine according to the present invention to achieve a high space efficiency.

According to the screen printing machine of the present invention, a replacement part can be replaced from a side in the X direction. Therefore, during a tooling change, it is not necessary to stop a lane that is proximate to the operator when he/she replaces a replacement part in a lane that is distant from him/her. This allows the screen printing machine according to the present invention to produce circuit boards with a high production efficiency.

(1-1) In the aforementioned configuration (1), it is preferable that the replacement access port opens toward the upstream side in the X direction. Along an exemplary production line for circuit boards, a board supply device, a screen printing machine, and an electronic component mounting machine are disposed in this order from the upstream side to the downstream side in the X direction. A large number of various electronic components are mounted on the circuit boards. Therefore, it is often the case that a plurality of electronic component mounting machines are arranged in the X direction. That is, it is often the case that a plurality of electronic component mounting machines are arranged on the downstream side of the screen printing machine in the X direction. In contrast, it is often the case that only a board supply device is disposed on the upstream side of the screen printing machine in the X direction. As described above, a smaller number of devices are disposed on the upstream side of the screen printing machine than on the downstream side of the screen printing machine. With this in view, according to the screen printing machine with this configuration, the replacement access port opens toward the upstream side in the X direction. This configuration facilitates replacement work for a replacement part.

(2) According to a second aspect of the present invention, in the aforementioned configuration (1), it is preferable that the replacement part is one or more of a screen mask disposed above the circuit board in the Z direction at the printing position and having screen holes through which the solder passes, a squeegee disposed above the screen mask in the Z direction at the printing position to squeeze the solder into the screen holes, and a back-up member that supports the circuit board from below at the printing position.

Replacement parts enumerated in accordance with this configuration each require troublesome replacement work during a tooling change. This configuration allows replacement of such replacement parts from a side in the X direction. This alleviates the work load of the replacement work.

(3) According to a third aspect of the present invention, it is preferable that the screen printing machine according to the aforementioned configuration (2) further includes a plurality of transfer modules each including: a board transfer section that transfers the circuit board in the X direction and that is variable in dimension in the Y direction; and a back-up member transfer section disposed below the board transfer section in the Z direction and allowing the back-up member to be carried in and out in the X direction via the replacement access port.

Replacement work for a back-up member involves carry-out work for a used back-up member (before a tooling change) and carry-in work (and assembly work) for a new back-up member (after a tooling change).

In the carry-out work, it is necessary to transfer a back-up member to the outside of the screen printing machine such that component parts of the back-up member do not fall in the screen printing machine. In the carry-in work (and the assembly work), it is necessary to assemble component parts of a back-up member inside the screen printing machine in accordance with the size of a new circuit board, the layout of electronic components on the lower surface of the circuit board (in the case of dual-surface mounting), and so forth.

The back-up member is disposed below the circuit board. Thus, it is necessary for an operator to perform the carry-out work and the carry-in work (and the assembly work) described above during a tooling change while avoiding interference with the board transfer section. Replacement work for a back-up member is thus troublesome.

With this in view, according to this configuration, carry-out work for a used back-up member can be performed by the back-up member transfer section. That is, the back-up member can be transferred in the X direction to the outside of the screen printing machine via the replacement access port. This prevents interference between the back-up member and the board transfer section.

Likewise, according to this configuration, carry-in work for a new back-up member can be performed by the back-up member transfer section. That is, the back-up member can be transferred in the X direction to the inside of the screen printing machine via the replacement access port. This prevents interference between the back-up member and the board transfer section.

According to this configuration, assembly work for a back-up member can be performed outside the screen printing machine. That is, component parts of a back-up member can be assembled outside the screen printing machine, and then the back-up member can be transferred to the inside of the screen printing machine through the carry-in work described above. This prevents interference between the back-up member and the board transfer section.

(4) According to a fourth aspect of the present invention, in the aforementioned configuration (3), it is preferable that the transfer modules each further include: a transfer first fixed wall portion that includes a board transfer fixed conveyer extending in the X direction and a back-up member transfer first fixed conveyer disposed below the board transfer fixed conveyer in the Z direction and extending in the X direction; a transfer movable wall portion that is movable in the Y direction and that includes a board transfer movable conveyer facing the board transfer fixed conveyer in the Y direction and extending in the X direction; and a transfer second fixed wall portion that includes a back-up member transfer second fixed conveyer facing the back-up member transfer first fixed conveyer in the Y direction and extending in the X direction. The board transfer section may include the board transfer fixed conveyer and the board transfer movable conveyer. The back-up member transfer section may include the back-up member transfer first fixed conveyer and the back-up member transfer second fixed conveyer. The back-up member may include a back-up plate and a support member that is provided to project upward in the Z direction from the back-up plate to support the circuit board from below at the printing position. A distance between the back-up member transfer first fixed conveyer and the back-up member transfer second fixed conveyer in the Y direction may correspond to a dimension, in the Y direction, of the back-up plate that is capable of supporting a circuit board, of a plurality of types of circuit boards, that has the largest dimension in the Y direction.

The back-up member includes a back-up plate and support members. The support members are provided to project upward in the Z direction from the back-up plate. The shape, the size, the position (the X and Y coordinates on the back-up plate), the number, and so forth of the support members may be changed appropriately in accordance with the type of the circuit board to be supported. Meanwhile, the dimension of the back-up plate in the Y direction is set in accordance with the circuit board that has the largest dimension in the Y direction. This configuration allows the back-up plate to be commonly used for a plurality of types of circuit boards.

The distance between the back-up member transfer first fixed conveyer and the back-up member transfer second fixed conveyer in the Y direction corresponds to the dimension, in the Y direction, of the back-up plate that can support the circuit board that has the largest dimension in the Y direction. This ensures transfer of the back-up plate with a large dimension in the Y direction.

The distance between the board transfer fixed conveyer and the board transfer movable conveyer in the Y direction is variable. This allows transfer of a plurality of types of circuit boards with different dimensions in the Y direction.

(5) According to a fifth aspect of the present invention, in the aforementioned configuration (4), it is preferable that the transfer movable wall portion further includes a back-up member transfer movable conveyer disposed below the board transfer movable conveyer in the Z direction, facing the back-up member transfer first fixed conveyer in the Y direction, and extending in the X direction. When the back-up member is carried in and out in the X direction, the transfer movable wall portion may move in the Y direction to be arranged in line with the transfer second fixed wall portion in the X direction so that the back-up member transfer movable conveyer and the back-up member transfer second fixed conveyer are arranged in line in the X direction.

According to this configuration, during transfer of the circuit board, the transfer movable wall portion is moved in the Y direction in accordance with the dimension of the circuit board in the Y direction. Meanwhile, during transfer of the back-up member, the transfer movable wall portion is moved in the Y direction to a position at which the transfer movable wall portion is arranged in line with the transfer second fixed wall portion in the X direction. As described above, both the transfer of the circuit board and the transfer of the back-up member can be handled by appropriately moving the transfer movable wall portion in the Y direction.

(6) According to a sixth aspect of the present invention, it is preferable that the screen printing machine according to any one of the aforementioned configurations (2) to (5) further includes a printing portion including: a pair of guide portions extending in the X direction and facing each other in the Y direction, one end of each of the pair of guide portions being disposed in proximity to the replacement access port; and a screen frame over which the screen mask is spread and which is detachably accommodated in the pair of guide portions via the replacement access port.

According to this configuration, the screen mask can be easily replaced by sliding the screen frame with respect to the guide portions in the X direction. That is, the screen frame which is a relatively heavy replacement part can be attached and detached easily.

(7) In order to address the aforementioned issues, a seventh aspect of the present invention provides a printing unit including: the screen printing machine according to any one of the aforementioned configurations (3) to (6); and a board supply device including a plurality of supply modules each including: a board supply section that transfers the circuit board in the X direction and that is variable in dimension in the Y direction, the board supply section being arranged on an upstream side of the board transfer section in the X direction; and a back-up member supply section disposed below the board supply section in the Z direction and allowing the back-up member to be carried in and out in the X direction via the replacement access port, the back-up member supply section being arranged on an upstream side of the back-up member transfer section in the X direction.

The printing unit includes a screen printing machine and a board supply device. The back-up member supply section of the board supply device is arranged on a side of the back-up member transfer section of the screen printing machine in the X direction. Therefore, during a tooling change, the carry-out work can be completed by just delivering a used back-up member from the back-up member transfer section to the back-up member supply section. Also, the carry-in work can be completed by just delivering a new back-up member from the back-up member supply section to the back-up member transfer section. Moreover, component parts can be assembled in the back-up member supply section so as to obtain a back-up member corresponding to a new circuit board. Alternatively, a back-up member which has already been assembled can be mounted to the back-up member supply section.

(8) According to an eighth aspect of the present invention, in the aforementioned configuration (7), it is preferable that the supply modules each further include: a supply first fixed wall portion that includes a board supply fixed conveyer extending in the X direction and a back-up member supply first fixed conveyer disposed below the board supply fixed conveyer in the Z direction and extending in the X direction; a supply movable wall portion that is movable in the Y direction and that includes a board supply movable conveyer facing the board supply fixed conveyer in the Y direction and extending in the X direction; and a supply second fixed wall portion that includes a back-up member supply second fixed conveyer facing the back-up member supply first fixed conveyer in the Y direction and extending in the X direction. The board supply section may include the board supply fixed conveyer and the board supply movable conveyer. The back-up member supply section may include the back-up member supply first fixed conveyer and the back-up member supply second fixed conveyer. The back-up member may include a back-up plate and a support member that is provided to project upward in the Z direction from the back-up plate to support the circuit board from below at the printing position. A distance between the back-up member supply first fixed conveyer and the back-up member supply second fixed conveyer in the Y direction may correspond to a dimension, in the Y direction, of the back-up plate that is capable of supporting a circuit board, of a plurality of types of circuit boards, that has the largest dimension in the Y direction.

This configuration allows the back-up plate to be commonly used for a plurality of types of circuit boards. The distance between the back-up member supply first fixed conveyer and the back-up member supply second fixed conveyer in the Y direction corresponds to the dimension, in the Y direction, of the back-up plate that can support the circuit board that has the largest dimension in the Y direction. This ensures transfer of the back-up plate with a large dimension in the Y direction.

The distance between the board supply fixed conveyer and the board supply movable conveyer in the Y direction is variable. This allows supply of a plurality of types of circuit boards with different dimensions in the Y direction.

(9) In order to address the aforementioned issues, a ninth aspect of the present invention provides a printing unit including: a screen printing machine including: a plurality of lanes arranged in a Y direction and each having a printing position at which solder is printed on a circuit board; and a plurality of transfer modules which are movable in the Y direction in accordance with positions of the plurality of lanes and which each include a board transfer section that transfers the circuit board in an X direction; a board relay device arranged on an upstream side of the screen printing machine in the X direction and including a plurality of relay modules each including a board relay section that transfers the circuit board in the X direction; and a Y-direction moving transfer device arranged on an upstream side of the board relay device in the X direction and including a Y-direction moving portion that transfers the circuit board in the X direction and that is movable in the Y direction in accordance with a position of the board relay section. The X direction is a direction in which the circuit board is transferred. The Y direction is a generally horizontal direction which is generally perpendicular to the X direction. An operation space is secured at a position that is next to the board relay device in the Y direction and that is between the screen printing machine and the Y-direction moving transfer device.

According to the printing unit of the present invention, the operation space can be secured at a position that is directly on the upstream side, in the X direction, of the printing position of the screen printing machine. This makes it easy for the operator to perform work such as part replacement or maintenance. Also, the operation space can be secured at a position that is next to the screen printing machine not in the Y direction but in the X direction, in other words, in an area of the production line. This achieves a high space efficiency.

According to the printing unit of the present invention, work can be performed on the screen printing machine from a side in the X direction. Therefore, it is not necessary to stop a lane which is proximate to the operator when he/she performs work on a lane which is distant from him/her. This allows the printing unit according to the present invention to produce circuit boards with a high production efficiency.

(9-1) In the aforementioned configuration (9), it is preferable that the Y-direction moving transfer device includes: a reference wall portion including a reference conveyer extending in the X direction; a driven wall portion including a driven conveyer facing the reference conveyer in the Y direction and extending in the X direction; a base member including a Y-direction guide portion with which the reference wall portion and the driven wall portion are in sliding contact so as to be movable in the Y direction; a first driving device that drives the reference wall portion and the driven wall portion in the Y direction; and a second driving device that drives the driven wall portion in the Y direction independently of the reference wall portion. The total length of the Y-direction guide portion in the Y direction may correspond to the dimension, in the Y direction, of a circuit board, of a plurality of types of circuit boards, that has the largest dimension in the Y direction.

In a shuttle conveyer which is an example of a conventional Y-direction moving transfer device, a reference wall portion and a driven wall portion are disposed on a shuttle base. A circuit board is transferred in the X direction using a reference conveyer of the reference wall portion and a driven conveyer of the driven wall portion. During a tooling change (a change in type of the circuit board to be produced), the driven wall portion is moved in the Y direction with respect to the reference wall portion. Therefore, the dimension, in the Y direction, of the largest circuit board that can be transferred relies on the total length of the shuttle base in the Y direction. That is, a circuit board that is wider than the total length of the shuttle base in the Y direction cannot be transferred.

In this respect, according to this configuration, no shuttle base is disposed in the first place. Therefore, a circuit board with a large dimension in the Y direction can be transferred irrespective of the total length of a shuttle base in the Y direction. Specifically, a large-sized circuit board with a dimension, in the Y direction, equivalent to the total length of the Y-direction guide portion in the Y direction can be transferred.

In the case of a shuttle conveyer which is an example of a conventional Y-direction moving transfer device, not only the reference wall portion and the driven wall portion but also the shuttle base is moved in the Y direction to move the circuit board in the Y direction. The shuttle base is relatively heavy. Thus, in order to move the heavy shuttle base in the Y direction, a driving source (motor) with a high capacity is necessary. In addition, a driving force transmission mechanism (a ball screw portion-nut mechanism) with a high allowable weight is necessary.

In this respect, the first driving device according to this configuration drives only the reference wall portion and the driven wall portion in the Y direction. The reference wall portion and the driven wall portion are relatively lightweight. Thus, a driving source with a high capacity is unnecessary. In addition, a driving force transmission mechanism with a high allowable weight is unnecessary. This also facilitates increasing the speed of movement in the Y direction.

In the case of a shuttle conveyer which is an example of a conventional Y-direction moving transfer device, a Y-direction guide rail for moving the shuttle base and a Y-direction guide rail for moving the driven wall portion are necessary.

This results in a complicated structure. In this respect, according to this configuration, only one Y-direction guide portion is provided. This results in a simple structure. This configuration may be implemented independently of the aforementioned configuration (9).

(9-2) In the aforementioned configuration (9-1), it is preferable that the first driving device includes a first motor disposed on the base member and a timing belt driven by the first motor, and that the second driving device includes a second motor disposed on the driven wall portion and a pulley which is driven by the second motor and around which the timing belt is wound.

According to this configuration, the reference wall portion and the driven wall portion can be easily moved using a belt-pulley mechanism. In a shuttle conveyer which is an example of a conventional Y-direction moving transfer device, a ball screw portion-nut mechanism for moving the shuttle base and a ball screw portion-nut mechanism for moving the driven wall portion are necessary. This results in a complicated structure. In this respect, according to this configuration, only one timing belt which is equivalent to the ball screw portions of the conventional shuttle conveyer is provided. This results in a simple structure.

(9-3) In the aforementioned configuration (9-1), it is preferable that the first driving device includes a first motor disposed on the base member and a ball screw portion driven by the first motor, and that the second driving device includes a second motor disposed on the driven wall portion and a nut driven by the second motor and mounted around the ball screw portion.

According to this configuration, the reference wall portion and the driven wall portion can be easily moved using a ball screw portion-nut mechanism. In a shuttle conveyer which is an example of a conventional Y-direction moving transfer device, a ball screw portion-nut mechanism for moving the shuttle base and a ball screw portion-nut mechanism for moving the driven wall portion are necessary. This results in a complicated structure. In this respect, according to this configuration, only one ball screw portion is provided. This results in a simple structure.

(10) In order to address the aforementioned issues, a tenth aspect of the present invention provides a printing unit including: a screen printing machine including: a plurality of lanes arranged in a Y direction and each having a printing position at which solder is printed on a circuit board; and a plurality of transfer modules which are movable in the Y direction in accordance with positions of the plurality of lanes and which each include a board transfer section that transfers the circuit board in an X direction; and an X-direction moving transfer device arranged on an upstream side of the screen printing machine in the X direction and including an X-direction moving portion that transfers the circuit board in the X direction and a fixed portion that movably supports the X-direction moving portion. The X direction is a direction in which the circuit board is transferred. The Y direction is a generally horizontal direction which is generally perpendicular to the X direction. The X-direction moving transfer device is switchable between a transfer mode in which the circuit board is fed to the screen printing machine and an operation mode in which an operation space is secured at a position that is on an upstream side of the screen printing machine in the X direction by moving the X-direction moving portion away from the screen printing machine.

The expression "to movably support" as used herein means that the fixed portion supports the X-direction moving portion such that the X-direction moving portion is movable with respect to the fixed portion on a track such as a linear track, a bent track, an arcuate track, a partially arcuate track, and an irregularly curved track.

The X-direction moving transfer device of the printing unit according to the present invention is switchable between the transfer mode and the operation mode. In the transfer mode, the circuit board is transferred in the X direction. In the operation mode, an operation space is secured at a position that is on the upstream side of the screen printing machine.

According to the printing unit of the present invention, the operation space can be secured at a position that is directly on the upstream side, in the X direction, of the printing position of the screen printing machine by switching the X-direction moving transfer device to the operation mode. This makes it easy for the operator to perform work such as part replacement or maintenance. Also, the operation space can be secured at a position that is next to the screen printing machine not in the Y direction but in the X direction, in other words, in an area of the production line. This achieves a high space efficiency.

(10-1) In the aforementioned configuration (10), it is preferable that the fixed portion supports the X-direction moving portion so as to be movable in a reciprocating manner in the X direction. According to this configuration, in the transfer mode, the circuit board can be transferred by moving the X-direction moving portion to which the circuit board is mounted in the X direction. Also, in the operation mode, an operation space can be secured by moving the X-direction moving portion in the X direction away from the screen printing machine.

(10-2) In the aforementioned configuration (10), it is preferable that the fixed portion supports the X-direction moving portion such that the X-direction moving portion can flip up. According to this configuration, in the transfer mode, the circuit board can be transferred by disposing the X-direction moving portion next to the fixed portion. Also, in the operation mode, an operation space can be secured by flipping up the X-direction moving portion away from the screen printing machine.

The present invention can provide a screen printing machine and a printing unit with a high space efficiency and a high production efficiency.

DETAILED DESCRIPTION OF THE EMBODIMENTS

Now, printing units according to embodiments of the present invention will be described. The following description is also applied to screen printing machines according to embodiments of the present invention.

First Embodiment

Configuration of Production Line

Figure 1:
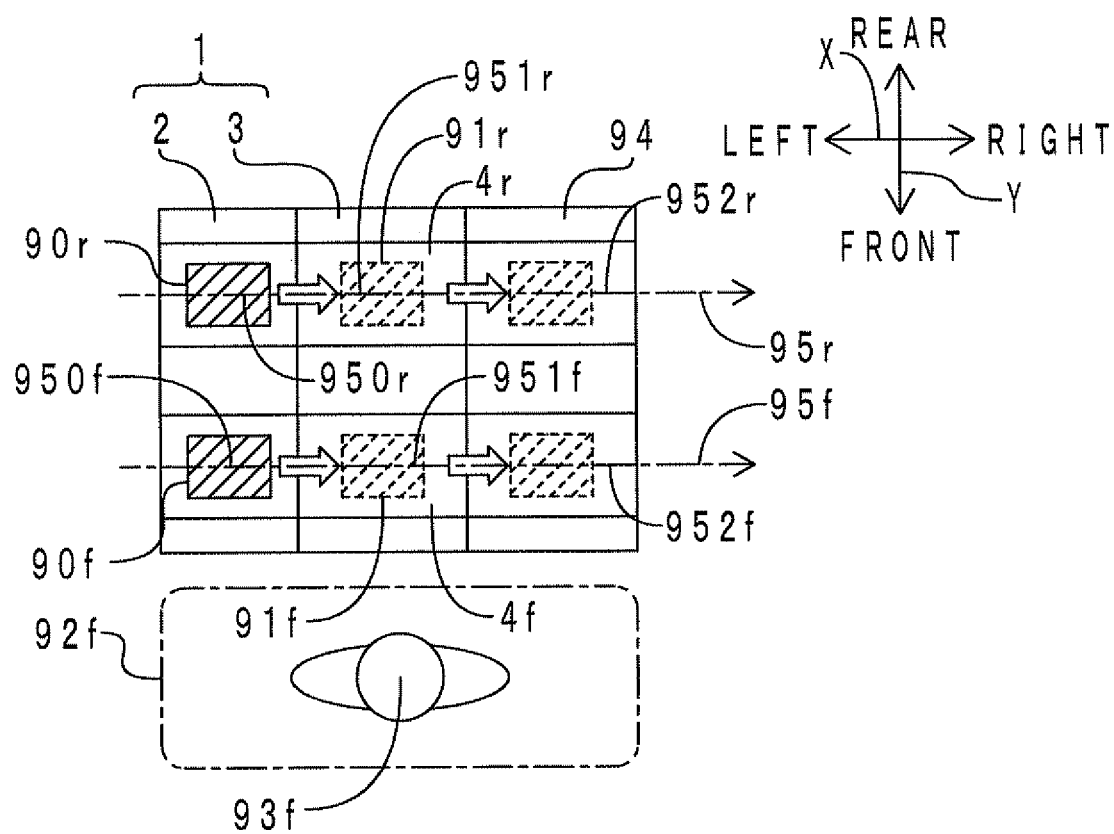
FIG. 1 is a schematic view of a production line in which a printing unit according to a first embodiment of the present invention is disposed.

First, the configuration of a production line in which a printing unit according to the present embodiment is disposed is described. FIG. 1 is a schematic view of a production line in which the printing unit according to the present embodiment of the present invention is disposed. In the following drawings, the left-right direction (the transfer direction for circuit boards) corresponds to the X direction of the present invention. The front-rear direction corresponds to the Y direction of the present invention. The up-down direction corresponds to the Z direction of the present invention.

As shown in FIG. 1, a printing unit 1 and an electronic component mounting machine 94 are disposed side by side in the left-right direction along dual-line front and rear production lines 95f and 95r. The printing unit 1 is disposed at the upstream end (left end) of the production lines 95f and 95r.

The printing unit 1 includes a board supply device 2 and a screen printing machine 3. The board supply device 2 includes a front lane 950f and a rear lane 950r. The screen printing machine 3 includes a front lane 951f and a rear lane 951r. The front lane 951f and the rear lane 951r are included in the lane of the present invention. The electronic component mounting machine 94 is disposed on the downstream side (right side) of the printing unit 1. The electronic component mounting machine 94 includes a front lane 952f and a rear lane 952r. The front lanes 950f, 951f, and 952f are arranged in the left-right direction to enable transfer of a circuit board 90f. The rear lanes 950r, 951r, and 952r are arranged in the left-right direction to enable transfer of a circuit board 90r.

<Configuration of Printing Unit>

Now, the configuration of the printing unit 1 according to the present embodiment is described.

[Configuration of Screen Printing Machine]

Figure 2:
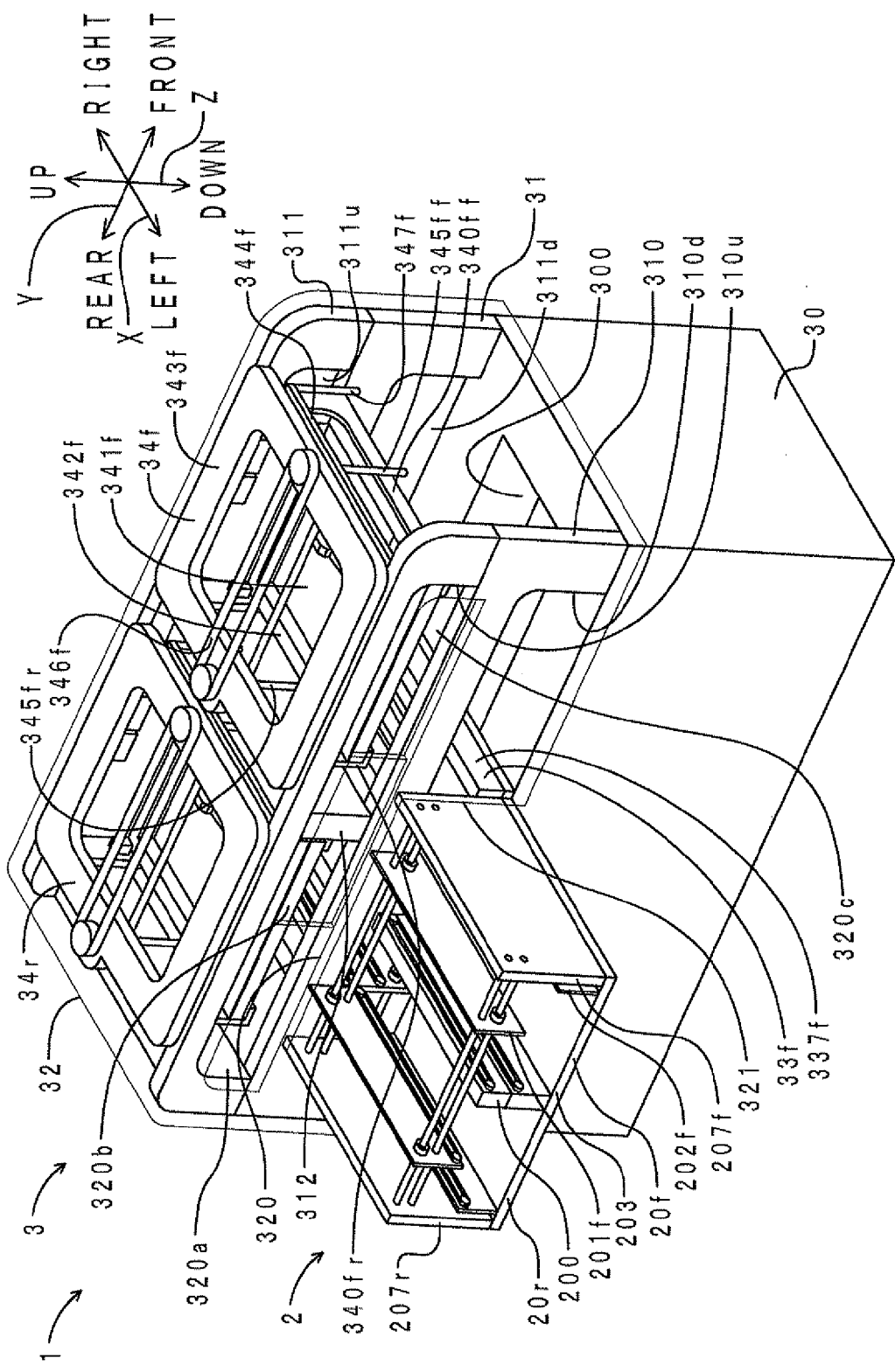
FIG. 2 is a perspective view of the printing unit.
Figure 3:
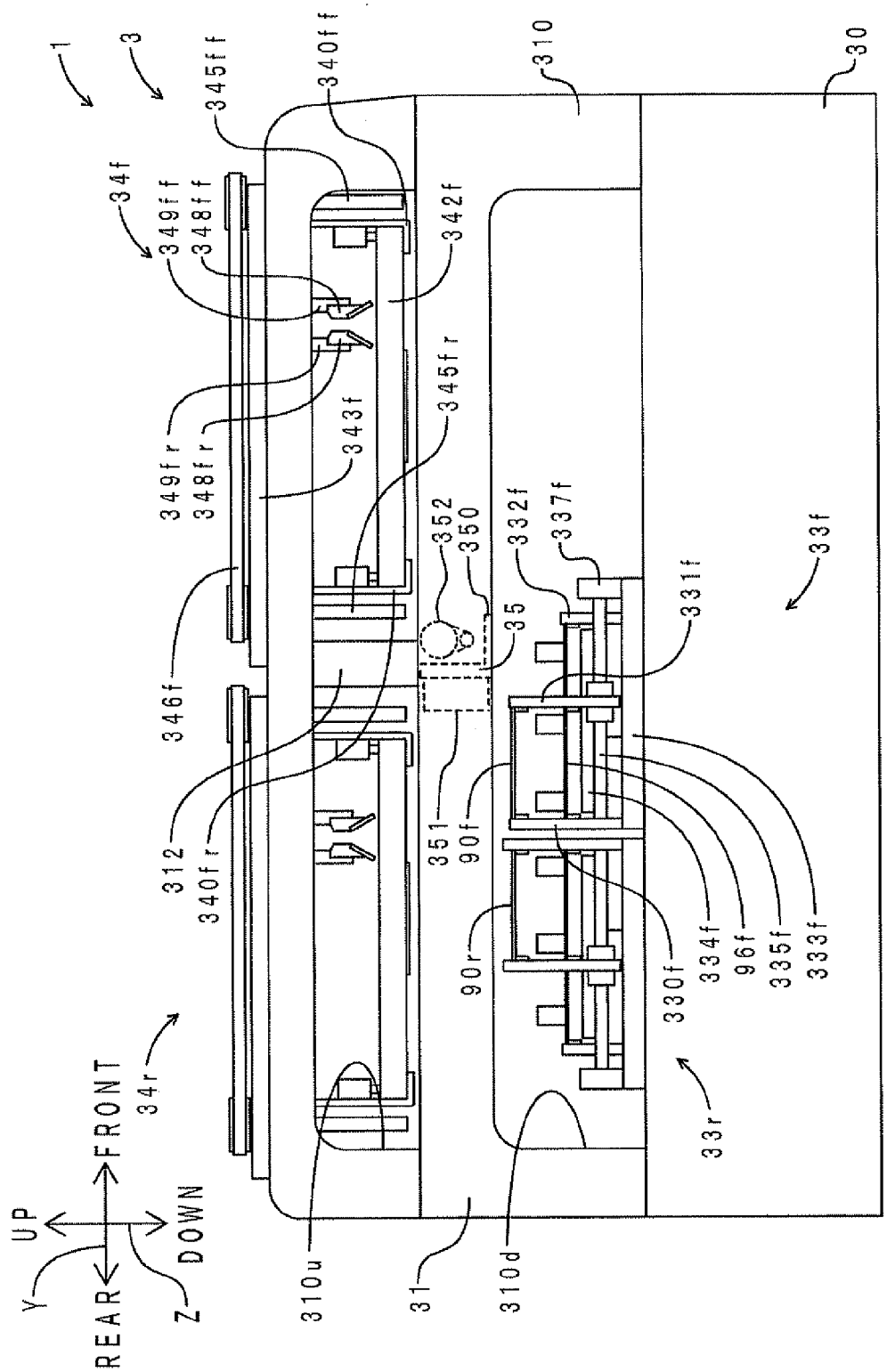
FIG. 3 is a left side view of a screen printing machine of the printing unit.

First, the configuration of the screen printing machine 3 is described. FIG. 2 is a perspective view of the printing unit according to the present embodiment. For convenience of description, a housing (indicated by thin lines) is shown as transparent. FIG. 3 is a left side view of the screen printing machine of the printing unit. For convenience of description, a housing is not shown.

As shown in FIGS. 2 and 3, the screen printing machine 3 includes a base portion 30, a frame portion 31, a housing 32, transfer modules 33f and 33r, two printing portions 34f and 34r, and a camera unit 35.

(Base Portion)

The base portion 30 assumes the shape of a rectangular parallelepiped block. The base portion 30 is placed on a floor of a plant.

(Frame Portion)

The frame portion 31 includes a left frame 310, a right frame 311, and a partition wall 312. The left frame 310 is disposed along the left edge of the upper surface of the base portion 30. The left frame 310 is formed by two frame bodies, each of which assumes the shape of a letter C that opens downward and which are stacked in tiers in the up-down direction. That is, the left frame 310 includes a lower opening 310d and an upper opening 310u. The right frame 311 is disposed along the right edge of the upper surface of the base portion 30. The right frame 311 is formed by two frame bodies, each of which assumes the shape of a letter C that opens downward and which are stacked in tiers in the up-down direction. That is, the right frame 311 includes a lower opening 311d and an upper opening 311u. The partition wall 312 assumes the shape of a narrow plate that is long in the left-right direction. The partition wall 312 is provided to extend between a portion of the upper opening 310u of the left frame 310 that is generally in the center in the front-rear direction and a portion of the upper opening 311u of the right frame 311 that is generally in the center in the front-rear direction.

(Housing)

The housing 32 is disposed above the base portion 30. The housing 32 covers the left frame 310 and the right frame 311 from outside. A printing portion replacement access port 320 and a back-up member replacement access port 321 are formed in the left wall of the housing 32. The printing portion replacement access port 320 and the back-up member replacement access port 321 are included in the replacement access port of the present invention. The printing portion replacement access port 320 assumes the shape of a rectangle that is long in the front-rear direction. Three shutters 320a to 320c are disposed in the printing portion replacement access port 320. The three shutters 320a to 320c are configured as sliding doors that can be opened and closed by sliding them with respect to each other in the front-rear direction in an overlapping manner. The back-up member replacement access port 321 is disposed below the printing portion replacement access port 320. The back-up member replacement access port 321 is blocked by the board supply device 2.

(Printing Portion)

The printing portion 34f is disposed between the left frame 310 and the right frame 311. The printing portion 34f is disposed on the right side of the front portion of the printing portion replacement access port 320. The printing portion 34f is disposed on the front side of the partition wall 312. The printing portion 34f includes a pair of front and rear guide portions 340ff and 340fr, a screen mask 341f, a screen frame 342f, an upper frame 343f, a lower frame 344f, a pair of front and rear ball screw portions 345ff and 345fr, a driving belt 346f, a guide rod 347f, a pair of front and rear squeegees 348ff and 348fr, and a pair of front and rear squeegee mounting portions 349ff and 349fr.

The upper frame 343f assumes the shape of a rectangular frame. The upper frame 343f is provided to extend between the upper edge of the left frame 310 and the upper edge of the right frame 311. The lower frame 344f assumes the shape of a rectangular frame. The lower frame 344f is disposed below the upper frame 343f.

The guide portion 340ff assumes the shape of an inverted letter L as viewed from the left side (see FIG. 3). The guide portion 340ff is fixed to the front edge of the lower frame 344f. The guide portion 340ff extends in the left-right direction. The guide portion 340fr assumes the shape of a letter L as viewed from the left side (see FIG. 3). The guide portion 340fr is fixed to the rear edge of the lower frame 344f. The guide portion 340fr extends in the left-right direction.

The screen frame 342f assumes the shape of a rectangular frame. The screen frame 342f is interposed between the pair of front and rear guide portions 340ff and 340fr. The screen frame 342f is slidable with respect to the guide portions 340ff and 340fr in the left-right direction. This enables the screen frame 342f to be carried into and out of the guide portions 340ff and 340fr from the left side via the printing portion replacement access port 320. The screen mask 341f is spread over the screen frame 342f. A large number of screen holes (not shown) are formed in the screen mask 341f to allow transfer of solder onto the circuit board 90f (see FIG. 1).

The lower frame 344f and the upper frame 343f are coupled to each other via the pair of front and rear ball screw portions 345ff and 345fr. A driving force is transmitted from a servomotor (not shown) to the pair of front and rear ball screw portions 345ff and 345fr via a driving belt 346f. The driving force enables the lower frame 344f to move in the up-down direction along the guide rod 347f with respect to the upper frame 343f. That is, the screen mask 341f can be lowered and raised with respect to the upper frame 343f.

The squeegee 348ff is detachably mounted to the squeegee mounting portion 349ff from the left side. Likewise, the squeegee 348fr is detachably mounted to the squeegee mounting portion 349fr from the left side. The squeegee mounting portions 349ff and 349fr are movable in the front-rear direction. The squeegee mounting portions 349ff and 349fr are also movable in the up-down direction.

The printing portion 34r is disposed on the rear side of the printing portion 34f across the partition wall 312. The printing portion 34r is identical in configuration to the printing portion 34f discussed above. Thus, the description of the component is omitted herein.

(Transfer Module)

As shown in FIG. 3, the transfer modules 33f and 33r are disposed on the upper surface of the base portion 30. The transfer modules 33f and 33r are slidable independently of each other in the front-rear direction with respect to a guide groove 300 (see FIG. 2) formed in the upper surface of the base portion 30.

Figure 4:
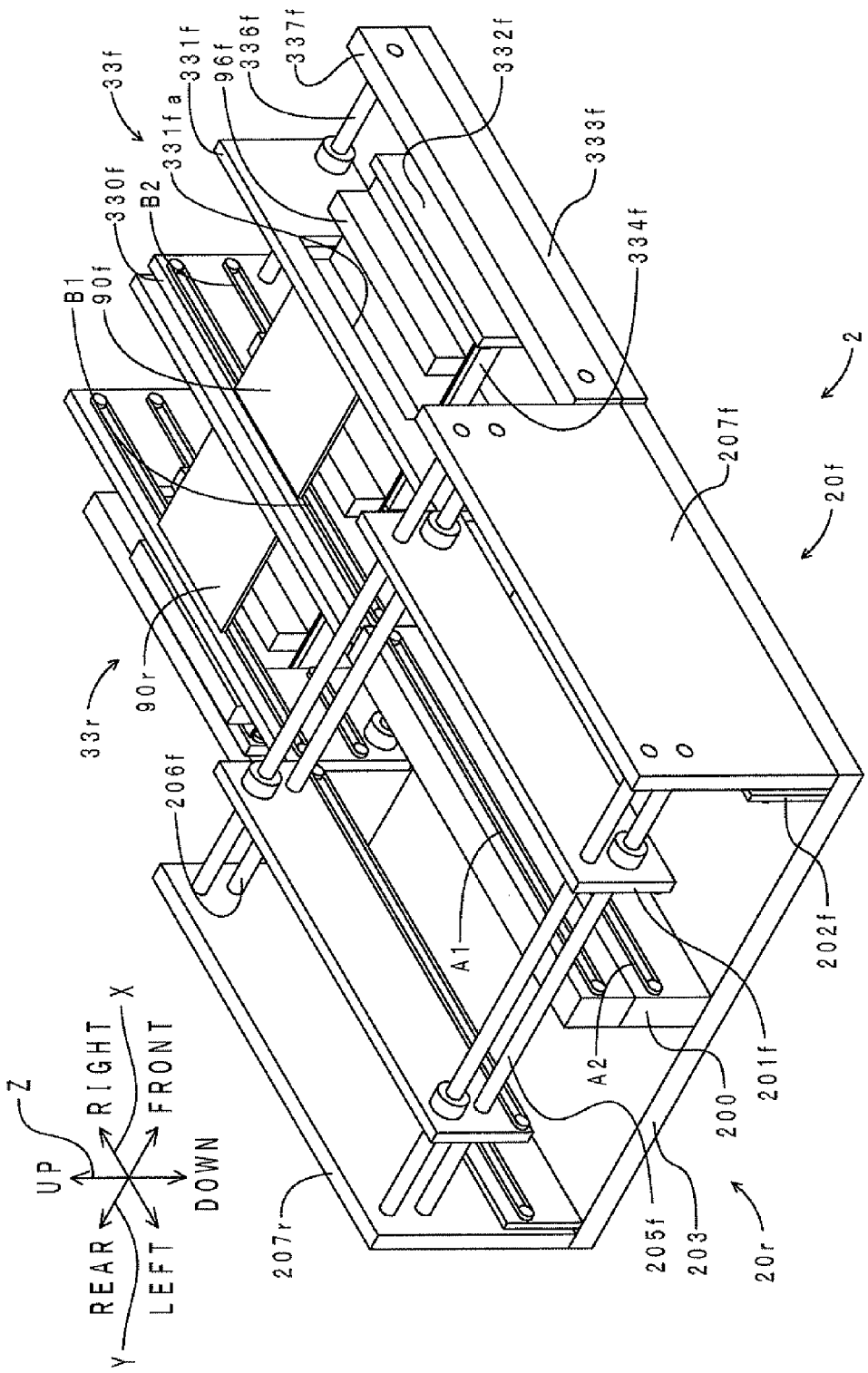
FIG. 4 is a perspective view of a pair of front and rear transfer modules of the screen printing machine and a board supply device of the printing unit.
Figure 5:
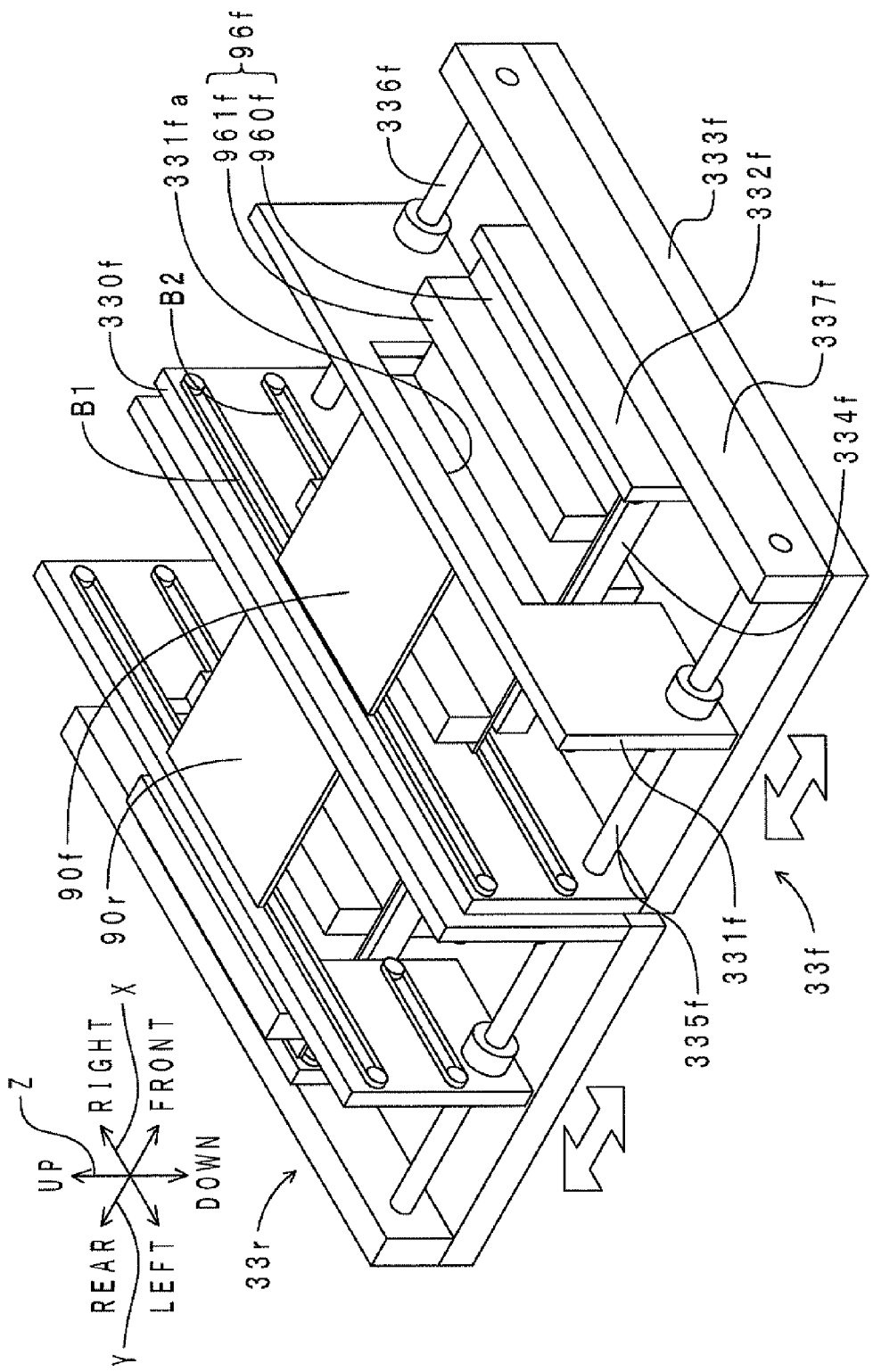
FIG. 5 is a perspective view of the pair of front and rear transfer modules.
Figure 6:
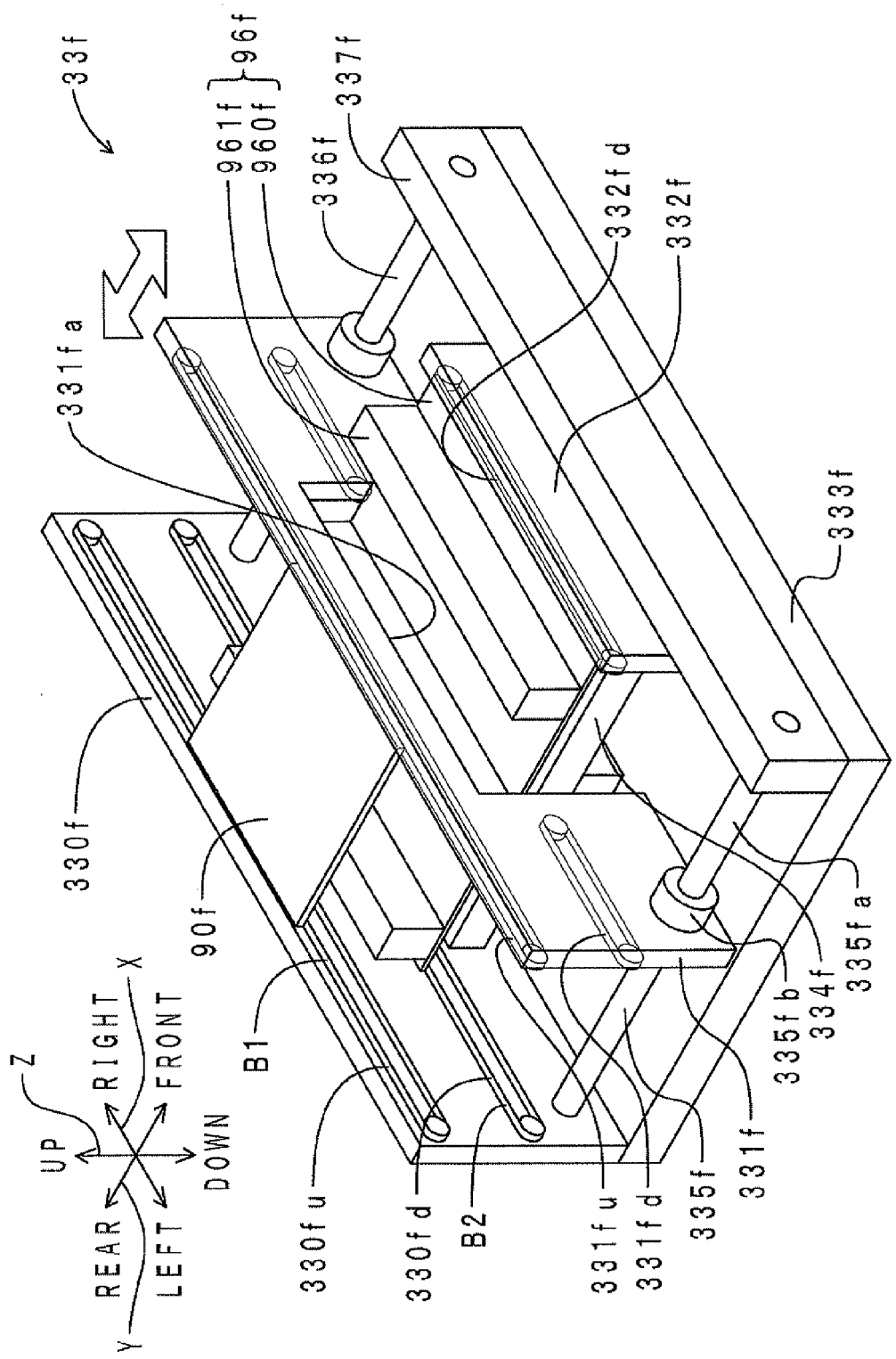
FIG. 6 is a transparent perspective view of the front transfer module.
Figure 7:
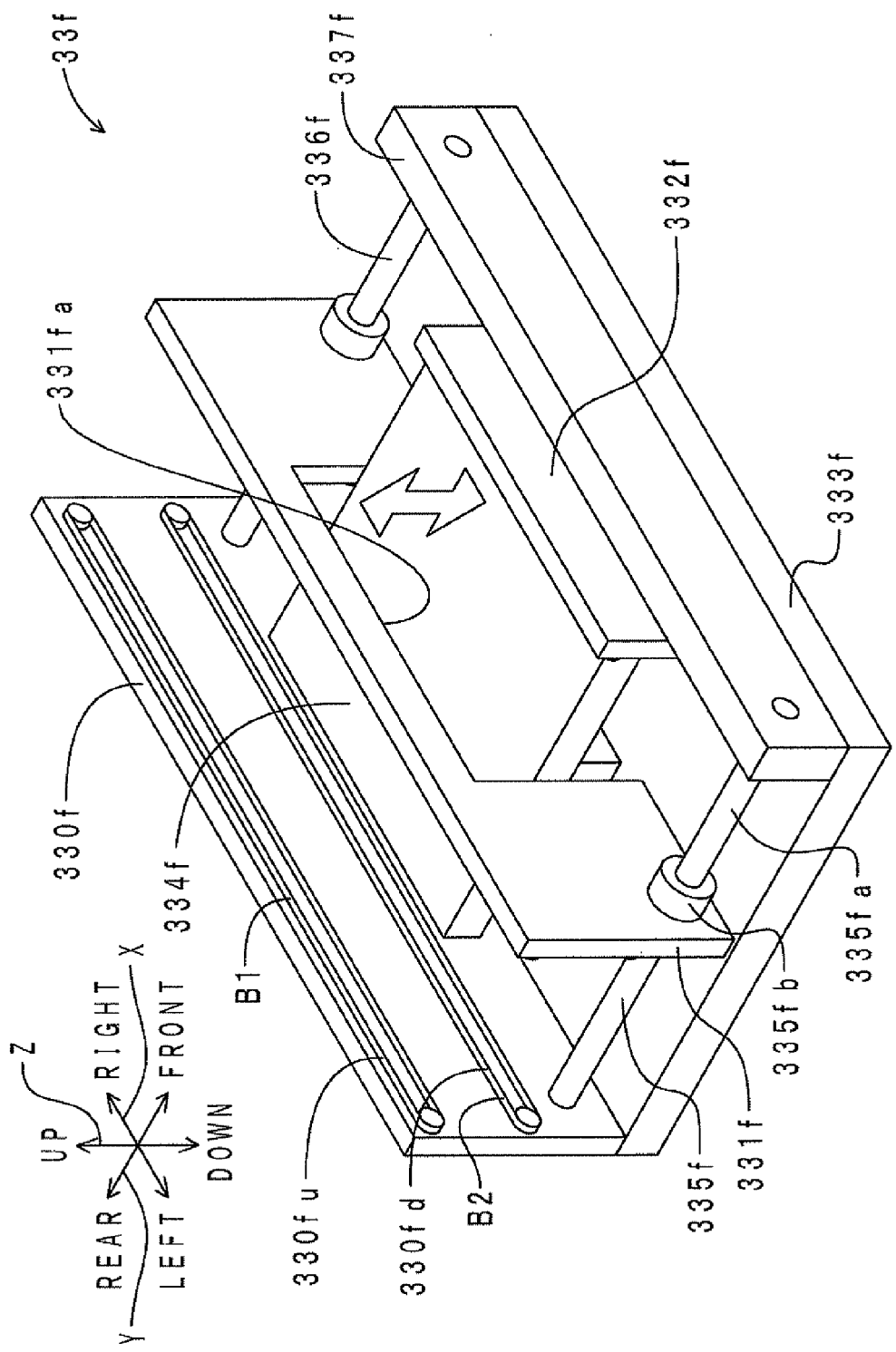
FIG. 7 is a perspective view of the front transfer module with no circuit board or no back-up member disposed.

FIG. 4 is a perspective view of the pair of front and rear transfer modules of the screen printing machine and the board supply device of the printing unit according to the present embodiment. FIG. 5 is a perspective view of the pair of front and rear transfer modules. FIG. 6 is a transparent perspective view of the front transfer module. FIG. 7 is a perspective view of the front transfer module with no circuit board or no back-up member disposed.

As shown in FIGS. 4 to 7, the transfer module 33f includes a transfer first fixed wall portion 330f, a transfer movable wall portion 3311, a transfer second fixed wall portion 332f, a support platform 333f, a lifting table 334f, a pair of left and right ball screw portions 335f and 336f, and an end wall portion 337f. The support platform 333f assumes the shape of a rectangular plate.

The transfer first fixed wall portion 330f assumes the shape of a rectangular plate that is long in the left-right direction. The transfer first fixed wall portion 330f is provided to extend upward from the rear edge of the support platform 333f. A board transfer fixed conveyer 330fu and a back-up member transfer first fixed conveyer 330fd are disposed on the front surface of the transfer first fixed wall portion 330f. The board transfer fixed conveyer 330fu is disposed in the vicinity of the upper edge of the front surface of the transfer first fixed wall portion 330f. The board transfer fixed conveyer 330fu extends in the left-right direction. The back-up member transfer first fixed conveyer 330fd is disposed below the board transfer fixed conveyer 330fu. The back-up member transfer first fixed conveyer 330fd extends in the left-right direction.

The end wall portion 337f assumes the shape of a narrow plate that is long in the left-right direction. The end wall portion 337f is provided to extend upward from the front edge of the support platform 333f. The end wall portion 337f faces the transfer first fixed wall portion 330f in the front-rear direction across the transfer movable wall portion 331f and the transfer second fixed wall portion 332f to be discussed later.

The transfer second fixed wall portion 332f assumes the shape of a small rectangular plate. The transfer second fixed wall portion 332f is disposed on the rear side of and adjacent to the end wall portion 337f. The transfer second fixed wall portion 332f faces the transfer first fixed wall portion 330f in the front-rear direction. A back-up member transfer second fixed conveyer 332fd is disposed on the rear surface of the transfer second fixed wall portion 337f. The back-up member transfer second fixed conveyer 332fd extends in the left-right direction. The back-up member transfer second fixed conveyer 332fd faces the back-up member transfer first fixed conveyer 330fd in the front-rear direction. A back-up member 96f includes a back-up plate 960f and three support members 961f. The back-up plate 960f assumes the shape of a flat plate. The back-up plate 960f is provided to extend between the back-up member transfer first fixed conveyer 330fd and the back-up member transfer second fixed conveyer 332fd. The back-up member transfer first fixed conveyer 330fd, the back-up member transfer second fixed conveyer 332fd, and a pair of left and right back-up member transfer movable conveyers 331fd to be discussed later form a back-up member transfer section 132. Each of the three support members 961f assumes the shape of a rectangular column that is long in the left-right direction. The three support members 961f are disposed at predetermined positions on the upper surface of the back-up plate 960f.

The lifting table 334f assumes the shape of a letter T as viewed from the left side. The lifting table 334f is disposed between the transfer first fixed wall portion 330f and the transfer second fixed wall portion 332f. The lifting table 334f is disposed below the back-up plate 960f. The lifting table 334f can be raised and lowered.

The transfer movable wall portion 331f assumes the shape of a rectangular plate that is long in the left-right direction. The transfer movable wall portion 331f is disposed between the transfer first fixed wall portion 330f and the transfer second fixed wall portion 332f. A recess 331fa that opens downward is formed at the lower edge of the transfer movable wall portion 331f. The lifting table 334f and the back-up member 961 are disposed in the recess 331fa. That is, the transfer movable wall portion 331f is disposed across the lifting table 334f and the back-up member 96f. A board transfer movable conveyer 331fu and a pair of left and right back-up member transfer movable conveyers 331fd are disposed on the rear surface of the transfer movable wall portion 331f. The board transfer movable conveyer 331fu is disposed in the vicinity of the upper edge of the rear surface of the transfer movable wall portion 331f. The board transfer movable conveyer 331fu extends in the left-right direction. The board transfer movable conveyer 331fu faces the board transfer fixed conveyer 330fu in the front-rear direction. The circuit board 90f is provided to extend between the board transfer fixed conveyer 330fu and the board transfer movable conveyer 331fu. The board transfer fixed conveyer 330fu and the board transfer movable conveyer 331fu form a board transfer section B1. The pair of left and right back-up member transfer movable conveyers 331fd are disposed below the board transfer movable conveyer 331fu. Each of the pair of left and right back-up member transfer movable conveyers 331fd extends in the left-right direction. The pair of left and right back-up member transfer movable conveyers 331fd are disposed on both the left and right sides of the recess 331fa.

Of the pair of left and right ball screw portions 335f and 336f, the left ball screw portion 335f is disposed in the vicinity of the left edge of the support platform 333f. The ball screw portion 335f includes a rod portion 335fa and a nut portion 335fb. The rod portion 335fa is supported by the transfer first fixed wall portion 330f and the end wall portion 337f so as to be freely rotatable. The nut portion 335fb is screwed to the rod portion 335fa via a plurality of balls (not shown). The nut portion 335fb is disposed at the lower left corner of the transfer movable wall portion 331f. A driving force is transmitted from a servomotor (not shown) to the rod portion 335fa. The driving force causes the rod portion 335fa to rotate about its axis. The rotation of the rod portion 335fa moves the nut portion 335fb in the front-rear direction. The right ball screw portion 336f is driven in the same way as the left ball screw portion 335f. The transfer movable wall portion 331f can be moved in the front-rear direction by driving both the left and right ball screw portions 335f and 336f. That is, the distance between the board transfer fixed conveyer 330fu and the board transfer movable conveyer 331fu in the front-rear direction is variable. In addition, the distance between the back-up member transfer first fixed conveyer 330fd and the back-up member transfer movable conveyers 331fd in the front-rear direction is variable.

The transfer module 33r is disposed on the rear side of the transfer module 33f so as to be symmetrical in the left-right direction (back to back). The transfer module 33r is identical in configuration to the transfer module 33f. Thus, the description of the component is omitted herein.

(Camera Unit)

As shown in FIG. 3, the camera unit 35 includes a bracket 350, a camera 351, and a cleaner 352. The camera unit 35 is disposed above the transfer modules 33f and 33r and below the printing portions 34f and 34r. The camera unit 35 is common to the front lane 951f and the rear lane 951r. The camera 351 and the cleaner 352 are disposed on the bracket 350. The cleaner 352 is movable in the front-rear direction. The cleaner 352 is used to clean the screen mask 341f.

For example, in the case of cleaning the front screen mask 341f, the cleaner 352 is first moved to the front side. Then, the screen mask 341f is lowered to be pressed against the cleaner 352. In this state, the cleaner 352 is moved in the front-rear direction to wipe solder off the screen mask 341f.

[Configuration of Board Supply Device]

Figure 8:
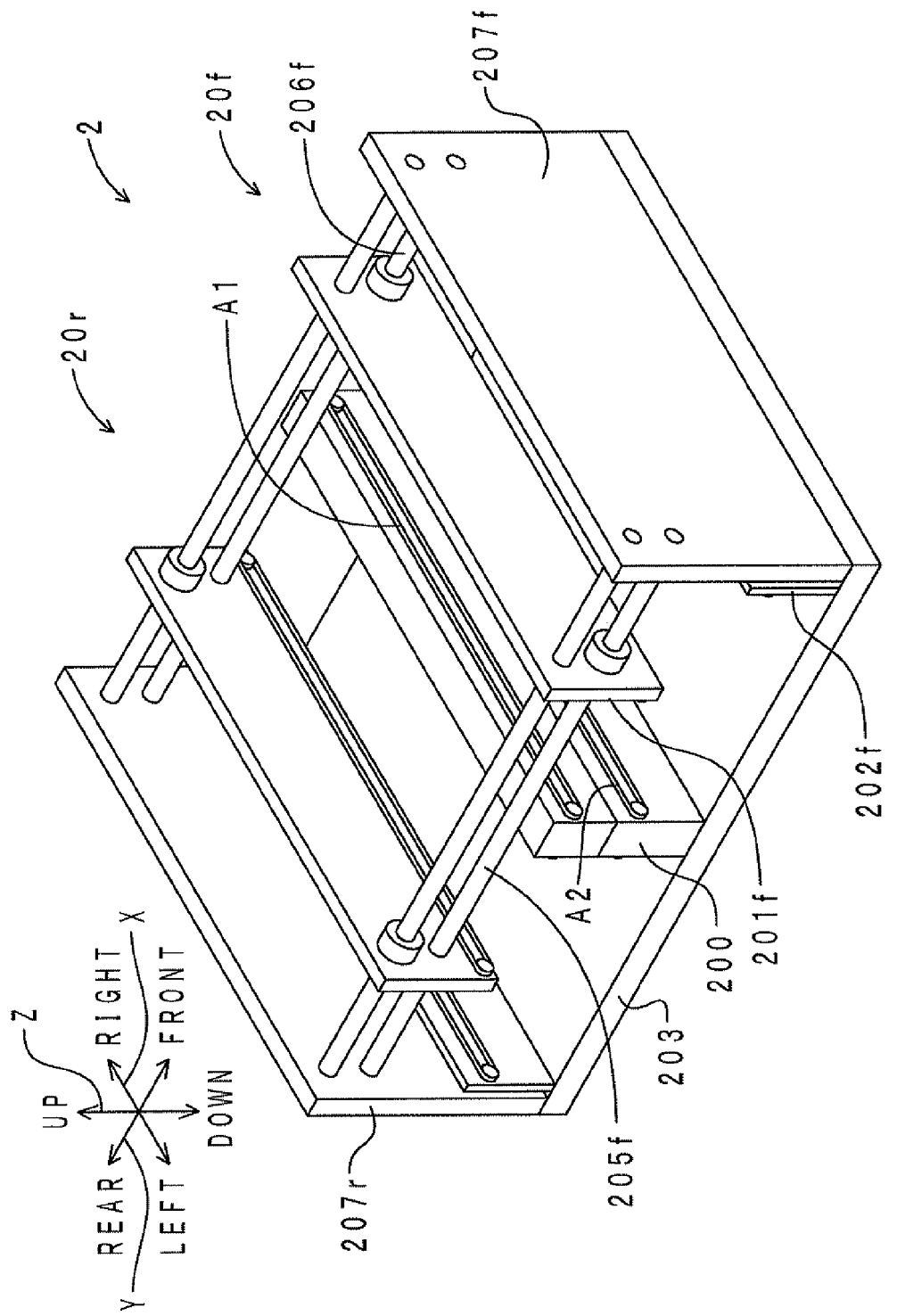
FIG. 8 is a perspective view of the board supply device of the printing unit.
Figure 9:
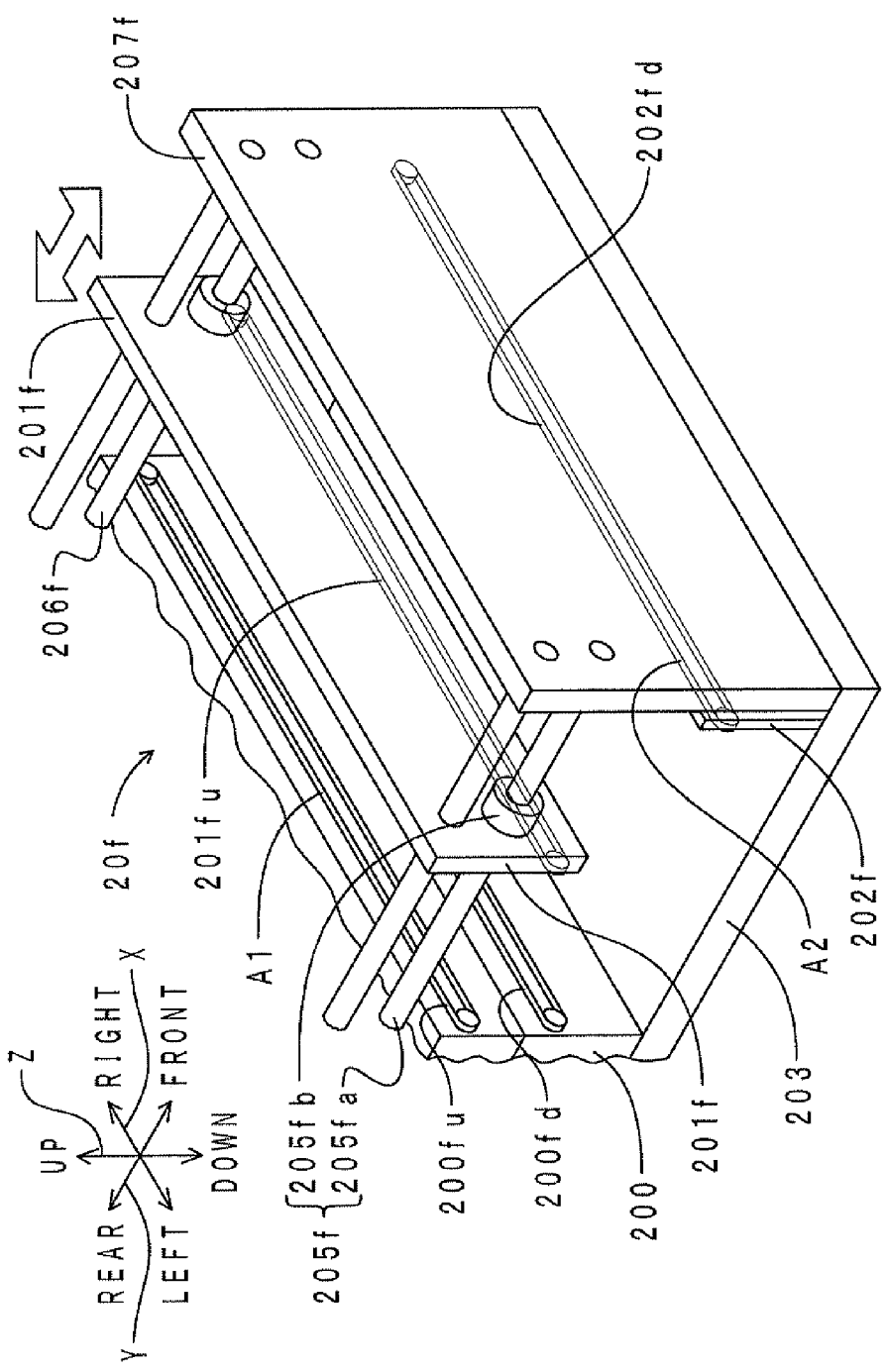
FIG. 9 is a transparent perspective view of a front supply module of the board supply device.

Now, the configuration of the board supply device 2 according to the present embodiment is described. The board supply device 2 is attached to the rear side of the left surface of the base portion 30 of the screen printing machine 3. As shown in FIG. 4, the board supply device 2 can be coupled to the left side of the transfer modules 33f and 33r. FIG. 8 is a perspective view of the board supply device of the printing unit according to the present embodiment. FIG. 9 is a transparent perspective view of a front supply module of the board supply device.

As shown in FIGS. 8 and 9, a supply module 20f includes a supply first fixed wall portion 200, a supply movable wall portion 201f, a supply second fixed wall portion 202f, a support platform 203, a pair of left and right ball screw portions 205f and 206f, and an end wall portion 207f. The supply first fixed wall portion 200 and the support platform 203 are commonly used by the supply module 20f and a supply module 20r. The support platform 203 assumes the shape of a rectangular plate.

The supply first fixed wall portion 200 assumes the shape of a rectangular plate that is long in the left-right direction. The supply first fixed wall portion 200 is provided to extend upward generally from the center of the support platform 203 in the front-rear direction. A board supply fixed conveyer 200fu and a back-up member supply first fixed conveyer 200fd are disposed on the front surface of the supply first fixed wall portion 200. The board supply fixed conveyer 200fu is disposed in the vicinity of the upper edge of the front surface of the supply first fixed wall portion 200. The board supply fixed conveyer 200fu extends in the left-right direction. The board supply fixed conveyer 200fu is arranged on the left side of the board transfer fixed conveyer 330fu (see FIG. 6). The back-up member supply first fixed conveyer 200fd is disposed below the board supply fixed conveyer 200fu. The back-up member supply first fixed conveyer 200fd extends in the left-right direction. The back-up member supply first fixed conveyer 200fd is arranged on the left side of the back-up member transfer first fixed conveyer 330fd (see FIG. 6).

The end wall portion 207 assumes the shape of a rectangular plate that is long in the left-right direction. The end wall portion 207f is provided to extend upward from the front edge of the support platform 203. The end wall portion 207f faces the supply first fixed wall portion 200 in the front-rear direction across the supply movable wall portion 201f and the supply second fixed wall portion 202f to be discussed later.

The supply second fixed wall portion 202f assumes the shape of a narrow plate that is long in the left-right direction. The supply second fixed wall portion 202f is disposed on the rear side of and adjacent to the end wall portion 207f. The supply second fixed wall portion 202f faces the supply first fixed wall portion 200 in the front-rear direction. A back-up member supply second fixed conveyer 202fd is disposed on the rear surface of the supply second fixed wall portion 202f. The back-up member supply second fixed conveyer 202fd extends in the left-right direction. The back-up member supply second fixed conveyer 202fd faces the back-up member supply first fixed conveyer 200fd in the front-rear direction. The back-up member supply first fixed conveyer 200fd and the back-up member supply second fixed conveyer 202fd form a back-up member supply section A2. The back-up member supply second fixed conveyer 202fd is disposed on the left side of the back-up member transfer second fixed conveyer 332fd (see FIG. 6). Forward movement of the transfer movable wall portion 331f allows the back-up member supply second fixed conveyer 202fd and the back-up member transfer movable conveyers 331fd to be arranged in a row in the left-right direction.

The supply movable wall portion 201f assumes the shape of a rectangular plate that is long in the left-right direction. The supply movable wall portion 201f is disposed between the supply first fixed wall portion 200 and the supply second fixed wall portion 202f. A board supply movable conveyer 201fu is disposed on the rear surface of the supply movable wall portion 201f. The board supply movable conveyer 201fu is disposed in the vicinity of the lower edge of the rear surface of the supply movable wall portion 201f. The board supply movable conveyer 201fu extends in the left-right direction. The board supply movable conveyer 201fu faces the board supply fixed conveyer 200fu in the front-rear direction. The board supply fixed conveyer 200fu and the board supply movable conveyer 201fu form a board supply section A1.

Of the pair of left and right ball screw portions 205f and 206f, the left ball screw portion 205f is disposed in the vicinity of the left edge of the support platform 203. The ball screw portion 205f includes a rod portion 205fa and a nut portion 205fb. The rod portion 205fa is supported by the end wall portion 207f and an end wall portion 207r (see FIG. 8) of the rear supply module 20r so as to be freely rotatable. The nut portion 205fb is screwed to the rod portion 205fa via a plurality of balls (not shown). The nut portion 205fb is disposed at the lower left corner of the supply movable wall portion 201f. A driving force is transmitted from a servomotor (not shown) to the rod portion 205fa. The driving force causes the rod portion 205fa to rotate about its axis. The rotation of the rod portion 205fa moves the nut portion 205fb in the front-rear direction. The right ball screw portion 206f is driven in the same way as the left ball screw portion 205f. The supply movable wall portion 201f can be moved in the front-rear direction by driving both the left and right ball screw portions 205f and 206f. That is, the distance between the board supply fixed conveyer 200fu and the board supply movable conveyer 201fu in the front-rear direction is variable.

The supply module 20r is disposed on the rear side of the supply module 20f so as to be symmetrical in the left-right direction (back to back). The supply module 20r is identical in configuration to the supply module 20f. Thus, the description of the component is omitted herein.

<Motion During Production of Circuit Board>

Now, the motion of the printing unit 1 according to the present embodiment during production of the circuit boards 90f and 90r is described. The motion of the printing unit 1 during production is the same for both the circuit boards 90f and 90r. That is, the motion of the printing unit 1 during production is the same for both the production lines 95f and 95r shown in FIG. 1. Thus, only the front production line 95f is described herein, and the same description is also applied to the rear production line 95r.

During production, first, the circuit board 90f is transferred from the board supply device 2 to the screen printing machine 3. Specifically, the circuit board 90f is delivered from the board supply section A1 to the board transfer section B1 by driving the board supply fixed conveyer 200fu and the board supply movable conveyer 201fu (see FIG. 9) and the board transfer fixed conveyer 330fu and the board transfer movable conveyer 331fu (see FIG. 6).

Next, the transfer module 33f is moved to the front side along the guide groove 300 until the transfer module 33f comes directly below the printing portion 34f (see FIG. 2).

Subsequently, the circuit board 90f is raised by a predetermined amount by the back-up member 96f (see FIG. 6). That is, the circuit board 90f is first raised by raising the lifting table 334f to push up the back-up member 96f. Next, the transfer movable wall portion 331f is moved to hold the circuit board 90f between the transfer movable wall portion 331f and the transfer first fixed wall portion 330f. After that, the support platform 333f is raised. The position after the rise is equivalent to the printing position at which solder is printed on the circuit board 90f.

After that, the lower frame 344f of the printing portion 34f, that is, the screen mask 341f, is lowered with respect to the upper frame 343f along the guide rod 347f (see FIG. 2).

Thereafter, solder is printed on the circuit board 90f at the printing position by the pair of front and rear squeegees 348ff and 348fr via the screen holes (see FIG. 3). After that, the support platform 333f is lowered to pull the circuit board 90f away from the screen mask 341f. That is, the circuit board 90f is snapped off.

Subsequently, the lifting table 334f is lowered to lower the circuit board 90f on which printing has been performed from the printing position and mount the circuit board 90f between the board transfer fixed conveyer 330fu and the board transfer movable conveyer 331fu (see FIG. 6).

After that, the board transfer fixed conveyer 330fu and the board transfer movable conveyer 331fu are driven to deliver the circuit board 90f to the front lane 952f of the electronic component mounting machine 94. In the electronic component mounting machine 94, electronic components are mounted at predetermined positions on the circuit board 90f.

In this way, the circuit board 90f is produced in the production line 95f. In the rear production line 95r, the circuit board 90r is produced in parallel without being affected by the front production line 95f.

<Motion During Tooling Change>

Figure 10:
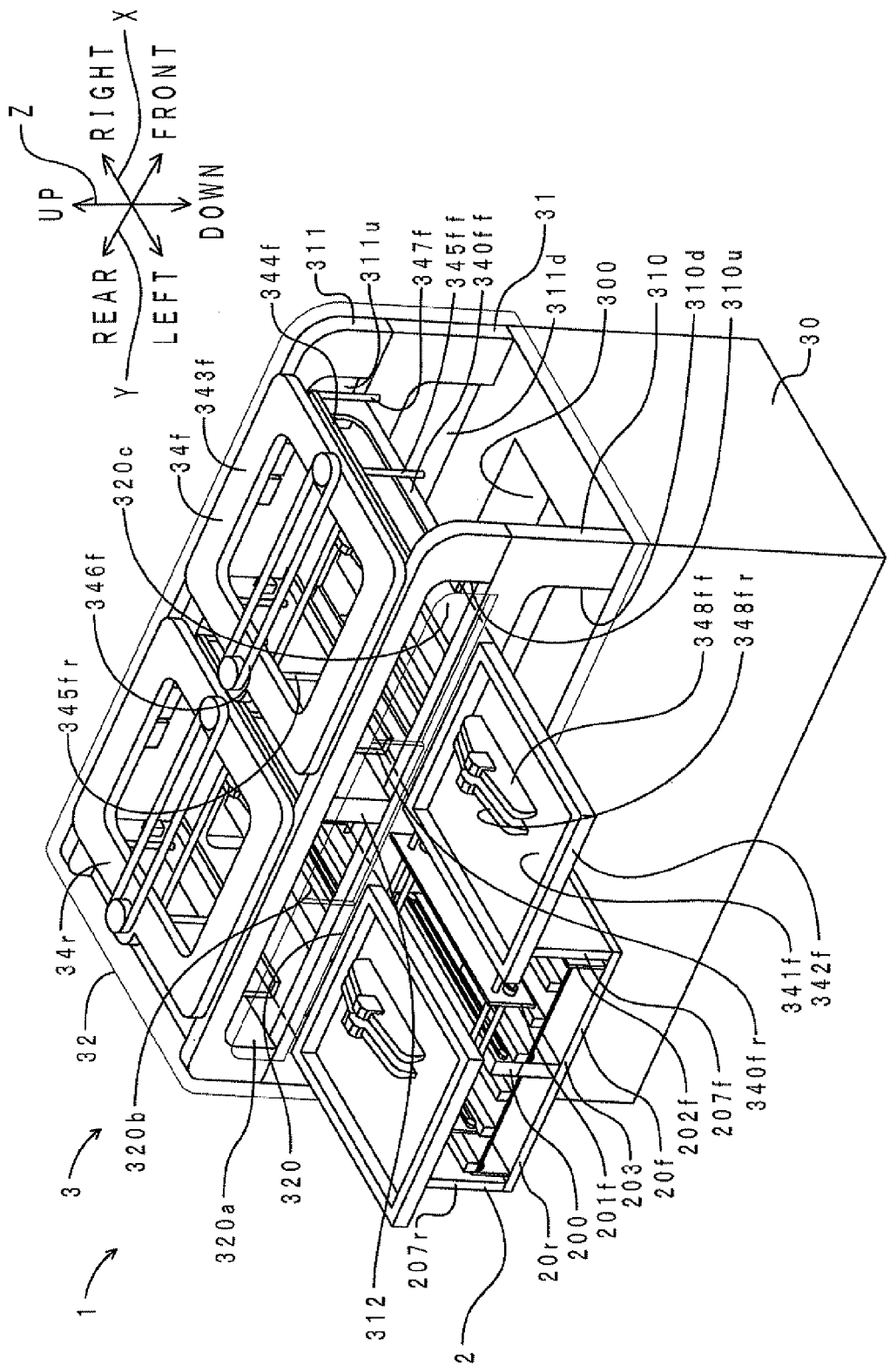
FIG. 10 is a perspective view of the printing unit during a tooling change.
Figure 11:
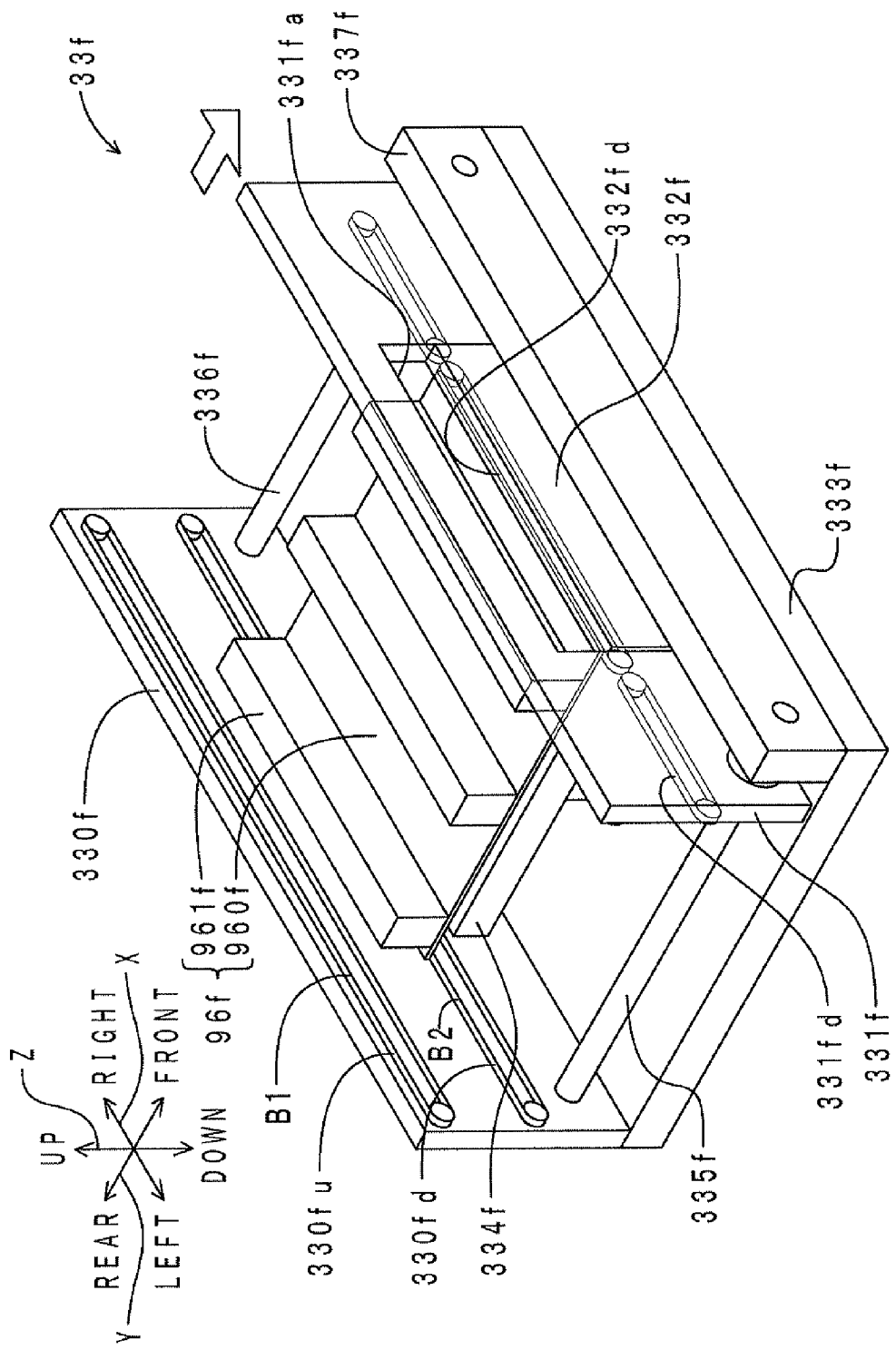
FIG. 11 is a transparent perspective view of the front transfer module of the screen printing machine of the printing unit.

Now, the motion of the printing unit 1 according to the present embodiment during a tooling change is described. FIG. 10 is a perspective view of the printing unit according to the present embodiment during a tooling change. FIG. 11 is a transparent perspective view of the front transfer module of the screen printing machine of the printing unit. FIG. 11 corresponds to FIG. 6.

The motion of the printing unit 1 during a tooling change is the same for both the circuit boards 90f and 90r. That is, the motion of the printing unit 1 during a tooling change is the same for both the production lines 95f and 95r shown in FIG. 1. Thus, only the front production line 95f is described herein, and the same description is also applied to the rear production line 95r.

[Motion During Replacement of Back-Up Member]

During a tooling change, first, the back-up member 96f is transferred from the screen printing machine 3 to the board supply device 2. Specifically, first, the transfer movable wall portion 331f is moved to the front side (see FIG. 6). Then, as shown in FIG. 11, the pair of left and right back-up member transfer movable conveyers 331fd and the back-up member transfer second fixed conveyer 332fd of the transfer second fixed wall portion 332f are arranged in line in the left-right direction. Next, the back-up member transfer first fixed conveyer 330fd, the back-up member transfer second fixed conveyer 332fd, and the left back-up member transfer movable conveyer 331fd are driven. Then, the back-up member 96f is delivered from the back-up member transfer section B2 to the back-up member supply section A2 (see FIG. 9).

Subsequently, in the back-up member supply section A2, the three support members 961f of the back-up member 96f are removed from the back-up plate 960f. After that, support members are disposed again on the back-up plate 960f so as to correspond to new circuit boards after the tooling change. That is, the back-up member 96f is assembled. The assembly work is performed by an operator 93f from an operation space 92f shown in FIG. 1.

Thereafter, the back-up member 96f which has been assembled is delivered from the back-up member supply section A2 (see FIG. 9) to the back-up member transfer section B2 (see FIG. 11). Finally, the transfer movable wall portion 331f is moved to the rear side so as to correspond to the dimension of new circuit boards in the front-rear direction (in the case where the dimension of new circuit boards in the front-rear direction is large, the transfer movable wall portion 331f may not necessarily be moved).

[Motion During Replacement of Replacement Part for Printing]

During a tooling change, replacement work for the screen mask 341f, the pair of front and rear squeegees 348ff and 348fr, and the cleaner 352 (see FIG. 3) is performed as shown in FIG. 10 before or after the replacement work for the back-up member 96f described above.

Specifically, the screen frame 342f with the screen mask 341f is pulled out to the left side from the pair of front and rear guide portions 340ff and 340fr. In addition, the pair of squeegees 348ff and 348fr are pulled out to the left side from the squeegee mounting portions 349ff and 349fr (see FIG. 3). Moreover, the cleaner 352 is pulled out to the left side from the camera unit 35.

After that, a screen frame 342f over which a new screen mask 341f corresponding to new circuit boards has been spread is mounted to the pair of front and rear guide portions 340ff and 340fr. In addition, new squeegees 348ff and 348fr are mounted to the squeegee mounting portions 349ff and 349fr. Moreover, a new cleaner 352 is mounted to the camera unit 35.

The replacement work is performed by the operator 93f from the operation space 92f shown in FIG. 1. In opening a portion of the printing portion replacement access port 320 that is on the front side with respect to the partition wall 312, the shutters 320a to 320c of the housing 32 are accommodated in an overlapping manner in a portion of the printing portion replacement access port 320 that is on the rear side with respect to the partition wall 312. Therefore, the replacement work for the printing portion 34f and the replacement work for the printing portion 34r cannot be performed at the same time.

In this way, a tooling change is performed in the front production line 95f. In the rear production line 95r, the circuit board 90r is produced continuously without being affected by the front production line 95f.

<Function and Effect>

Now, the function and effect of the printing unit 1 and the screen printing machine 3 according to the present embodiment are described. The screen printing machine 3 according to the present embodiment includes a front lane 951f and a rear lane 951r. Also, the screen printing machine 3 according to the present embodiment has two printing positions. Therefore, the screen printing machine 3 can be used for dual-lane production lines 95*f* and 95*r*. Also, solder can be printed on the two circuit boards 90*f* and 90*r* in parallel. Thus, it is possible to suppress an increase in total length of the screen printing machine 3 in the X direction (total length of the screen printing machine 3 in the transfer direction for the circuit boards 90*f* and 90*r*), and hence in total length of the production lines 95*f* and 95*r* in the X direction. This allows the screen printing machine 3 according to the present embodiment to achieve a high space efficiency.

According to the screen printing machine 3 of the present embodiment, during a tooling change, a replacement part for printing (the screen mask 341*f*, the pair of front and rear squeegees 348*ff* and 348*fr*, and the cleaner 352) can be replaced via the printing portion replacement access port 320 which opens toward the upstream side in the X direction. Also, the back-up member 96*f* can be replaced via the back-up member replacement access port 321 which opens toward the upstream side in the X direction. This allows the operator 93*f* to perform replacement work for a replacement part from the front side of the screen printing machine 3 in the Y direction. Thus, it is necessary to provide the operation space 92*f* only on one side, rather than on both sides, of the screen printing machine 3 in the Y direction. This also allows the screen printing machine 3 according to the present embodiment to achieve a high space efficiency.

According to the screen printing machine 3 of the present embodiment, a replacement part can be replaced from the upstream side of the screen printing machine 3 in the X direction. Therefore, during a tooling change, it is not necessary to stop the front lane 951*f* when the operator 93*f* replaces a replacement part in the rear lane 951*r*. This allows the screen printing machine 3 according to the present embodiment to produce the circuit boards 90*f* and 90*r* with a high production efficiency.

According to the printing unit 1 and the screen printing machine 3 of the present embodiment, only the board supply device 2 is disposed on the upstream side of the screen printing machine 3 in the X direction. Meanwhile, a plurality of electronic component mounting machines 94 may be arranged on the downstream side of the screen printing machine 3 in the X direction. With this in view, the printing portion replacement access port 320 and the back-up member replacement access port 321 are formed on the upstream side of the screen printing machine 3 in the X direction. As described above, according to the printing unit 1 and the screen printing machine 3 of the present embodiment, replacement access ports which open toward the upstream side are disposed in the vicinity of the upstream end of the production lines 95*f* and 95*r*. This facilitates replacement of a replacement part.

According to the screen printing machine 3 of the present embodiment, the screen mask 341*f* and the screen frame 342*f* can be replaced by sliding the screen mask 341*f* and the screen frame 342*f* with respect to the pair of front and rear guide portions 340*ff* and 340*fr*. That is, the screen mask 341*f* and the screen frame 342*f* which are relatively heavy can be replaced easily. This alleviates the work load of the replacement work.

According to the printing unit 1 and the screen printing machine 3 of the present embodiment, carry-out work for the used back-up member 96*f* can be performed by the back-up member transfer section B2 and the back-up member supply section A2. That is, the back-up member 96*f* can be transferred in the X direction to the outside of the screen printing machine 3. This prevents interference between the back-up member 96*f* and the board transfer section B1.

Likewise, according to the printing unit 1 and the screen printing machine 3 of the present embodiment, carry-in work for a new back-up member 96*f* can be performed by the back-up member supply section A2 and the back-up member transfer section B2. That is, the back-up member 96*f* can be transferred in the X direction to the inside of the screen printing machine 3. This prevents interference between the back-up member 96*f* and the board transfer section B1.

According to the printing unit 1 and the screen printing machine 3 of the present embodiment, assembly work for the back-up member 96*f* can be performed outside the screen printing machine 3. That is, the support members 961*f* can be mounted to the back-up plate 960*f* outside the screen printing machine 3 to complete the back-up member 96*f*, and then the completed back-up member 96*f* can be transferred to the inside of the screen printing machine 3 through the carry-in work described above. This prevents interference between the back-up member 96*f* and the board transfer section B1.

According to the screen printing machine 3 of the present embodiment, the dimension of the back-up plate 960*f* in the Y direction is set in accordance with the circuit board (90*f*, 90*r*) having the largest dimension in the Y direction. This allows the back-up plate 960*f* to be commonly used for a plurality of types of circuit boards 90*f* and 90*r*.

The distance between the back-up member transfer first fixed conveyer 330*fd* and the back-up member transfer second fixed conveyer 332*fd* in the Y direction corresponds to the dimension, in the Y direction, of the back-up plate 960*f* that can support the circuit board (90*f*, 90*r*) having the largest dimension in the Y direction. This ensures transfer of the back-up plate 960*f* with a large dimension in the Y direction.

The distance between the board transfer fixed conveyer 330*fu* and the board transfer movable conveyer 331*fu* in the Y direction is variable. This allows transfer of a plurality of types of circuit boards 90*f* and 90*r* with different dimensions in the Y direction.

According to the screen printing machine 3 of the present embodiment, the transfer movable wall portion 331*f* is movable in the Y direction. Also, the board transfer movable conveyer 331*fu* and the pair of left and right back-up member transfer movable conveyers 331*fd* are disposed on the transfer movable wall portion 331*f*. During transfer of the circuit boards 90*f* and 90*r*, the transfer movable wall portion 331*f* is moved in the Y direction in accordance with the dimension of the circuit boards 90*f* and 90*r* in the Y direction. Meanwhile, during transfer of the back-up member 96*f*, the transfer movable wall portion 331*f* is moved in the Y direction to a position at which the transfer movable wall portion 331*f* is arranged in line with the transfer second fixed wall portion 332*f* in the X direction. As described above, both the transfer of the circuit boards 90*f* and 90*r* and the transfer of the back-up member 96*f* can be handled by appropriately moving the transfer movable wall portion 331*f* in the Y direction.

According to the printing unit 1 of the present embodiment, the back-up member supply section A2 of the board supply device 2 is arranged on a side of the back-up member transfer section B2 of the screen printing machine 3 in the X direction. This facilitates the carry-out work and the carry-in work for the used back-up member 96*f*. Also, assembly work can be performed in the back-up member supply section A2 so as to obtain a back-up member 96*f* corresponding to new circuit boards 90*f* and 90*r* after a tooling change. Alternatively, a back-up member 96*f* which has already been assembled can be mounted to the back-up member supply section A2.

According to the printing unit 1 of the present embodiment, the distance between the back-up member supply first fixed conveyer 200*fd* and the back-up member supply second fixed conveyer 202*fd* in the Y direction corresponds to the dimension, in the Y direction, of the back-up plate 960*f* that can support the circuit board (90*f*, 90*r*) having the largest dimension in the Y direction. This ensures transfer of the back-up plate 960*f* with a large dimension in the Y direction.

The distance between the board supply fixed conveyer 200*fu* and the board supply movable conveyer 201*fu* in the Y direction is variable. This allows supply of a plurality of types of circuit boards 90*f* and 90*r* with different dimensions in the Y direction.

According to the board supply device 2 of the printing unit 1 of the present embodiment, the supply first fixed wall portion 200 and the support platform 203 are commonly used by the supply modules 20*f* and 20*r*. This reduces the number of parts compared to the case where the supply first fixed wall portion 200 and the support platform 203 are disposed for each of the supply modules 20*f* and 20*r*.

According to the screen printing machine 3 of the present embodiment, the printing portion 34*f* and the printing portion 34*r* are partitioned by the partition wall 312. This allows the operator 93*f* to replace a replacement part in one printing portion 34*f* (34*r*) without interference with the other printing portion 34*r* (34*f*).

According to the screen printing machine 3 of the present embodiment, the shutters 320*a* to 320*c* are disposed in the printing portion replacement access port 320 of the housing 32. In opening a portion of the printing portion replacement access port 320 that is on the front side with respect to the partition wall 312, the shutters 320*a* to 320*c* are accommodated in an overlapping manner in a portion of the printing portion replacement access port 320 that is on the rear side with respect to the partition wall 312. Conversely, in opening a portion of the printing portion replacement access port 320 that is on the rear side with respect to the partition wall 312, the shutters 320*a* to 320*c* are accommodated in an overlapping manner in a portion of the printing portion replacement access port 320 that is on the front side with respect to the partition wall 312. This also allows the operator 93*f* to replace a replacement part in one printing portion 34*f* (34*r*) without interference with the other printing portion 34*r* (34*f*).

Second Embodiment

The printing unit according to the present embodiment is different from the printing unit according to the first embodiment in that a Y-direction moving transfer device is disposed on the left side (upstream side) of a board supply device. The printing unit according to the present embodiment is also different from the printing unit according to the first embodiment in that a loader device is disposed on the left side of the Y-direction moving transfer device. The differences will be mainly described herein.

<Configuration of Printing Unit>

Figure 12:
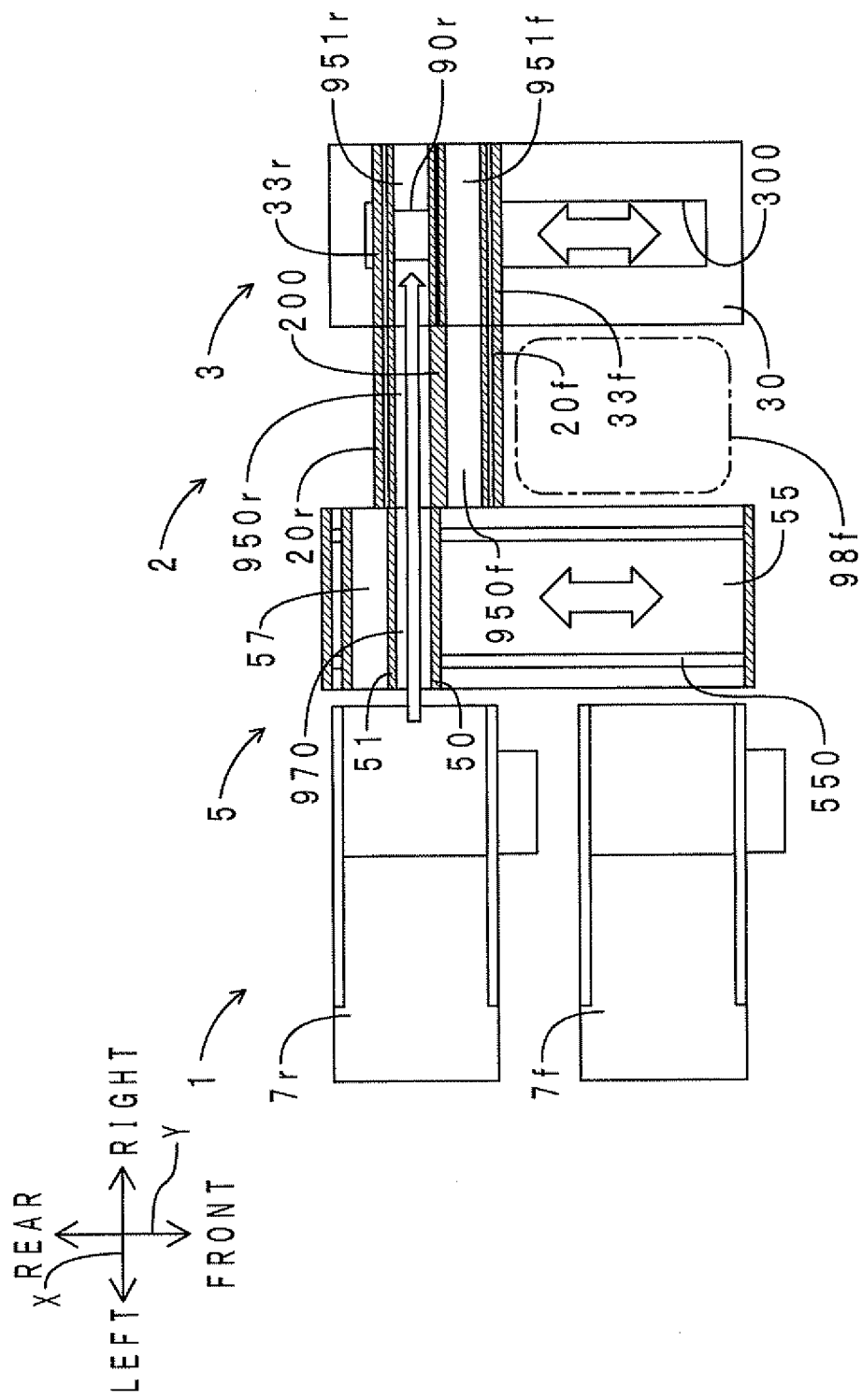
FIG. 12 is a schematic top view of a printing unit according to a second embodiment of the present invention.

First, the configuration of the printing unit according to the present embodiment is described. FIG. 12 is a schematic top view of the printing unit according to the present embodiment. Components corresponding to those of FIGS. 2 and 4 are denoted by the same reference symbols. As shown in FIG. 12, the printing unit 1 includes loader devices 7*f* and 7*r*, a Y-direction moving transfer device 5, a board supply device 2, and a screen printing machine 3. The board supply device 2 is included in the board relay device of the present invention. The supply modules 20*f* and 20*r* of the board supply device 2 are included in the relay module of the present invention. The board supply section A1 (see FIG. 4) of the board supply device 2 is included in the board relay section of the present invention.

[Configuration of Screen Printing Machine and Board Supply Device]

The screen printing machine 3 and the board supply device 2 are identical in configuration to those according to the first embodiment. The board supply device 2 is attached to the rear side of the left surface of the base portion 30 of the screen printing machine 3. The supply modules 20*f* and 20*r* of the board supply device 2 can be arranged in a row with the transfer modules 33*f* and 33*r* of the screen printing machine 3 in the left-right direction. The transfer modules 33*f* and 33*r* are movable independently of each other in the front-rear direction along the guide groove 300.

[Configuration of Loader Devices]

The loader devices 7*f* and 7*r* are each of a so-called magazine-rack type. The loader devices 7*f* and 7*r* are disposed on the left side of the board supply device 2 across the Y-direction moving transfer device 5 to be discussed later. The loader devices 7*f* and 7*r* are disposed side by side in the front-rear direction. Each of the loader devices 7*f* and 7*r* stocks a large number of circuit boards 90*r*.

[Configuration of Y-Direction Moving Transfer Device]

The Y-direction moving transfer device 5 is a so-called shuttle conveyer. The Y-direction moving transfer device 5 is interposed between the loader devices 7*f* and 7*r* and the board supply device 2. The Y-direction moving transfer device 5 distributes the circuit board 90*r* sent from the loader devices 7*f* and 7*r* to the supply modules 20*f* and 20*r* of the board supply device 2.

Figure 13:
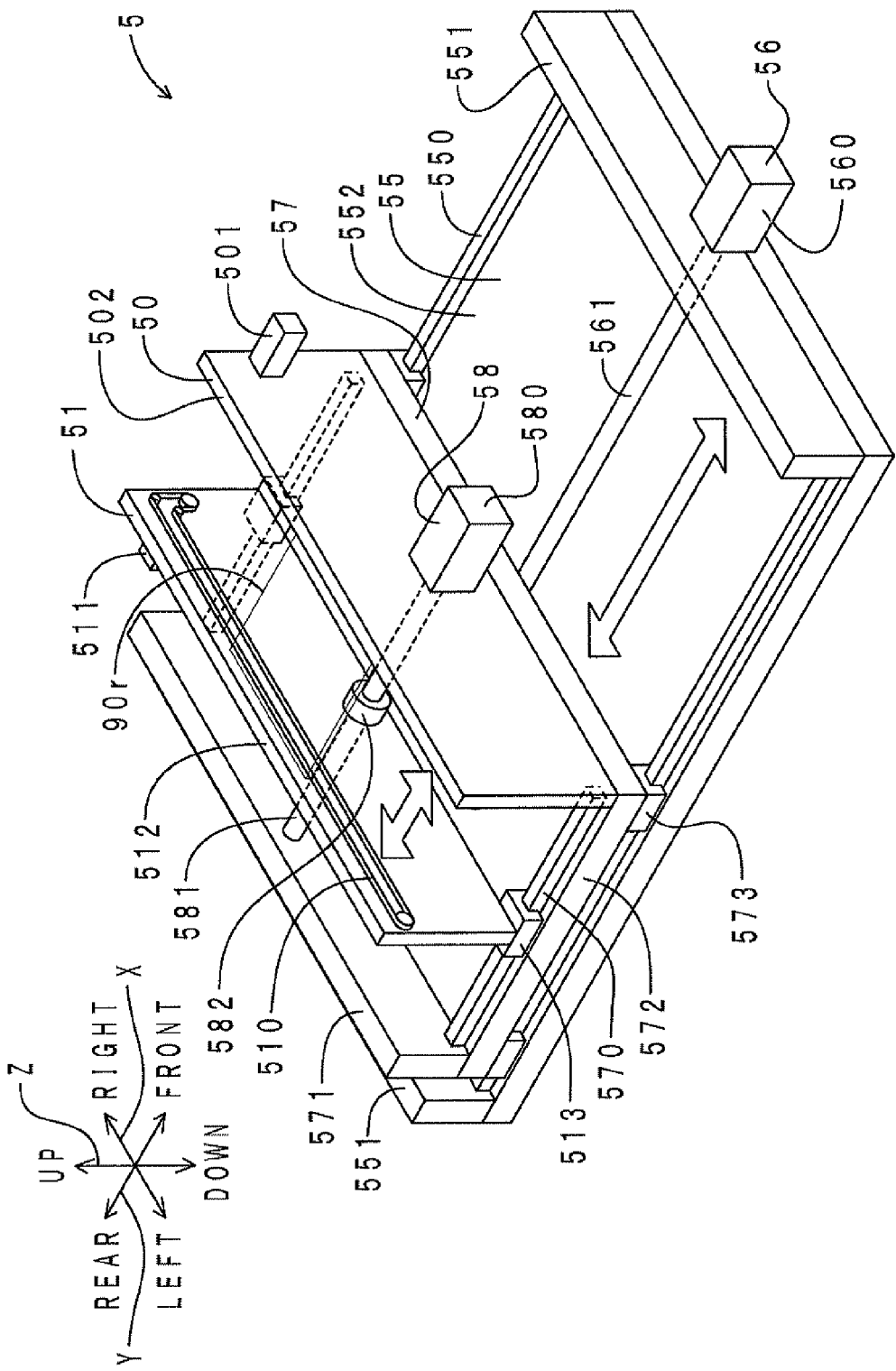
FIG. 13 is a perspective view of a Y-direction moving transfer device of the printing unit.

FIG. 13 is a perspective view of the Y-direction moving transfer device of the printing unit according to the present embodiment. As shown in FIG. 13, the Y-direction moving transfer device 5 includes a reference wall portion 50, a driven wall portion 51, a base plate 55, a shuttle base driving device 56, a shuttle base 57, and a driven wall portion driving device 58.

The base plate 55 includes a pair of shuttle base guide rails 550, a pair of upright wall portions 551, and a plate main body 552. The plate main body 552 assumes the shape of a rectangular plate. Each of the pair of upright wall portions 551 assumes the shape of a narrow plate. The pair of upright wall portions 551 are disposed along the front edge and the rear edge of the upper surface of the plate main body 552. Each of the pair of shuttle base guide rails 550 assumes the shape of a rectangular column. The pair of shuttle base guide rails 550 are disposed along the left edge and the right edge of the upper surface of the plate main body 552. The shuttle base guide rails 550 are disposed between the pair of upright wall portions 551. The reference wall portion 50, the driven wall portion 51, and the shuttle base 57 are included in the Y direction moving portion of the present invention.

The shuttle base driving device 56 includes a shuttle base ball screw portion driving motor 560, a shuttle base ball screw portion 561, and a nut (not shown). The shuttle base ball screw portion 561 is provided to extend between the pair of upright wall portions 551 so as to be rotatable about an axis of the shuttle base ball screw portion 561. The shuttle base ball screw portion driving motor 560 is attached to the front surface of the front upright wall portion 551. A rotary shaft of the shuttle base ball screw portion driving motor 560 is coupled to the shuttle base ball screw portion 561. The nut is mounted around the shuttle base ball screw portion 561. The nut is attached to the shuttle base 57 to be discussed later.

The shuttle base 57 includes a pair of driven wall portion guide rails 570, an upright wall portion 571, a base main body 572, and four guided blocks 573. The base main body 572 assumes the shape of a rectangular plate. The nut of the shuttle base driving device 56 is disposed on the lower surface of the base main body 572. The four guided blocks 573 are disposed at the four corners of the lower surface of the base main body 572. The four guided blocks 573 are in sliding contact with the pair of shuttle base guide rails 550. The upright wall portion 571 assumes the shape of a narrow plate. The upright wall portion 571 is disposed along the rear edge of the upper surface of the base main body 572. Each of the pair of driven wall portion guide rails 570 assumes the shape of a rectangular column. The pair of driven wall portion guide rails 570 are disposed along the left edge and the right edge of the upper surface of the base main body 572. The driven wall portion guide rails 570 are disposed between the reference wall portion 50 to be discussed later and the upright wall portion 571.

The reference wall portion 50 includes a reference conveyer (not shown), a reference conveyer driving motor 501, and a wall portion main body 502. The wall portion main body 502 assumes the shape of a rectangular plate. The wall portion main body 502 is provided to extend upward along the front edge of the upper surface of the base main body 572. The reference conveyer is disposed in the vicinity of the upper edge of the rear surface of the wall portion main body 502. The reference conveyer extends in the left-right direction. The reference conveyer driving motor 501 is disposed in the vicinity of the upper right corner of the front surface of the wall portion main body 502. The reference conveyer driving motor 501 drives the reference conveyer.

The driven wall portion 51 includes a driven conveyer 510, a driven conveyer driving motor 511, a wall portion main body 512, and a pair of guided blocks 513. The wall portion main body 512 assumes the shape of a rectangular plate. The pair of guided blocks 513 are fixed to both the left and right ends of the lower surface of the wall portion main body 512. The pair of guided blocks 513 are in sliding contact with the pair of driven wall portion guide rails 570. The driven conveyer 510 is disposed in the vicinity of the upper edge of the front surface of the wall portion main body 512. The driven conveyer 510 extends in the left-right direction. The driven conveyer 510 faces the reference conveyer in the front-rear direction. A circuit board 90r is provided to extend between the driven conveyer 510 and the reference conveyer. The circuit board 90r is transferred from the left side to the right side by the driven conveyer 510 and the reference conveyer. The driven conveyer driving motor 511 is disposed in the vicinity of the upper right corner of the rear surface of the wall portion main body 512. The driven conveyer driving motor 511 drives the driven conveyer 510.

The driven wall portion driving device 58 includes a driven wall portion ball screw portion driving motor 580, a driven wall portion ball screw portion 581, and a nut 582. The driven wall portion ball screw portion 581 is provided to extend between the wall portion main body 502 of the reference wall portion 50 and the upright wall portion 571 of the shuttle base 57 so as to be rotatable about an axis of the driven wall portion ball screw portion 581. The driven wall portion ball screw portion driving motor 580 is attached to the front surface of the wall portion main body 502. A rotary shaft of the driven wall portion ball screw portion driving motor 580 is coupled to the driven wall portion ball screw portion 581. The nut 582 is mounted around the driven wall portion ball screw portion 581. The nut 582 is attached to the wall portion main body 512 of the driven wall portion 51.

[Motion of Y-Direction Moving Transfer Device]

In the case of moving the shuttle base 57 in the front-rear direction, the shuttle base ball screw portion driving motor 560 is driven. The shuttle base ball screw portion 561 is thus caused to rotate about its axis. A nut is mounted around the shuttle base ball screw portion 561. The nut is attached to the shuttle base 57. Therefore, the rotation of the shuttle base ball screw portion 561 about its axis moves the nut in the front-rear direction. The rotation of the shuttle base ball screw portion 561 also moves the shuttle base 57 in the front-rear direction along the shuttle base guide rails 550.

In the case of changing the clearance between the reference conveyer and the driven conveyer 510, the driven wall portion 51 is moved in the front-rear direction. Specifically, first, the driven wall portion ball screw portion driving motor 580 is driven. The driven wall portion ball screw portion 581 is thus caused to rotate about its axis. The nut 582 is mounted around the driven wall portion ball screw portion 581. The nut 582 is attached to the driven wall portion 51. Therefore, the rotation of the driven wall portion ball screw portion 581 about its axis moves the nut 582 in the front-rear direction. The rotation of the driven wall portion ball screw portion 581 also moves the driven wall portion 51 in the front-rear direction along the driven wall portion guide rails 570.

<Motion During Production of Circuit Board>

Now, the motion of the printing unit 1 according to the present embodiment during production of a circuit board is described. First, the motion during production of a circuit board in the rear production line is described. In the case where the rear production line is used, first, as shown in FIG. 12, the shuttle base 57 of the Y-direction moving transfer device 5 is moved to the rear side. Also, the transfer module 33r of the screen printing machine 3 is moved to the rear side. Then, the loader device 7r, a lane 970 of the Y-direction moving transfer device 5, the rear lane 950r of the board supply device 2, and the rear lane 951r of the screen printing machine 3 are arranged in line in the left-right direction. Subsequently, the circuit board 90r is sent from the loader device 7r to the lane 970 of the Y-direction moving transfer device 5. The sent circuit board 90r reaches the rear lane 951r by way of the lane 970 and the rear lane 950r. Thereafter, solder is printed on the circuit board 90r in a predetermined pattern.

Figure 14:
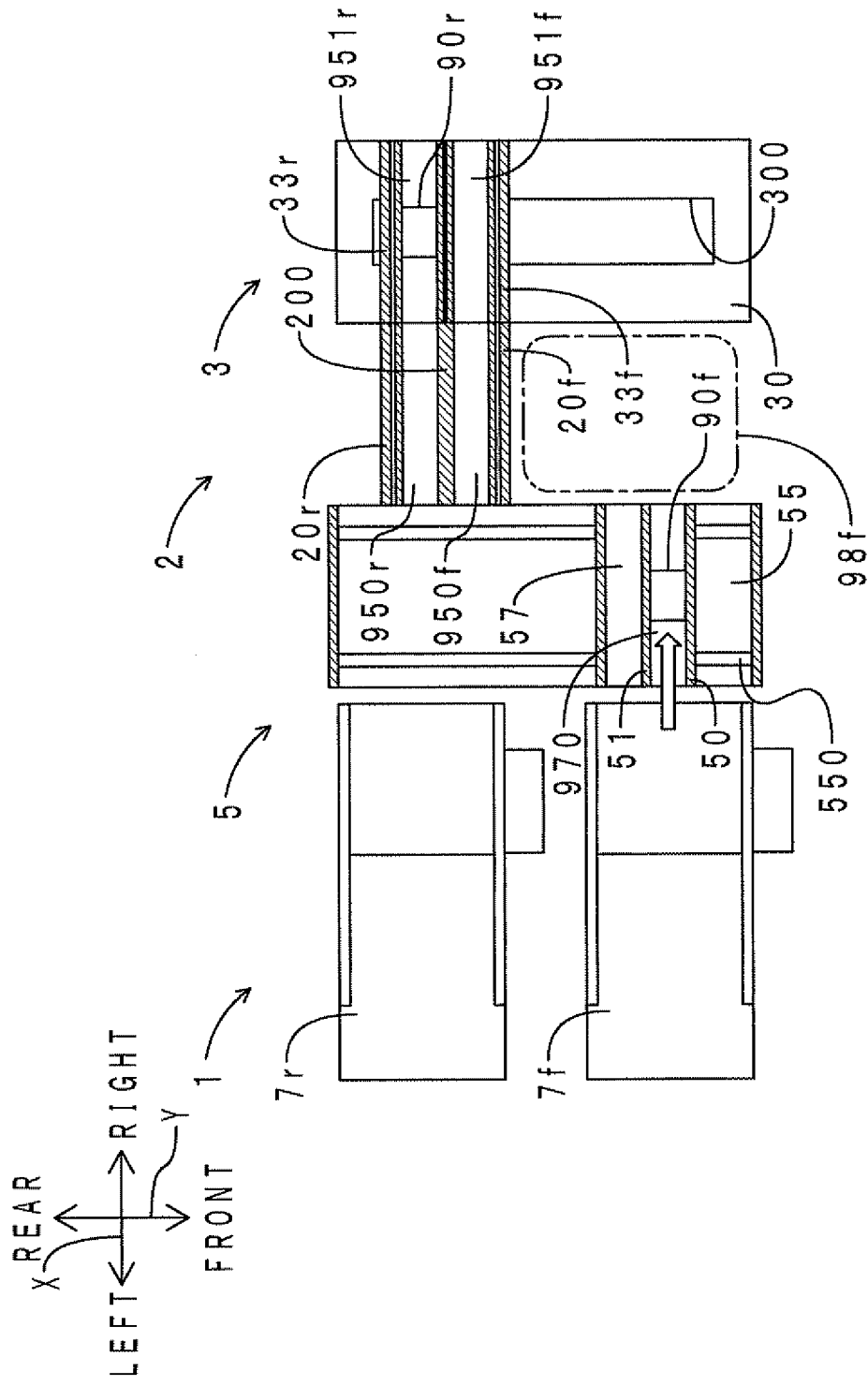
FIG. 14 is a schematic top view of the printing unit in a first stage of operation in which a front production line of the printing unit is used.
Figure 15:
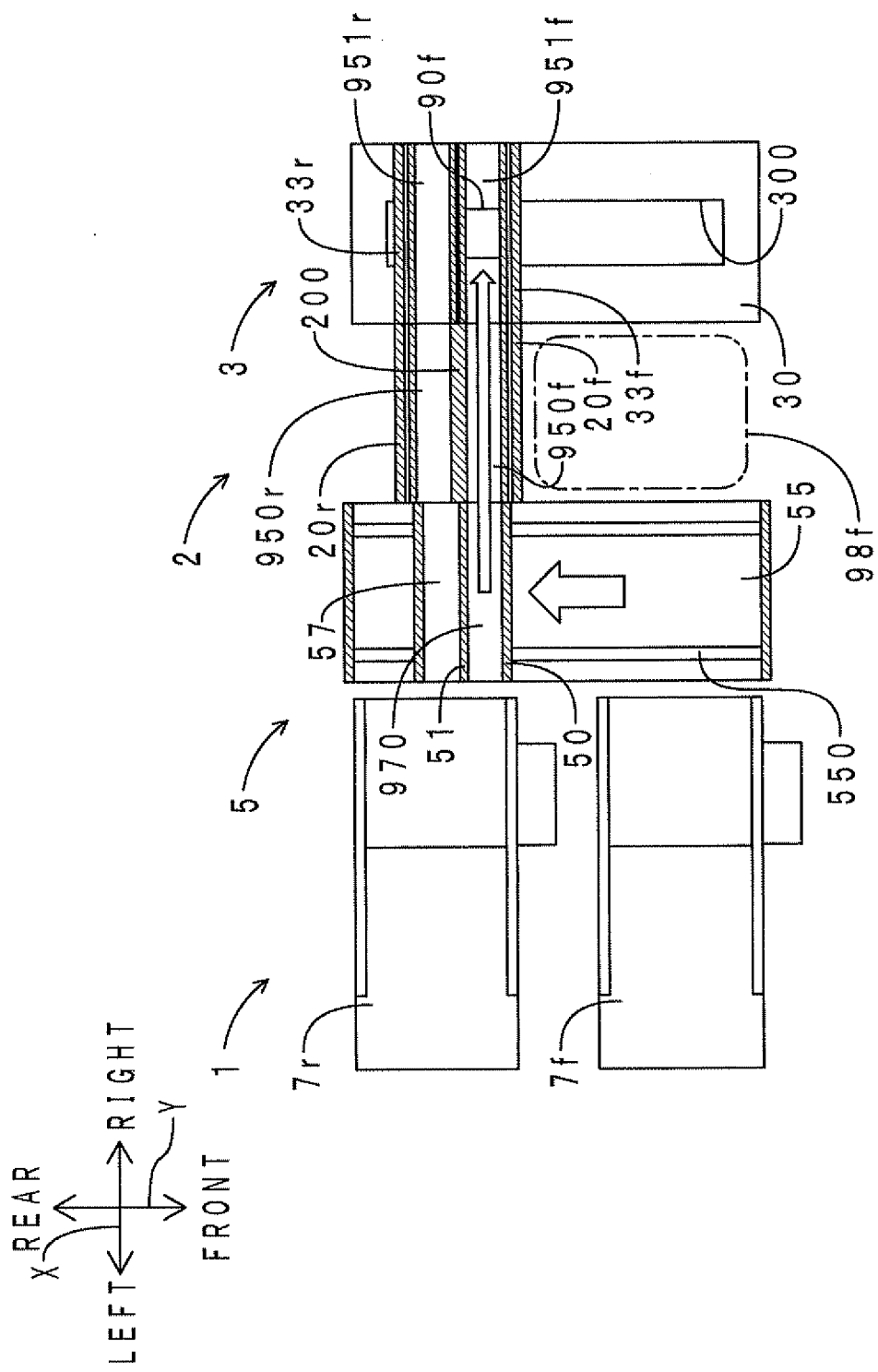
FIG. 15 is a schematic top view of the printing unit in a second stage of the operation.
Figure 16:
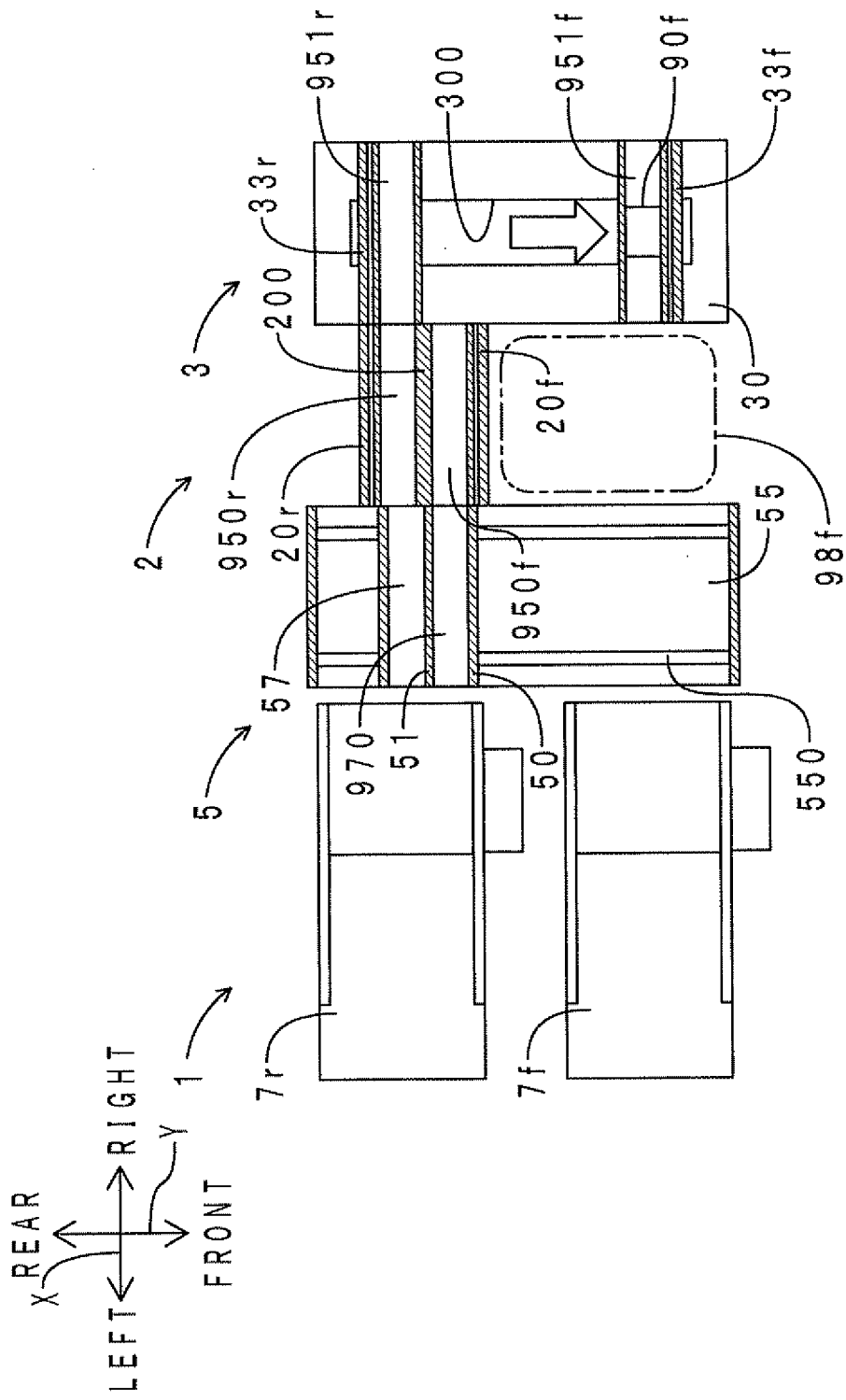
FIG. 16 is a schematic top view of the printing unit in a third stage of the operation.

Now, the motion during production of a circuit board in the front production line is described. FIG. 14 is a schematic top view of the printing unit according to the present embodiment in a first stage of operation in which the front production line of the printing unit is used. FIG. 15 is a schematic top view of the printing unit in a second stage of the operation. FIG. 16 is a schematic top view of the printing unit in a third stage of the operation.

In the case where the front production line is used, first, as shown in FIG. 14, the shuttle base 57 of the Y-direction moving transfer device 5 is moved to the front side. In addition, the transfer module 33f of the screen printing machine 3 is moved to the rear side. Then, the loader device 7f and the lane 970 of the Y-direction moving transfer device 5 are arranged in line in the left-right direction. Also, the front lane 950f of the board supply device 2 and the front lane 951f of the screen printing machine 3 are arranged in line in the left-right direction. Subsequently, the circuit board 90f is sent from the loader device 7f to the lane 970 of the Y-direction moving transfer device 5.

After that, as shown in FIG. 15, the shuttle base 57 of the Y-direction moving transfer device 5 is moved to the rear side. Then, the lane 970 of the Y-direction moving transfer device 5, the front lane 950f of the board supply device 2, and the front lane 951f of the screen printing machine 3 are arranged in line in the left-right direction. Subsequently, the circuit board 90f is transferred to the front lane 951f of the screen printing machine 3. Then, as shown in FIG. 16, the transfer module 33f is moved to the front side. Thereafter, solder is printed on the circuit board 90f in a predetermined pattern.

A circuit board may be supplied from the rear loader device 7r to the front lane 951f of the screen printing machine 3 by appropriately moving the Y-direction moving transfer device 5, the board supply device 2, and the screen printing machine 3 in a similar manner to the operation described above. Conversely, a circuit board may be supplied from the front loader device 7f to the rear lane 951r of the screen printing machine 3.

<Securement of Operation Space>

Now, the motion of the printing unit 1 according to the present embodiment for securing an operation space is described. As shown in FIGS. 12 and 14 to 16, during production of a circuit board, an operation space 98f is secured at a position on the front side of the board supply device 2 between the screen printing machine 3 and the Y-direction moving transfer device 5. The operation space 98f is commonly used in both the case where the front production line is used and the case where the rear production line is used. This makes it easy for the operator to perform maintenance work or the like on the front lane 951f and the rear lane 951r using the operation space 98f.

<Function and Effect>

Now, the function and effect of the printing unit 1 according to the present embodiment are described. The printing unit 1 according to the present embodiment has the same function and effect as those of the printing unit according to the first embodiment as far as components that are common in configuration are concerned.

According to the printing unit 1 of the present embodiment, as shown in FIG. 12, the operation space 98f can be secured at a position that is directly on the left side (upstream side in the X direction) of the printing position of the screen printing machine 3. This makes it easy for the operator to perform work such as part replacement or maintenance. Also, the operation space 98f can be secured at a position that is next to the screen printing machine 3 not in the Y direction but in the X direction, in other words, in an area of the production line. This achieves a high space efficiency.

According to the printing unit 1 of the present embodiment, as shown in FIGS. 12 and 14 to 16, work can be performed on the screen printing machine 3 from a side in the X direction. Therefore, it is not necessary to stop the front lane 951f which is proximate to the operator when he/she performs work on the rear lane 951r which is distant from him/her. This allows the printing unit 1 according to the present embodiment to produce the circuit boards 90f and 90r with a high production efficiency.

According to the printing unit 1 of the present embodiment, the loader devices 7f and 7r each of an existing magazine-rack type are used. Also, the Y-direction moving transfer device 5 which is a shuttle conveyer of an existing type is used. Therefore, the production lines can be constructed without developing these devices anew.

Third Embodiment

The printing unit according to the present embodiment is different from the printing unit according to the second embodiment in that X-direction moving transfer devices are disposed in place of the board supply device and the Y-direction moving transfer device. The differences will be mainly described herein.

<Configuration of Printing Unit>

Figure 17:
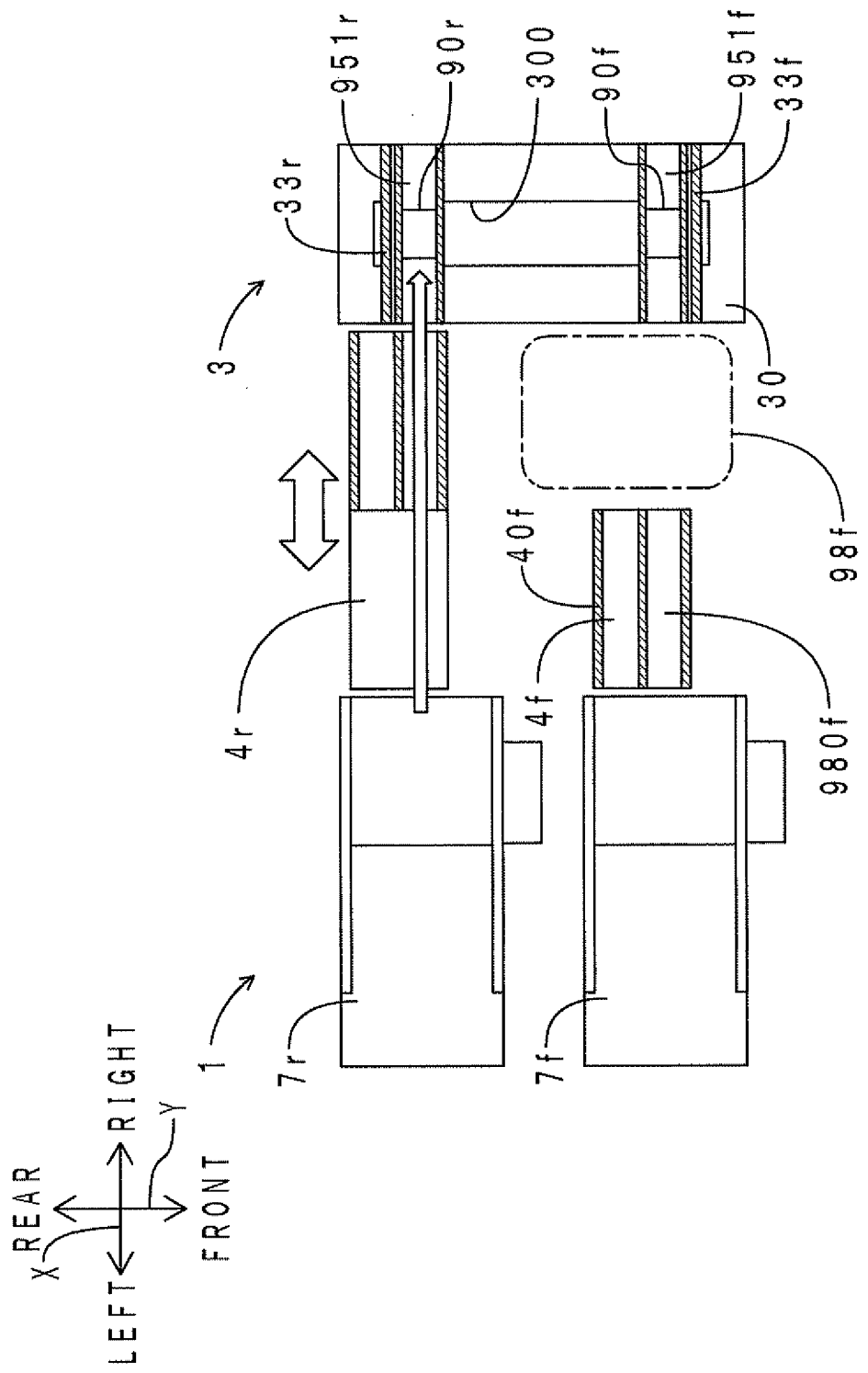
FIG. 17 is a schematic top view of a printing unit according to a third embodiment of the present invention.

First, the configuration of the printing unit according to the present embodiment is described. FIG. 17 is a schematic top view of the printing unit according to the present embodiment. Components corresponding to those of FIG. 12 are denoted by the same reference symbols. As shown in FIG. 17, the printing unit 1 includes loader devices 7f and 7r, X-direction moving transfer devices 4f and 4r, and a screen printing machine 3.

[Configuration of Screen Printing Machine and Loader Devices]

The screen printing machine 3 and the loader devices 7f and 7r are identical in configuration to those according to the first embodiment. Thus, the description of the components is omitted herein.

[Configuration of X-Direction Moving Transfer Devices]

The X-direction moving transfer devices 4f and 4r are each a so-called shuttle conveyer. The X-direction moving transfer devices 4f and 4r are interposed between the loader devices 7f and 7r and the screen printing machine 3. The X-direction moving transfer device 4f is disposed on the right side (downstream side) of the loader device 7f. The X-direction moving transfer device 4r is disposed on the right side of the loader device 7r. The X-direction moving transfer devices 4f and 4r deliver a circuit board sent from the loader devices 7f and 7r to the screen printing machine 3.

The two X-direction moving transfer devices 4f and 4r are identical in configuration to each other. Thus, only the configuration of the front X-direction moving transfer device 4f is described herein, and the same description is also applied to the configuration of the rear X-direction moving transfer device 4r.

Figure 18:
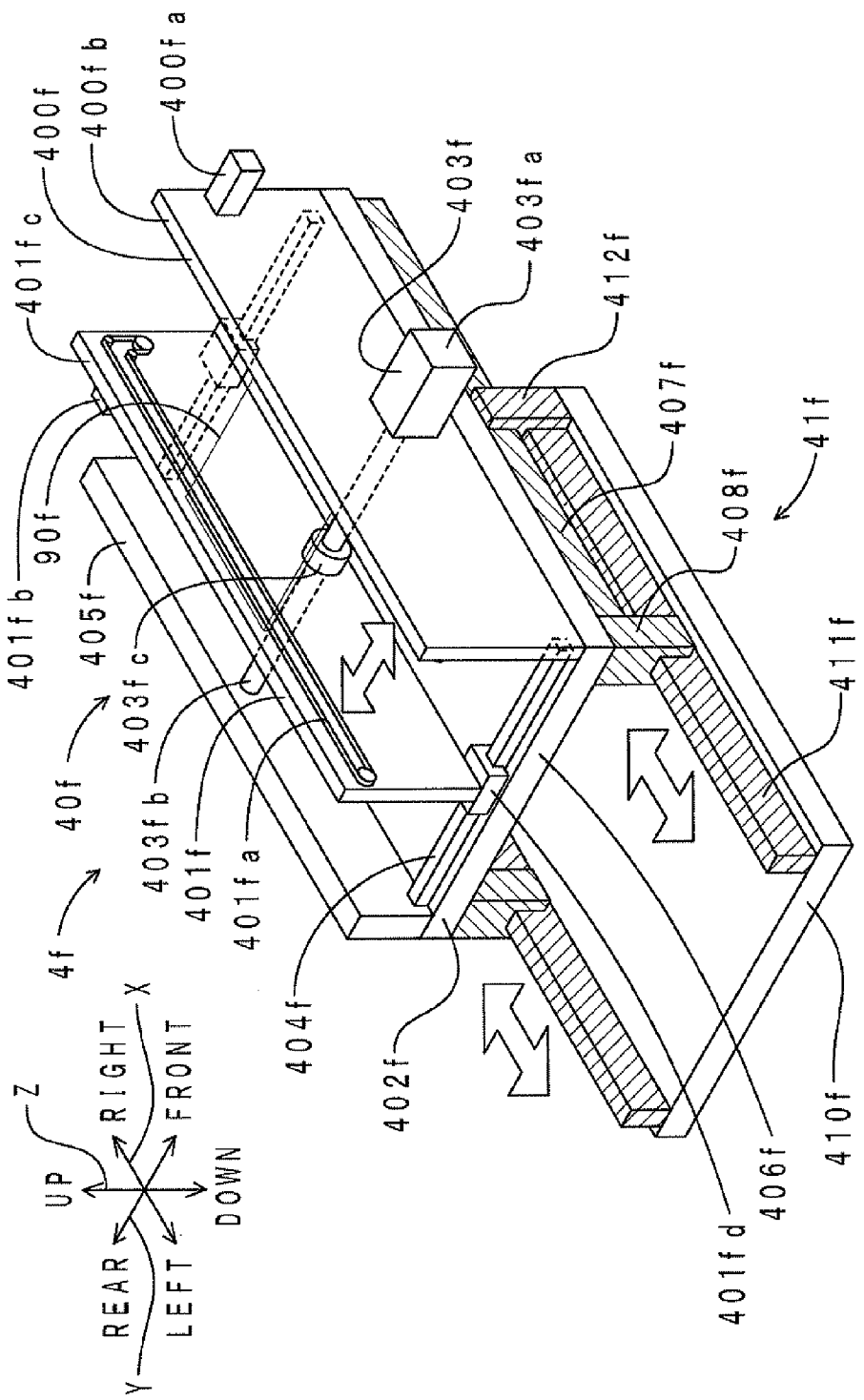
FIG. 18 is a perspective view of a front X-direction moving transfer device of the printing unit.

FIG. 18 is a perspective view of the front X-direction moving transfer device of the printing unit according to the present embodiment. As shown in FIG. 18, the X-direction moving transfer device 4f includes an X-direction moving portion 40f and a fixed portion 41f.

The fixed portion 41f includes a fixed portion base portion 410f, a pair of fixed portion-side guide rails 411f, and a pair of fixed portion-side guided blocks 412f. The fixed portion-side guide rails 411f and the fixed portion-side guided blocks 412f are shown as hatched for convenience of description. The fixed portion base portion 410f assumes the shape of a rectangular plate. Each of the pair of fixed portion-side guide rails 411f assumes the shape of a rectangular column. The pair of fixed portion-side guide rails 411f are disposed along the front edge and the rear edge of the upper surface of the fixed portion base portion 410f. The fixed portion-side guided blocks 412f are arranged at the right end of the fixed portion-side guide rails 411f.

The X-direction moving portion 40f includes a reference wall portion 400f, a driven wall portion 401f, a moving portion base portion 402f, and a driven wall portion driving device 403f. The moving portion base portion 402f includes a pair of driven wall portion guide rails 404f, an upright wall portion 405f, a base portion main body 406f, a pair of moving portion-side guide rails 407f, and a pair of moving portion-side guided blocks 408f. The moving portion-side guide rails 407f and the moving portion-side guided blocks 408f are shown as hatched for convenience of description. The base portion main body 406f assumes the shape of a rectangular plate. Each of the pair of moving portion-side guide rails 407f assumes the shape of a rectangular column. The pair of moving portion-side guide rails 407f are disposed along the front edge and the rear edge of the lower surface of the base portion main body 406f. The moving portion-side guided blocks 408f are arranged at the left end of the moving portion-side guide rails 407f. The moving portion-side guide rails 407f are in contact with the fixed portion-side guided blocks 412f of the fixed portion 41f so as to be slidable with respect to the fixed portion-side guided blocks 412f and so as not to be detached from the fixed portion-side guided blocks 412f in the up-down direction. The moving portion-side guided blocks 408f are in contact with the fixed portion-side guide rails 411f of the fixed portion 41f so as to be slidable with respect to the fixed portion-side guide rails 411f and so as not to be detached from the fixed portion-side guide rails 411f in the up-down direction. The upright wall portion 405f assumes the shape of a narrow plate. The upright wall portion 405f is disposed along the rear edge of the upper surface of the base portion main body 406f. Each of the pair of driven wall portion guide rails 404f assumes the shape of a rectangular column. The pair of driven wall portion guide rails 404f are disposed along the left edge and the right edge of the upper surface of the base portion main body 406f. The driven wall portion guide rails 404f are disposed between the reference wall portion 400f to be discussed later and the upright wall portion 405f.

The reference wall portion 400f includes a reference conveyer (not shown), a reference conveyer driving motor 400fa, and a wall portion main body 400fb. The wall portion main body 400fb assumes the shape of a rectangular plate. The wall portion main body 400fb is provided to extend upward along the front edge of the upper surface of the base portion main body 406f. The reference conveyer is disposed in the vicinity of the upper edge of the rear surface of the wall portion main body 400fb. The reference conveyer extends in the left-right direction. The reference conveyer driving motor 400fa is disposed in the vicinity of the upper right corner of the front surface of the wall portion main body 400fb. The reference conveyer driving motor 400fa drives the reference conveyer.

The driven wall portion 401f includes a driven conveyer 401fa, a driven conveyer driving motor 401fb, a wall portion main body 401fc, and a pair of guided blocks 401fd. The wall portion main body 401fc assumes the shape of a rectangular plate. The pair of guided blocks 401fd are fixed to both the left and right ends of the lower surface of the wall portion main body 401fc. The pair of guided blocks 401fd are in sliding contact with the pair of driven wall portion guide rails 404f. The driven conveyer 401fa is disposed in the vicinity of the upper edge of the front surface of the wall portion main body 401fc. The driven conveyer 401fa extends in the left-right direction. The driven conveyer 401fa faces the reference conveyer in the front-rear direction. The circuit board 90f is provided to extend between the driven conveyer 401fa and the reference conveyer. The circuit board 90f is transferred from the left side to the right side by the driven conveyer 401fa and the reference conveyer. The driven conveyer driving motor 401fb is disposed in the vicinity of the upper right corner of the rear surface of the wall portion main body 401fc. The driven conveyer driving motor 401fb drives the driven conveyer 401fa.

The driven wall portion driving device 403f includes a driven wall portion ball screw portion driving motor 403fa, a driven wall portion ball screw portion 403fb, and a nut 403fc. The driven wall portion ball screw portion 4031b is provided to extend between the wall portion main body 400fb of the reference wall portion 400f and the upright wall portion 405f of the moving portion base portion 402f so as to be rotatable about an axis of the driven wall portion ball screw portion 403fb. The driven wall portion ball screw portion driving motor 403fa is attached to the front surface of the wall portion main body 400fb. A rotary shaft of the driven wall portion ball screw portion driving motor 403fa is coupled to the driven wall portion ball screw portion 403fb. The nut 403fc is mounted around the driven wall portion ball screw portion 403fb. The nut 403fc is attached to the wall portion main body 401fc of the driven wall portion 401f.

[Motion of X-Direction Moving Transfer Devices]

In the case of sliding the X-direction moving portion 40f with respect to the fixed portion 41f, as shown in FIG. 18, the moving portion-side guided blocks 408f are slided along and with respect to the fixed portion-side guide rails 411f. Also, the fixed portion-side guided blocks 412f are slided along and with respect to the moving portion-side guide rails 407f. The X-direction moving portion 40f is slidable with respect to the fixed portion 41f in the left-right direction from a position that is generally directly above the fixed portion 41f to a position at which the fixed portion-side guided blocks 412f and the moving portion-side guided blocks 408f are in contact with each other in the left-right direction.

In the case of changing the clearance between the reference conveyer and the driven conveyer 401fa, the driven wall portion 401f is moved in the front-rear direction. Specifically, first, the driven wall portion ball screw portion driving motor 403fa is driven. The driven wall portion ball screw portion 403fb is thus caused to rotate about its axis. The nut 403fc is mounted around the driven wall portion ball screw portion 403fb. The nut 403fc is attached to the driven wall portion 401f. Therefore, the rotation of the driven wall portion ball screw portion 403fb about its axis moves the nut 403fc in the front-rear direction. The rotation of the driven wall portion ball screw portion 403fb also moves the driven wall portion 401f in the front-rear direction along the driven wall portion guide rails 404f.

<Motion During Production of Circuit Board>

Figure 19:
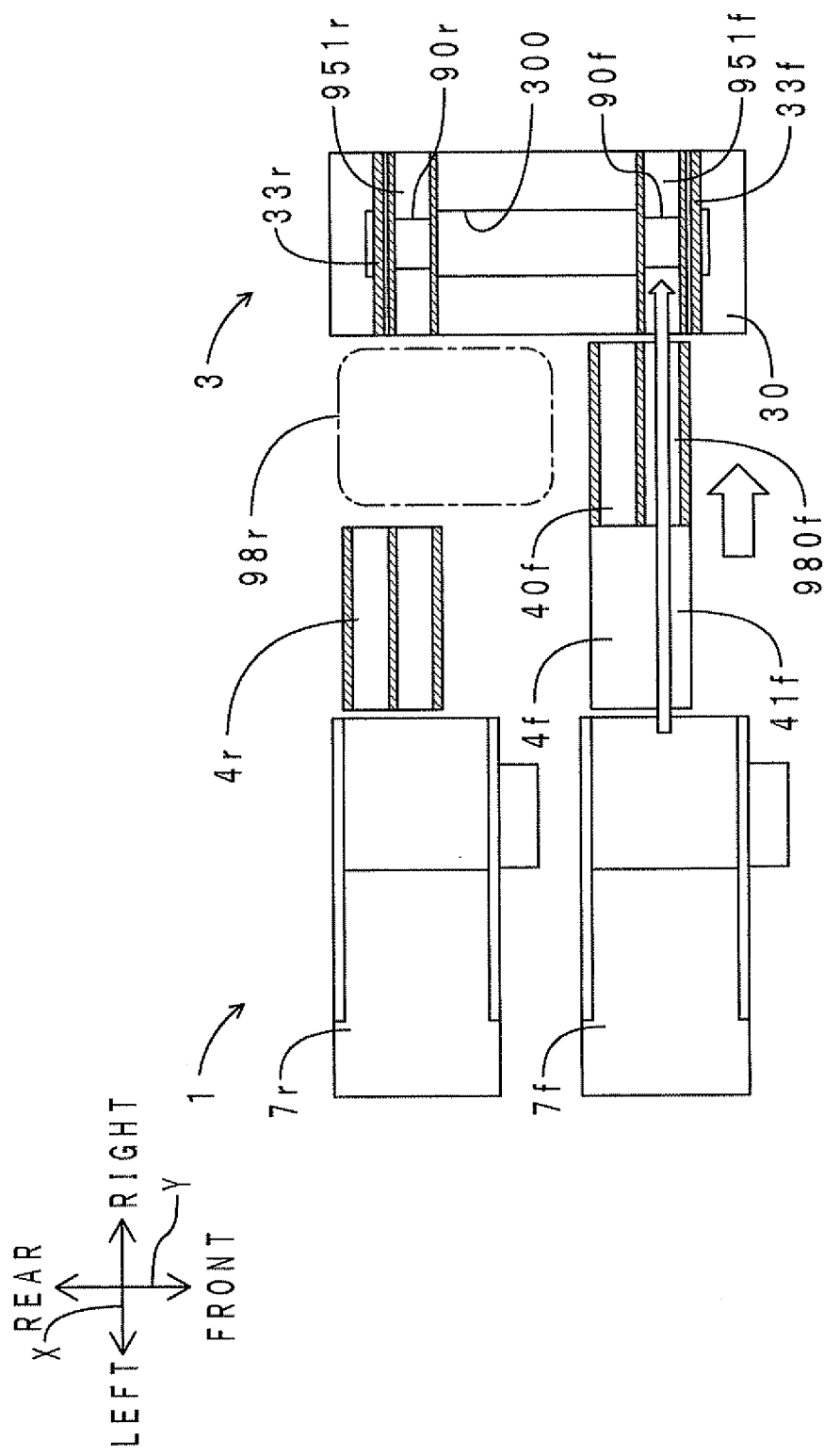
FIG. 19 is a schematic top view of the printing unit in the case of securing an operation space on the rear side.

Now, the motion of the printing unit 1 according to the present embodiment during production of a circuit board is described. FIG. 19 is a schematic top view of the printing unit according to the present embodiment in the case of securing an operation space on the rear side. As shown in FIGS. 17 and 19, the X-direction moving transfer devices 4f and 4r are each switchable between a transfer mode (the X-direction moving transfer device 4r in FIG. 17 and the X-direction moving transfer device 4f in FIG. 19) and an operation mode (the X-direction moving transfer device 4f in FIG. 17 and the X-direction moving transfer device 4r in FIG. 19). Of the transfer mode and the operation mode, the transfer mode is used during production of a circuit board.

The two X-direction moving transfer devices 4f and 4r are identical in motion to each other. Thus, only the motion of the front X-direction moving transfer device 4f is described herein, and the same description is also applied to the motion of the rear X-direction moving transfer device 4r.

In the transfer mode, the X-direction moving portion 40f is reciprocated in the left-right direction between the loader device 7f and the screen printing machine 3 using the sliding mechanism of the X-direction moving transfer device 4f. Specifically, first, the X-direction moving portion 40f is slided to a position that is generally directly above the fixed portion 41f. In addition, the transfer module 33f of the screen printing machine 3 is moved to the front side. Then, the circuit board 90f is sent from the loader device 7f to a lane 980f of the X-direction moving portion 40f. After that, the X-direction moving portion 40f is slided to the right side with respect to the fixed portion 41f. Then, the X-direction moving portion 40f and the transfer module 33f are brought into proximity to each other. Subsequently, the circuit board 90f is sent from the X-direction moving portion 40f to the transfer module 33f. Thereafter, solder is printed on the circuit board 90f in a predetermined pattern.

<Securement of Operation Space>

Now, the motion of the printing unit 1 according to the present embodiment for securing an operation space is described. In the transfer mode, the X-direction moving portion 40f moves in the left-right direction as indicated by the X-direction moving transfer device 4r in FIG. 17 and the X-direction moving transfer device 4f in FIG. 19. Therefore, no operation space can be secured at a position on the left side of the screen printing machine 3.

In order to secure an operation space, the X-direction moving transfer device 4f is switched to the operation mode. That is, as shown in FIG. 18, the X-direction moving portion 40f is moved to a position that is generally directly above the fixed portion 41f using the sliding mechanism of the X-direction moving transfer device 4f. Then, as shown in FIG. 17, the operation space 98f is secured at a position on the left front side of the screen printing machine 3. When the rear X-direction moving transfer device 4r is switched to the operation mode, as shown in FIG. 19, the operation space 98r can be secured at a position on the left rear side of the screen printing machine 3.

<Function and Effect>

Now, the function and effect of the printing unit 1 according to the present embodiment are described. The printing unit 1 according to the present embodiment has the same function and effect as those of the printing unit according to the second embodiment as far as components that are common in configuration are concerned.

According to the printing unit 1 of the present embodiment, as shown in FIGS. 17 and 19, the operation spaces 98f and 98r can be secured at positions that are directly on the upstream side, in the X direction, of the printing positions of the screen printing machine 3 by switching the X-direction moving transfer devices 4f and 4r to the operation mode. This makes it easy for the operator to perform work such as part replacement or maintenance. Also, the operation spaces can be secured at positions that are next to the screen printing machine 3 not in the Y direction but in the X direction, in other words, in an area of the production line. This achieves a high space efficiency.

According to the printing unit 1 of the present embodiment, as shown in FIGS. 17 and 19, the operation spaces 98f and 98r are arranged in the Y direction, thereby allowing the operator to cross the production lines in the Y direction.

According to the printing unit 1 of the present embodiment, as shown in FIG. 18, the transfer mode and the operation mode can be easily switched using the sliding mechanism of the X-direction moving transfer device 4f. In the transfer mode, the circuit board 90f can be transferred.

According to the printing unit 1 of the present embodiment, as shown in FIG. 17, the operation space 98f can be secured at a position that is directly next to the front lane 951f in the X direction. Also, as shown in FIG. 19, the operation space 98r can be secured at a position that is directly next to the rear lane 951r in the X direction. This eliminates the need to perform work for the printing positions from an oblique direction (a direction intersecting the X direction). Thus, a high workability is achieved.

According to the printing unit 1 of the present embodiment, the loader devices 7f and 7r each of an existing magazine-rack type are used. Also, the X-direction moving transfer devices 4f and 4r which are each a shuttle conveyer of an existing sliding type are used. Therefore, the production lines can be constructed without developing these devices anew.

Fourth Embodiment

The printing unit according to the present embodiment is different from the printing unit according to the third embodiment in that X-direction moving transfer devices of a flip-up type rather than a sliding type are used. The differences will be mainly described herein.

<Configuration of Printing Unit>

First, the configuration of the printing unit according to the present embodiment is described.

[Configuration of Screen Printing Machine and Loader Devices]

The screen printing machine and the loader devices are identical in configuration to those according to the third embodiment. Thus, the description of the components is omitted herein.

[Configuration of X-Direction Moving Transfer Devices]

The X-direction moving transfer devices are each a conveyer of a so-called flip-up type. The two X-direction moving transfer devices are interposed between the two loader devices and the screen printing machine. The two X-direction moving transfer devices are identical in configuration to each other. Thus, only the configuration of the front X-direction moving transfer device is described herein, and the same description is also applied to the configuration of the rear X-direction moving transfer device.

Figure 20:
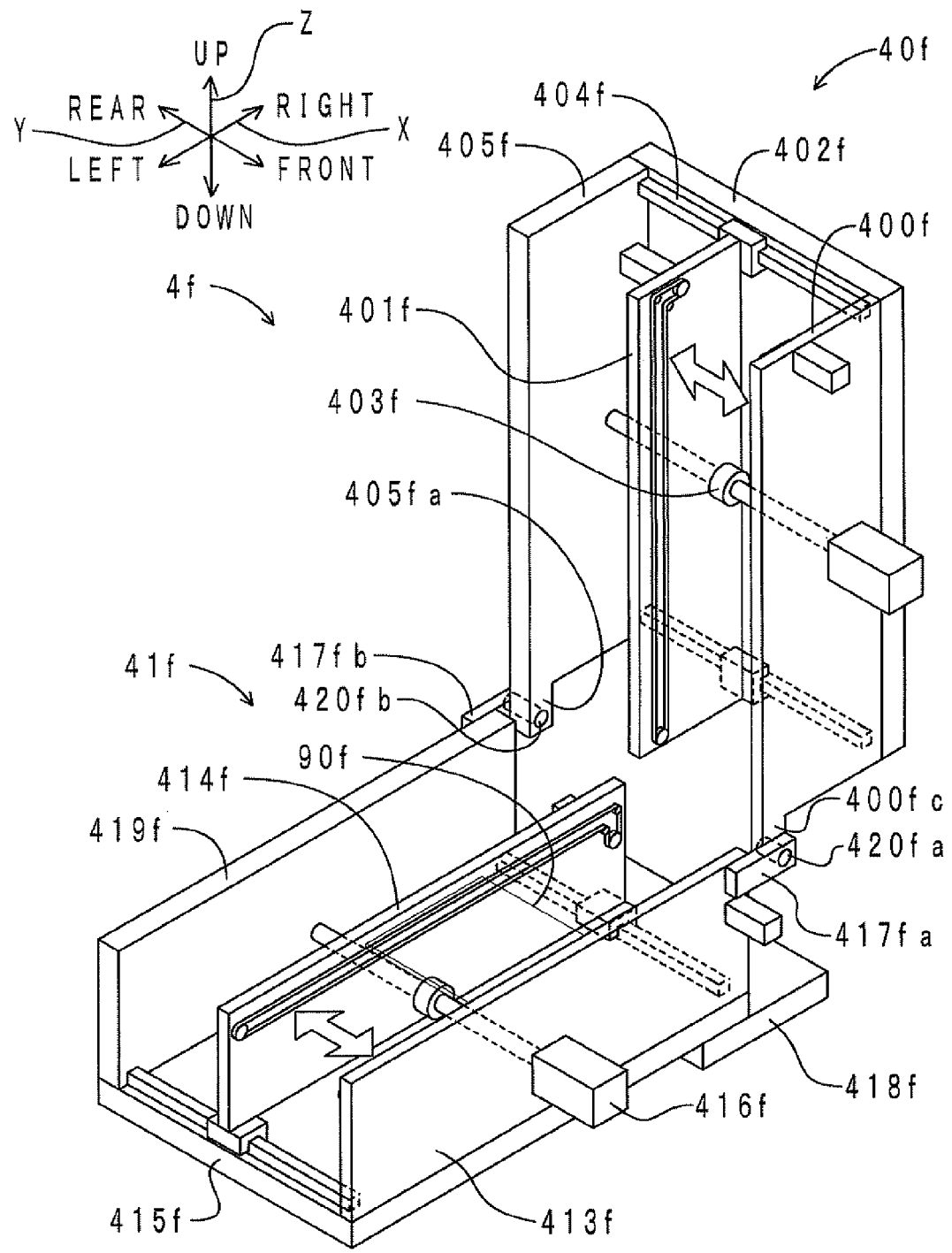
FIG. 20 is a perspective view of a front X-direction moving transfer device of a printing unit according to a fourth embodiment of the present invention.

FIG. 20 is a perspective view of the front X-direction moving transfer device of the printing unit according to the present embodiment. Components corresponding to those of FIG. 18 are denoted by the same reference symbols. As shown in FIG. 20, the X-direction moving transfer device 4f includes an X-direction moving portion 40f and a fixed portion 41f.

A pivot piece 405fa is formed at the left end of the upright wall portion 405f of the X-direction moving portion 40f. Also, a pivot piece 400fc is formed at the left end of the reference wall portion 400f of the X-direction moving portion 40f.

The fixed portion 41f is disposed on the left side of the X-direction moving portion 40f. The fixed portion 41f includes a reference wall portion 413f, a driven wall portion 414f, a fixed portion base portion 415f, a driven wall portion driving device 416f, a pair of pivot pieces 417fa and 417fb, a bottom plate portion 418f, an upright wall portion 419f, and pivot shafts 420fa and 420fb.

The pivot piece 417fa is disposed at the right end of the reference wall portion 413f. The pivot piece 417fa is disposed on the front side of the pivot piece 400fc. The pivot shaft 420fa is inserted through the pivot pieces 417fa and 400fc. The pivot piece 417fb is disposed at the right end of the upright wall portion 419f. The pivot piece 417fb is disposed on the rear side of the pivot piece 405fa. The pivot shaft 420fb is inserted through the pivot pieces 417fb and 405fa. The bottom plate portion 418f is disposed at the right edge of the fixed portion base portion 415f.

[Motion of X-Direction Moving Transfer Devices]

The circuit board transfer mechanism and the driven wall portion moving mechanism of the X-direction moving portion 40f are the same as the circuit board transfer mechanism and the driven wall portion moving mechanism of the X-direction moving portion according to the third embodiment. Also, the transfer mechanism for the circuit board 90f and the moving mechanism for the driven wall portion 414f of the fixed portion 41f are the same as the circuit board transfer mechanism and the driven wall portion moving mechanism of the X-direction moving portion 40f. Thus, the description of the components is omitted herein.

<Securement of Operation Space>

Now, the motion of the printing unit according to the present embodiment for securing an operation space is described. The X-direction moving transfer device 4f is switchable between the transfer mode and the operation mode shown in FIG. 20. That is, the X-direction moving portion 40f is pivotable with respect to the fixed portion 41f. Specifically, the X-direction moving portion 40f is vertically pivotable with respect to the fixed portion 41f about the pivot shafts 420fa and 420fb. The transfer mode and the operation mode are switched utilizing the pivoting mechanism.

In the transfer mode, the X-direction moving portion 40f is tilted to the right side (downstream side) of the fixed portion 41f. That is, the fixed portion 41f and the X-direction moving portion 40f are arranged side by side in the left-right direction. Then, the circuit board 90f is transferred. The moving portion base portion 402f of the X-direction moving portion 40f is supported by the bottom plate portion 418f from below.

In the operation mode, as shown in FIG. 20, the X-direction moving portion 40f is pivoted to stand upright using the pivoting mechanism described above. Then, an operation space is secured at a position that is on the right side of the X-direction moving transfer device 4f and that is on the left front side of the screen printing machine 3.

<Function and Effect>

Now, the function and effect of the printing unit according to the present embodiment are described. The printing unit according to the present embodiment has the same function and effect as those of the printing unit according to the third embodiment as far as components that are common in configuration are concerned.

According to the printing unit of the present embodiment, as shown in FIG. 20, the transfer mode and the operation mode can be easily switched using the pivoting mechanism of the X-direction moving transfer device 4f. In the transfer mode, the circuit board can be transferred by delivering the circuit board from the fixed portion 41f to the X-direction moving portion 40f.

According to the printing unit of the present embodiment, the X-direction moving transfer device 4f of an existing flip-up type is used. Therefore, the production lines can be constructed without developing devices anew.

Fifth Embodiment

The printing unit according to the present embodiment is different from the printing unit according to the second embodiment only in the configuration of the Y-direction moving transfer device. The differences will be mainly described herein.

<Configuration of Printing Unit>

First, the configuration of the printing unit according to the present embodiment is described.

[Configuration of Screen Printing Machine, Board Supply Device, and Loader Devices]

The screen printing machine, the board supply device, and the loader devices are identical in configuration to those according to the second embodiment.

[Configuration of Y-Direction Moving Transfer Device]

Figure 21:
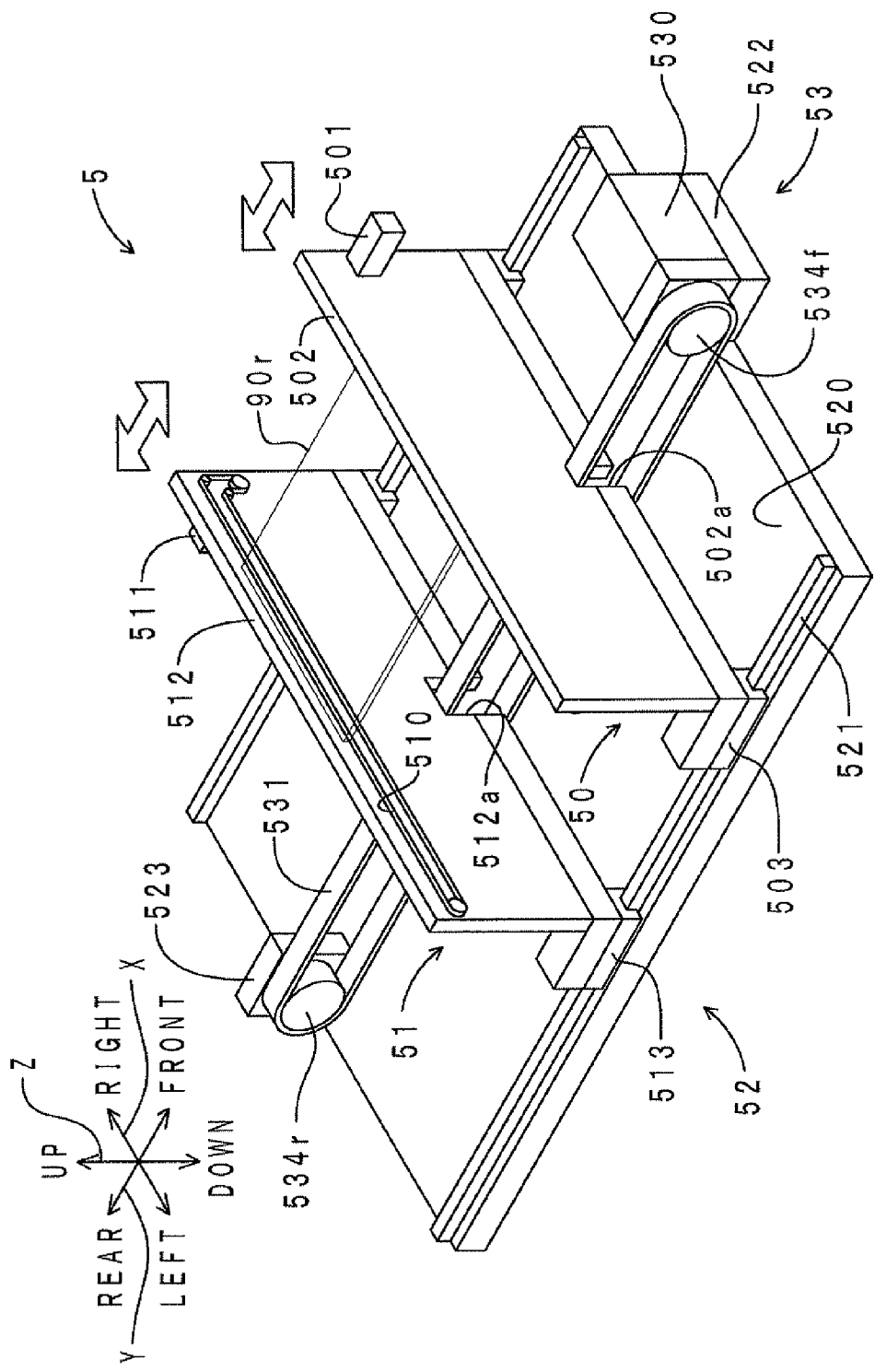
FIG. 21 is a perspective view of a Y-direction moving transfer device of a printing unit according to a fifth embodiment of the present invention.
Figure 22:
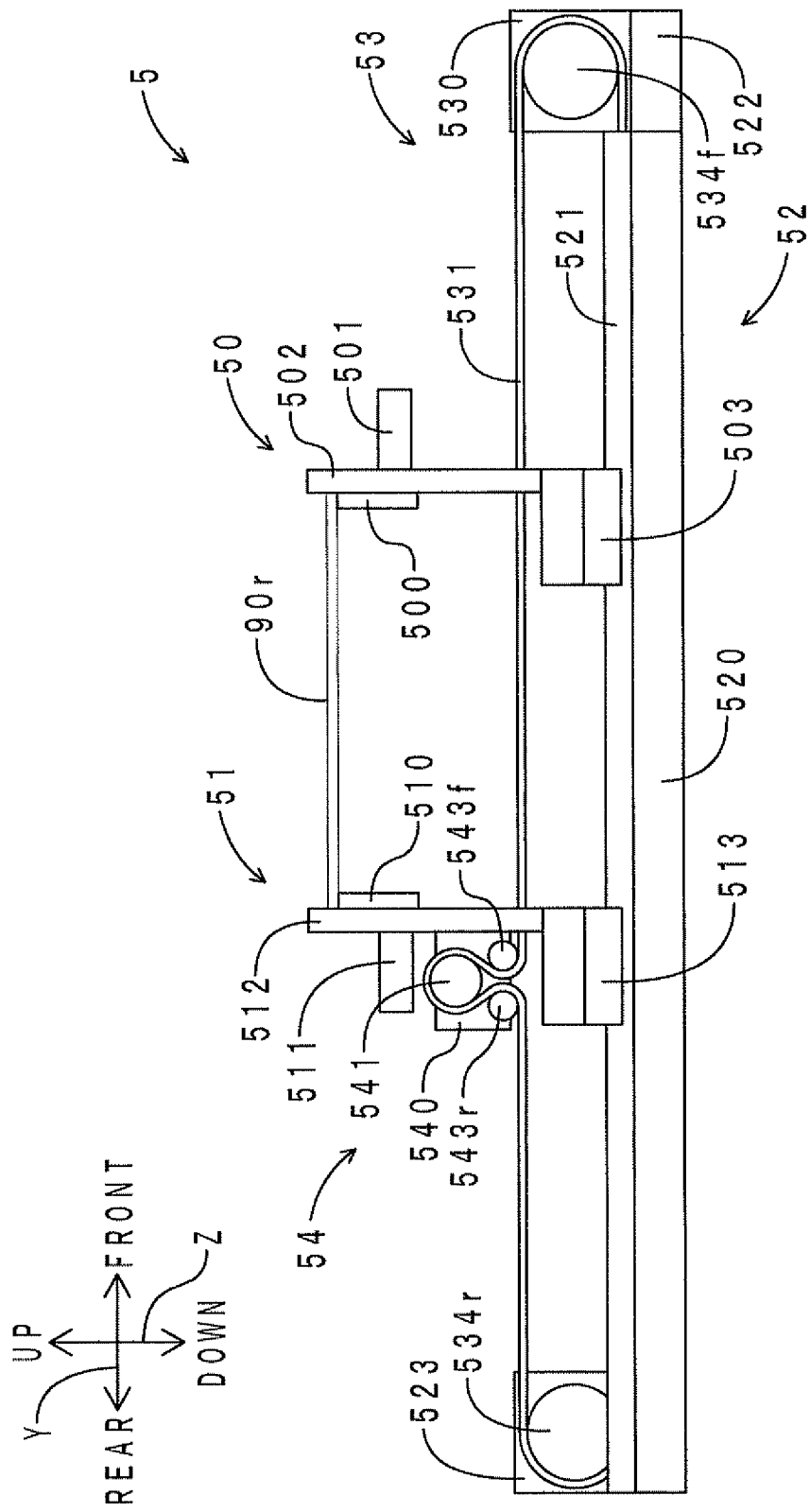
FIG. 22 is a left side view of the Y-direction moving transfer device.

FIG. 21 is a perspective view of the Y-direction moving transfer device of the printing unit according to the present embodiment. Components corresponding to those of FIG. 13 are denoted by the same reference symbols. FIG. 22 is a left side view of the Y-direction moving transfer device. As shown in FIGS. 21 and 22, the Y-direction moving transfer device 5 includes a reference wall portion 50, a driven wall portion 51, a base member 52, a first driving device 53, and a second driving device 54.

The base member 52 includes a base member main body 520, a pair of Y-direction guide rails 521, a motor attachment portion 522, and a pulley attachment portion 523. The base member main body 520 assumes the shape of a rectangular plate. Each of the pair of Y-direction guide rails 521 assumes the shape of a rectangular column. The pair of Y-direction guide rails 521 are disposed along the left edge and the right edge of the upper surface of the base member main body 520. The motor attachment portion 522 is disposed at the front edge of the base member main body 520. The pulley attachment portion 523 is provided to extend upward in the vicinity of the rear edge of the upper surface of the base member main body 520.

The first driving device 53 includes a first motor 530, a timing belt 531, a driving pulley 534f, and a driven pulley 534r. The first motor 530 is attached to the upper surface of the motor attachment portion 522. The driving pulley 534f is coupled to a rotary shaft (not shown) of the first motor 530. The driven pulley 534r is rotatably attached to the left surface of the pulley attachment portion 523. The timing belt 531 is wound around the driving pulley 534f and the driven pulley 534r to extend between the driving pulley 534f and the driven pulley 534r.

The reference wall portion 50 includes a reference conveyer 500, a reference conveyer driving motor 501, a wall portion main body 502, and a pair of guided blocks 503. The wall portion main body 502 assumes the shape of a rectangular plate. A belt fixation recess 502a is formed in the lower surface of the wall portion main body 502. The timing belt 531 is inserted through the belt fixation recess 502a so as to be relatively movable. The belt fixation recess 502a is fixed to the timing belt 531. The reference conveyer 500 is disposed in the vicinity of the upper edge of the rear surface of the wall portion main body 502. The reference conveyer 500 extends in the left-right direction. The reference conveyer driving motor 501 is disposed in the vicinity of the upper right corner of the front surface of the wall portion main body 502. The reference conveyer driving motor 501 drives the reference conveyer 500. The pair of guided blocks 503 are fixed to both the left and right ends of the lower surface of the wall portion main body 502. The pair of guided blocks 503 are in sliding contact with the pair of Y-direction guide rails 521.

The driven wall portion 51 includes a driven conveyer 510, a driven conveyer driving motor 511, a wall portion main body 512, and a pair of guided blocks 513. The wall portion main body 512 assumes the shape of a rectangular plate. A belt insertion recess 512a is formed in the lower surface of the wall portion main body 512. The timing belt 531 is inserted through the belt insertion recess 512a. The driven conveyer 510 is disposed in the vicinity of the upper edge of the front surface of the wall portion main body 512. The driven conveyer 510 extends in the left-right direction. The driven conveyer driving motor 511 is disposed in the vicinity of the upper right corner of the rear surface of the wall portion main body 512. The driven conveyer driving motor 511 drives the driven conveyer 510. The pair of guided blocks 513 are fixed to both the left and right ends of the lower surface of the wall portion main body 512. The pair of guided blocks 513 are in sliding contact with the pair of Y-direction guide rails 521.

As shown in FIG. 22, the second driving device 54 includes a second motor 540, a main pulley 541, and a pair of sub pulleys 543f and 543r. The second motor 540 is attached to the rear surface of the wall portion main body 512. The main pulley 541 is coupled to a rotary shaft (not shown) of the second motor 540. The pair of sub pulleys 543f and 543r are rotatably attached to the left surface of a bracket (not shown) of the second motor 540. The timing belt 531 is wound around the main pulley 541 and the pair of sub pulleys 543f and 543r.

[Motion of Y-Direction Moving Transfer Device]

In the case of moving the reference wall portion 50 and the driven wall portion 51 at the same time, the first motor 530 is driven. When the first motor 530 is driven, the driving pulley 534*f* is rotated to move the timing belt 531 between the driving pulley 534*f* and the driven pulley 534*r*. The reference wall portion 50 is fixed to the timing belt 531. Therefore, when the timing belt 531 is moved, the reference wall portion 50 is also moved in the front-rear direction. Meanwhile, the driven wall portion 51 is coupled to the timing belt 531 via the main pulley 541 and the pair of sub pulleys 543*f* and 543*r*. Therefore, when the timing belt 531 is moved, the driven wall portion 51 is also moved in the front-rear direction. As described above, the reference wall portion 50 and the driven wall portion 51 can be moved at the same time by driving the first motor 530. This operation is convenient in moving the circuit board 90*r* in the front-rear direction.

In the case of moving only the driven wall portion 51 independently of the reference wall portion 50, the second motor 540 is driven. When the second motor 540 is driven, the main pulley 541 is rotated. This causes the main pulley 541 and the pair of sub pulleys 543*f* and 543*r* to be moved in a rolling manner on the timing belt 531 which is stationary. The main pulley 541, that is, the second driving device 54, is fixed to the driven wall portion 51. Therefore, when the main pulley 541 is moved in a rolling manner, the driven wall portion 51 is also moved in the front-rear direction. As described above, only the driven wall portion 51 can be moved independently of the reference wall portion 50 by driving the second motor 540. This operation is convenient in making a tooling change for the circuit board 90*r*.

The reference wall portion 50 and the driven wall portion 51 can be driven separately in the same direction or in opposite directions by driving the first motor 530 and the second motor 540 at the same time. Also, the driven wall portion 51 can be kept apparently stationary.

<Motion During Production of Circuit Board>

The motion of the printing unit according to the present embodiment during production of a circuit board is the same as the motion of the printing unit according to the second embodiment during production of a circuit board. Thus, the description of the motion is omitted herein.

<Securement of Operation Space>

The motion of the printing unit according to the present embodiment for securing an operation space is the same as the motion of the printing unit according to the second embodiment for securing an operation space. Thus, the description of the motion is omitted herein.

<Function and Effect>

Now, the function and effect of the printing unit according to the present embodiment are described. The printing unit according to the present embodiment has the same function and effect as those of the printing unit according to the second embodiment as far as components that are common in configuration are concerned.

According to the Y-direction moving transfer device 5 of the printing unit of the second embodiment, as shown in FIG. 13, the reference wall portion 50 and the driven wall portion 51 are disposed on the shuttle base 57. The circuit board 90*r* is transferred in the X direction using the reference conveyer of the reference wall portion 50 and the driven conveyer 510 of the driven wall portion 51. During a tooling change, the driven wall portion 51 is moved in the Y direction with respect to the reference wall portion 50. Therefore, the dimension, in the Y direction, of the largest circuit board 90*r* that can be transferred relies on the total length of the shuttle base 57 in the Y direction. That is, a circuit board 90*r* that is wider than the total length of the shuttle base 57 in the Y direction cannot be transferred.

In this respect, according to the Y-direction moving transfer device 5 of the printing unit of the present embodiment, as shown in FIG. 21, no shuttle base is disposed in the first place. Therefore, a circuit board 90*r* with a large dimension in the Y direction can be transferred irrespective of the total length of a shuttle base in the Y direction. Specifically, a large-sized circuit board 90*r* with a dimension, in the Y direction, equivalent to the total length of the Y-direction guide rails 521 in the Y direction can be transferred.

In the case of the Y-direction moving transfer device 5 of the printing unit according to the second embodiment, as shown in FIG. 13, not only the reference wall portion 50 and the driven wall portion 51 but also the shuttle base 57 is moved in the Y direction to move the circuit board 90*r* in the Y direction. The shuttle base 57 is relatively heavy. Thus, in order to move the heavy shuttle base 57 in the Y direction, a shuttle base ball screw portion driving motor 560 with a high capacity is necessary. In addition, a shuttle base ball screw portion 561 with a high allowable weight is necessary.

In this respect, as shown in FIG. 21, the first driving device 53 according to the present embodiment drives only the reference wall portion 50 and the driven wall portion 51 in the Y direction. The reference wall portion 50 and the driven wall portion 51 are relatively lightweight. Thus, the capacity of the first motor 530 may be low. In addition, a driving pulley 534*f*, a driven pulley 534*r*, and a timing belt 531 with a high allowable weight are unnecessary. This also facilitates increasing the speed of movement in the Y direction.

In the case of the Y-direction moving transfer device 5 of the printing unit according to the second embodiment, as shown in FIG. 13, two types of Y-direction guide rails, namely the shuttle base guide rails 550 and the driven wall portion guide rails 570, are necessary. This results in a complicated structure. In this respect, according to the first driving device 53 of the present embodiment, as shown in FIG. 21, only one type of Y-direction guide rails, namely the Y-direction guide rails 521, is used. This results in a simple structure.

According to the Y-direction moving transfer device 5 of the printing unit of the present embodiment, the reference wall portion 50 and the driven wall portion 51 can be easily moved using a belt-pulley mechanism.

According to the Y-direction moving transfer device 5 of the printing unit of the second embodiment, as shown in FIG. 13, a ball screw portion-nut mechanism for moving the shuttle base 57 and a ball screw portion-nut mechanism for moving the driven wall portion 51 are necessary. This results in a complicated structure.

In this respect, according to the first driving device 53 of the present embodiment, as shown in FIG. 21, only one timing belt 531 is equivalent to the shuttle base ball screw portion 561 and the driven wall portion ball screw portion 581 of FIG. 13. This results in a simple structure. The Y-direction moving transfer device 5 according to the present embodiment may be used independently of the printing unit according to the present embodiment.

Sixth Embodiment

The printing unit according to the present embodiment is different from the printing unit according to the fifth embodiment only in the configuration of the first driving device and the second driving device of the Y-direction moving transfer device. The differences will be mainly described herein.

Figure 23:
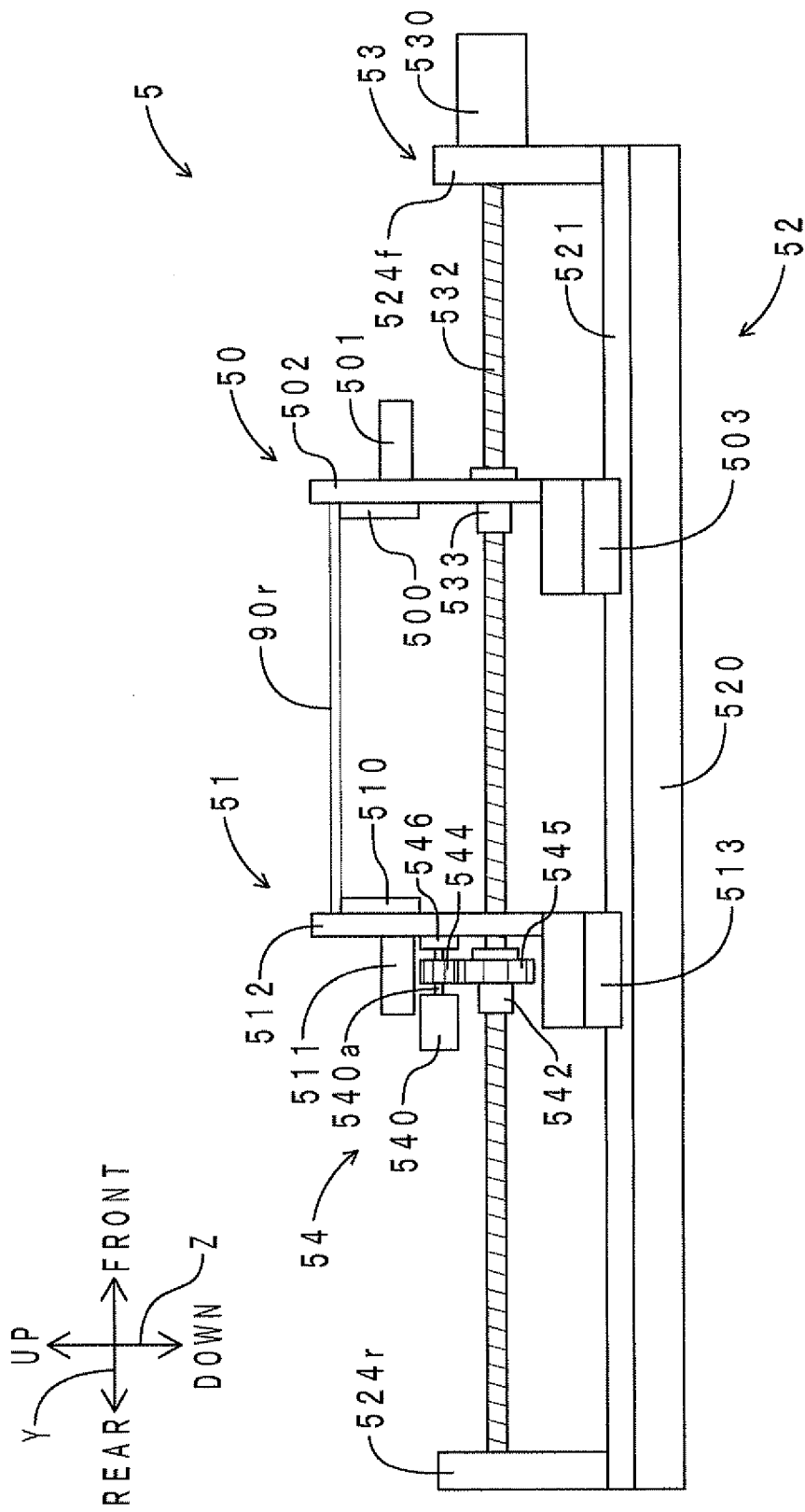
FIG. 23 is a left side view of a Y-direction moving transfer device of a printing unit according to a sixth embodiment of the present invention.
Figure 24:
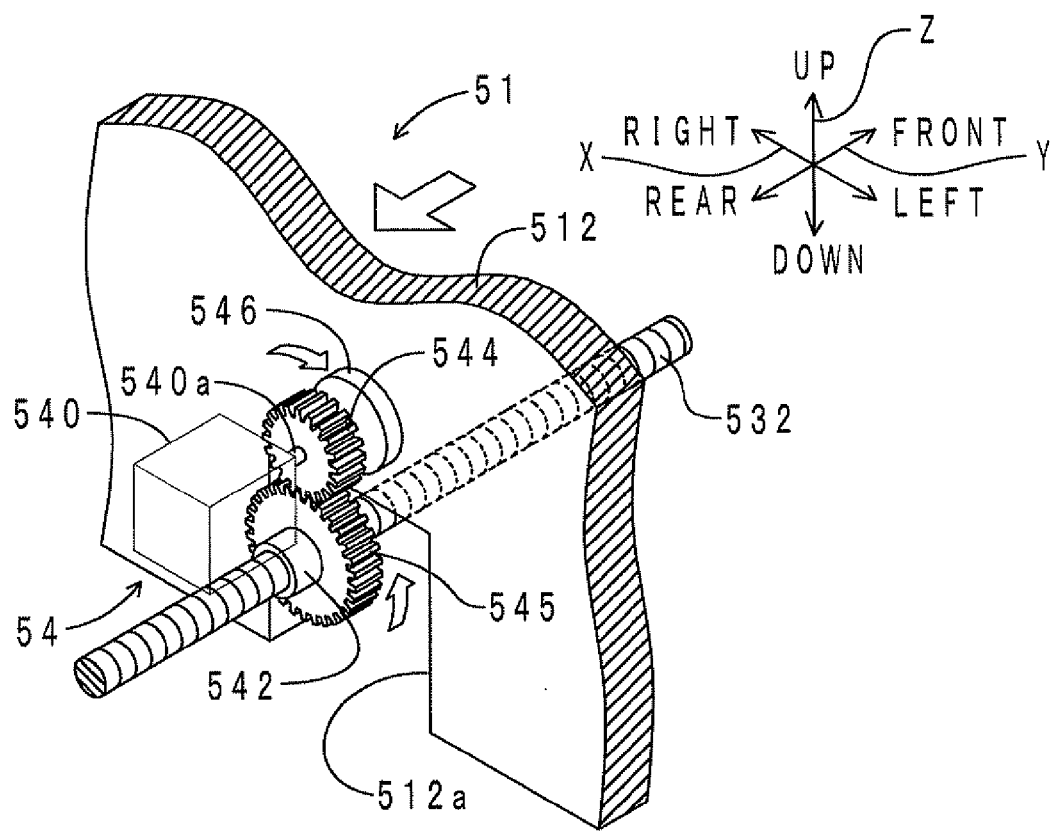
FIG. 24 is a perspective view of the Y-direction moving transfer device in the vicinity of a second driving device.

FIG. 23 is a left side view of the Y-direction moving transfer device of the printing unit according to the present embodiment. FIG. 24 is a perspective view of the Y-direction moving transfer device in the vicinity of the second driving device. Components corresponding to those of FIGS. 21 and 22 are denoted by the same reference symbols.

As shown in FIG. 23, the base member 52 includes a pair of upright wall portions 524f and 524r. Each of the pair of upright wall portions 524f and 524r assumes the shape of a narrow plate. The pair of upright wall portions 524f and 524r are disposed along the front edge and the rear edge of the base member main body 520.

The first driving device 53 includes a first motor 530, a ball screw portion 532, and a nut 533. The first motor 530 is attached to the front surface of the front upright wall portion 524f. The ball screw portion 532 is provided to extend between the pair of upright wall portions 524f and 524r so as to be rotatable about an axis of the ball screw portion 532. The ball screw portion 532 penetrates through the reference wall portion 50 and the driven wall portion 51. The front end of the ball screw portion 532 is coupled to a rotary shaft (not shown) of the first motor 530. The nut 533 is mounted around the ball screw portion 532. The nut 533 is attached to the wall portion main body 502 of the reference wall portion 50.

As shown in FIG. 24, the second driving device 54 includes a second motor 540 (shown as transparent in FIG. 24 for convenience of description), a nut 542, a driving gear 544, a driven gear 545, and a support portion 546. The second motor 540 is attached to the wall portion main body 512 of the driven wall portion 51 via a bracket (not shown). A rotary shaft 540a of the second motor 540 is rotatably supported by the support portion 546. The rotary shaft 540a is rotatable about its axis. The driving gear 544 is fixed to the rotary shaft 540a. Meanwhile, the nut 542 is mounted around the ball screw portion 532. Also, the driven gear 545 is fixed to the outer peripheral surface of the nut 542. The driving gear 544 and the driven gear 545 are meshed with each other.

In the case of moving the reference wall portion 50 and the driven wall portion 51 at the same time, as shown in FIG. 23, the first motor 530 is driven. When the first motor 530 is driven, the ball screw portion 532 is rotated about its axis. The two nuts 533 and 542 are mounted around the ball screw portion 532. Therefore, the rotation of the ball screw portion 532 moves the two nuts 533 and 542 in the front-rear direction. The nut 533 is attached to the reference wall portion 50. Therefore, when the nut 533 is moved, the reference wall portion 50 is also moved. Also, the nut 542 is coupled to the driven wall portion 51 via the second driving device 54. Therefore, when the nut 542 is moved, the driven wall portion 51 is also moved. As described above, the reference wall portion 50 and the driven wall portion 51 can be moved at the same time by driving the first motor 530. This operation is convenient in moving the circuit board 90r in the front-rear direction.

In the case of moving only the driven wall portion 51 independently of the reference wall portion 50, the second motor 540 is driven. When the second motor 540 is driven, the driving gear 544 and the driven gear 545 are rotated. Therefore, the nut 542 is moved in a screwing manner with respect to the ball screw portion 532 which is stationary. The nut 542, that is, the second driving device 54, is fixed to the driven wall portion 51. Therefore, when the nut 542 is moved in a screwing manner, the driven wall portion 51 is also moved in the front-rear direction. As described above, only the driven wall portion 51 can be moved independently of the reference wall portion 50 by driving the second motor 540. This operation is convenient in making a tooling change for the circuit board 90r.

The reference wall portion 50 and the driven wall portion 51 can be driven separately in the same direction or in opposite directions by driving the first motor 530 and the second motor 540 at the same time. Also, the driven wall portion 51 can be kept apparently stationary.

The printing unit according to the present embodiment has the same function and effect as those of the printing unit according to the fifth embodiment as far as components that are common in configuration are concerned.

According to the Y-direction moving transfer device 5 of the printing unit of the present embodiment, the reference wall portion 50 and the driven wall portion 51 can be easily moved using a ball screw portion-nut mechanism.

According to the Y-direction moving transfer device 5 of the printing unit of the second embodiment, as shown in FIG. 13, a ball screw portion-nut mechanism for moving the shuttle base 57 and a ball screw portion-nut mechanism for moving the driven wall portion 51 are necessary. This results in a complicated structure.

In this respect, according to the first driving device 53 of the present embodiment, as shown in FIG. 23, only one ball screw portion 532 is equivalent to the shuttle base ball screw portion 561 and the driven wall portion ball screw portion 581 of FIG. 13. This results in a simple structure. The Y-direction moving transfer device 5 according to the present embodiment may be used independently of the printing unit according to the present embodiment.

{Other Forms}

The printing unit 1 and the screen printing machine 3 according to the embodiments of the present invention have been described above. However, the present invention should not be specifically limited to the embodiments described above. The present invention can also be implemented in various modified or improved forms that may occur to those skilled in the art.

For example, the transfer modules 33f and 33r and the supply modules 20f and 20r may be used independently of the screen printing machine 3. For example, the transfer modules 33f and 33r and the supply modules 20f and 20r may be used as incorporated in the electronic component mounting machine 94. That is, the transfer modules 33f and 33r and the supply modules 20f and 20r may be used in a "device that requires replacement work for the back-up member 96f" other than the screen printing machine 3.

While the printing unit 1 and the screen printing machine 3 according to the embodiments described above use the support members 961f each in the shape of a rectangular column, the support members 961f may be each in the shape of a pin that is provided to project upward from the back-up plate 960f.

While the production lines 95f and 95r are straight in the printing unit 1 according to the embodiments described above, the production lines 95f and 95r may be curved. Also, the production lines 95f and 95r may be generally straight and partially include a curved portion. The Y direction in the curved portion corresponds to a direction generally perpendicular to a tangent to the curved portion.

In the printing unit 1 and the screen printing machine 3 according to the embodiments described above, during a tooling change, the operator 93f stands in the operation space 92f that is on the front side of the screen printing machine 3 in the Y direction to replace a replacement part for printing via the printing portion replacement access port 320 which opens toward the upstream side in the X direction. In addition, the operator 93f replaces the back-up member 96f via the back-up member replacement access port 321 which opens toward the upstream side in the X direction. However, the operator 93f may stand on the left side of the screen printing machine 3 in the X direction to replace a replacement part for printing and the back-up member 96f. In this case, the operation space 92f that is on the front side of the screen printing machine 3 in the Y direction is unnecessary.

The number of electronic component mounting machines 94 is also not specifically limited. Several or dozens of electronic component mounting machines 94 may be arranged on the downstream side of the screen printing machine 3 in the X direction. The merit of the printing unit 1 and the screen printing machine 3 according to the embodiments, that the operation space 921 provided only on one side in the Y direction is sufficient, is greater as the production lines 95*f* and 95*r* are longer.

Figure 25:
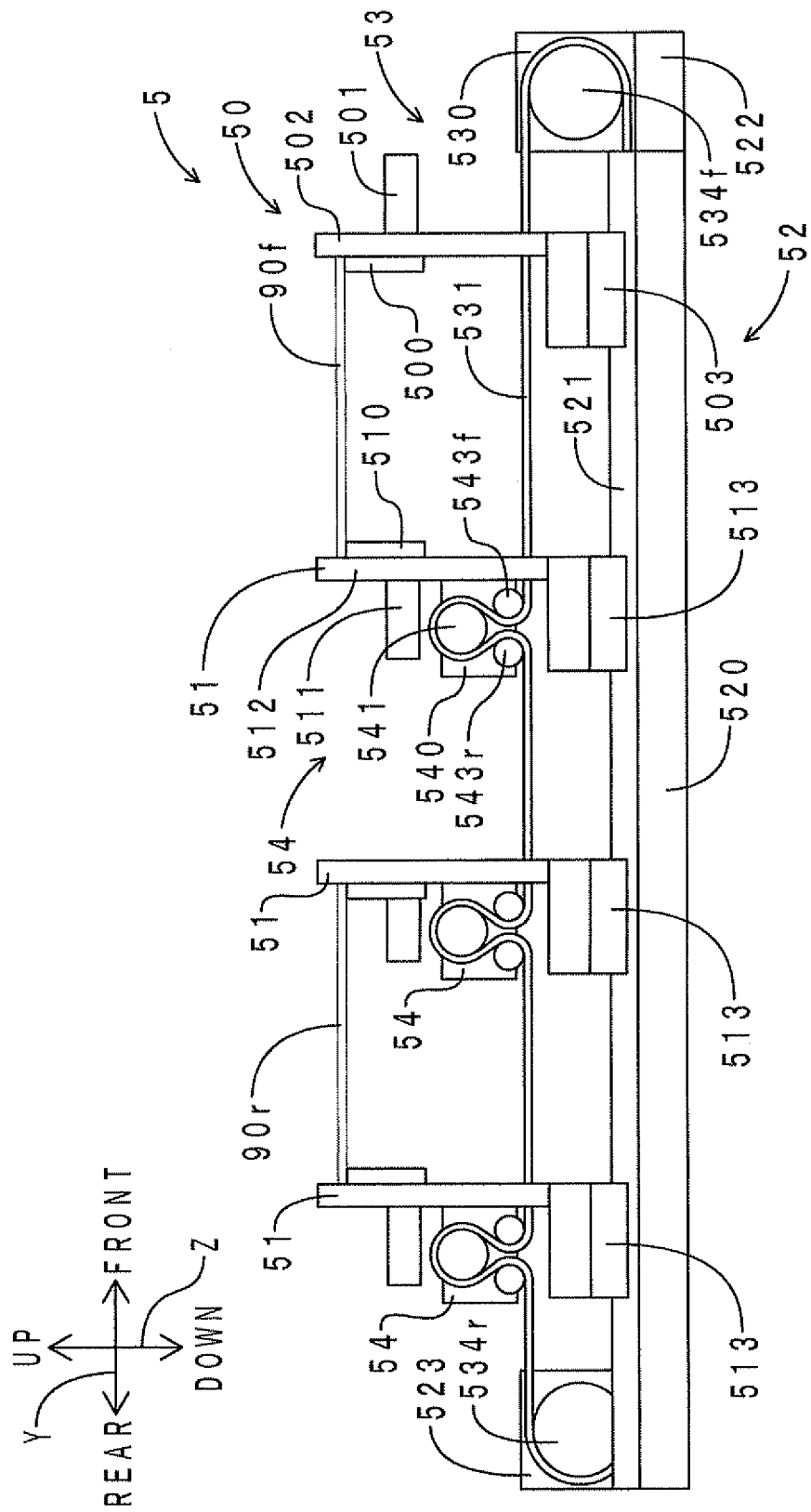
FIG. 25 is a left side view of a Y-direction moving transfer device of a printing unit according to another embodiment of the present invention.
Figure 26:
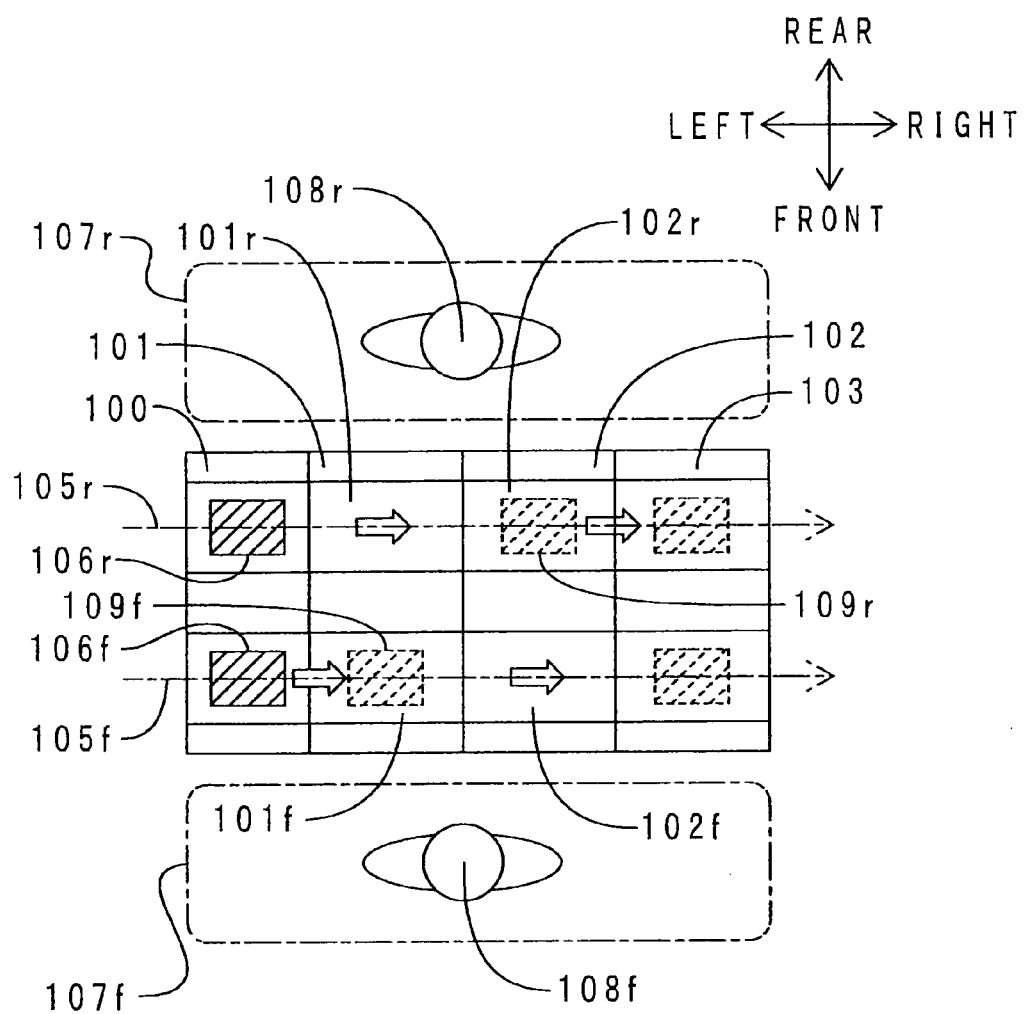
FIG. 26 is a schematic view of a production line in which two screen printing machines are arranged in series.
Figure 27:
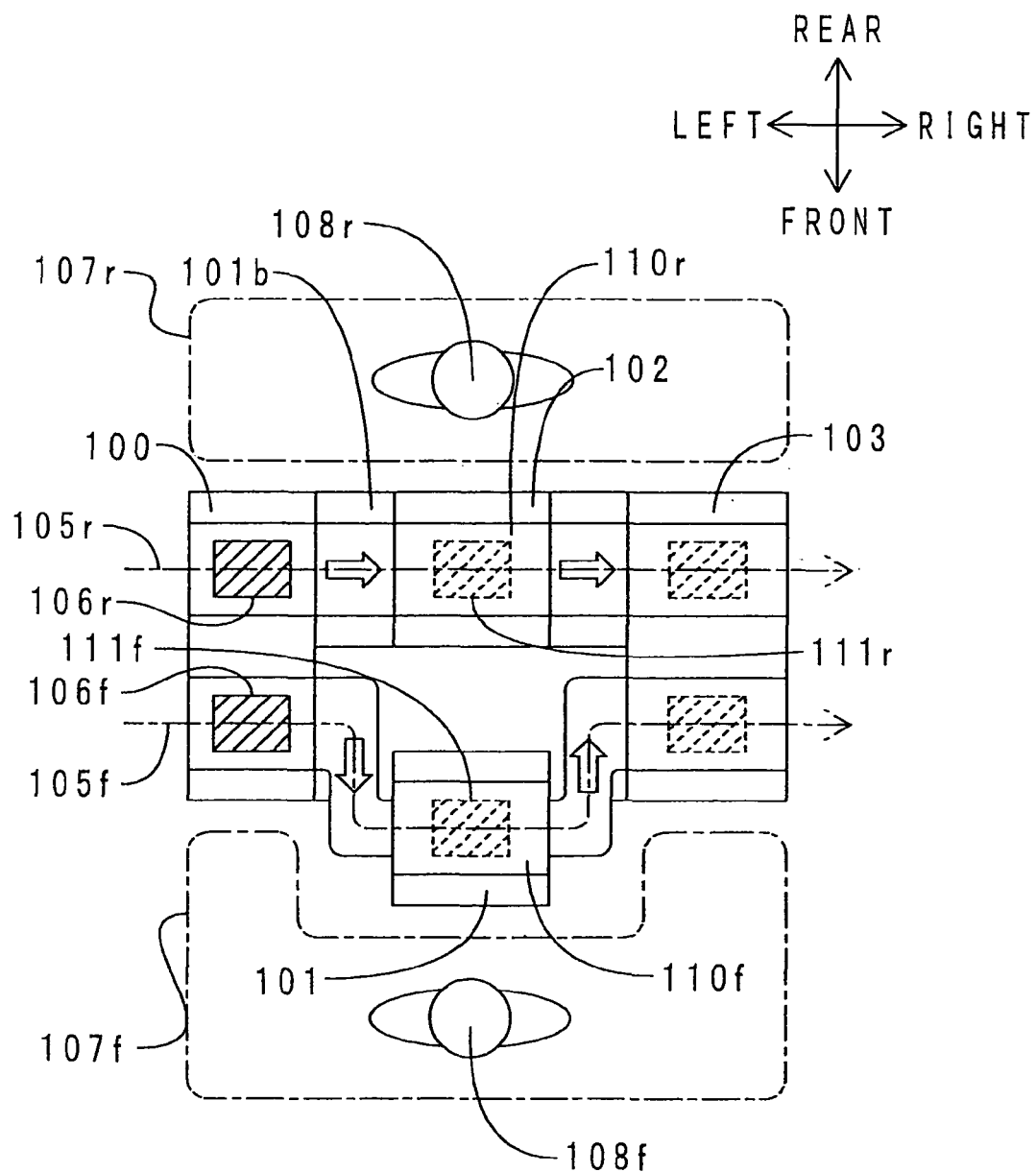
FIG. 27 is a schematic view of a production line in which two screen printing machines are arranged in parallel.

While only one driven wall portion is disposed in the Y-direction moving transfer device in the fifth embodiment and the sixth embodiment described above, a plurality of driven wall portions may be disposed in the Y-direction moving transfer device. FIG. 25 is a left side view of a Y-direction moving transfer device of a printing unit according to another embodiment. Components corresponding to those of FIG. 22 are denoted by the same reference symbols.

As shown in FIG. 25, three driven wall portions 51 may be disposed. In addition, three second driving devices 54 may be disposed. In this way, double lanes can be provided. That is, the circuit board 90*f* in the front lane can be transferred by the reference wall portion 50 and the frontmost driven wall portion 51, and the circuit board 90*r* in the rear lane can be transferred by the middle driven wall portion 51 and the rearmost driven wall portion 51. More lanes can be provided by further increasing the number of driven wall portions 51 and second driving devices 54. The belt-pulley mechanisms shown in FIG. 25 may be replaced with the ball screw portion-nut mechanisms shown in FIG. 23.

In the sixth embodiment described above, as shown in FIG. 24, the driving force of the second motor 540 is transmitted to the nut 542 via the driving gear 544 and the driven gear 545, that is, via a gear mechanism. However, the driving force of the second motor 540 may be transmitted to the nut 542 via a belt-pulley mechanism.

While the loader devices 7*f* and 7*r* each of a magazine-rack type are used in the second embodiment to the sixth embodiment described above, other types of loader devices may be used such as a bare board stacker (a type of a stacker that takes one circuit board at a time from a plurality of stacked circuit boards using a suction nozzle to mount the circuit board on a production line), for example.

While the operation space 98*f* is secured at a position that is on the front side of the board supply device 2 and that is between the screen printing machine 3 and the Y-direction moving transfer device 5 as shown in FIGS. 12 and 14 to 16 in the second embodiment described above, the operation space 98*f* and the board supply device 2 may be disposed oppositely in the front-rear direction.

What is claimed is:

1. A screen printing machine comprising:
 a plurality of lanes arranged in a Y direction and each having a printing position at which solder is printed on a circuit board;
 a housing surrounding the printing position and having a replacement access port which opens in an X direction,
 the X direction being a direction in which the circuit board is transferred, the Y direction being a generally horizontal direction which is generally perpendicular to the X direction, and a Z direction being a generally vertical direction which is generally perpendicular to the X direction and the Y direction; and
 a plurality of transfer modules each including:
  a board transfer section that transfers the circuit board in the X direction and that is configured to be variable in dimension in the Y direction; and
  a back-up member transfer section disposed below the board transfer section in the Z direction, the back-up member transfer section being configured to allow a back-up member to be moved in the X direction and to allow the back-up member to be carried in and out in the X direction via the replacement access port, wherein
 the back-up member supports the circuit board from below at the printing position,
 a replacement part disposed in the plurality of lanes is replaceable from the replacement access port during a tooling change in which a type of the circuit board is changed, the replacement part being movably disposed in the plurality of lanes with respect to the housing, and
 the replacement part is one or more of (1) a screen mask disposed above the circuit board in the Z direction at the printing position, the screen mask having screen holes through which the solder passes, (2) a squeegee disposed above the screen mask in the Z direction at the printing position to squeeze the solder into the screen holes, and (3) the back-up member.

2. The screen printing machine according to claim 1, wherein
 the transfer modules each further include:
  a transfer first fixed wall portion that includes a board transfer fixed conveyer extending in the X direction and a back-up member transfer first fixed conveyer disposed below the board transfer fixed conveyer in the Z direction and extending in the X direction;
  a transfer movable wall portion that is movable in the Y direction and that includes a board transfer movable conveyer facing the board transfer fixed conveyer in the Y direction and extending in the X direction; and
  a transfer second fixed wall portion that includes a back-up member transfer second fixed conveyer facing the back-up member transfer first fixed conveyer in the Y direction and extending in the X direction,
 the board transfer section includes the board transfer fixed conveyer and the board transfer movable conveyer,
 the back-up member transfer section includes the back-up member transfer first fixed conveyer and the back-up member transfer second fixed conveyer,
 the back-up member includes a back-up plate and a support member that is provided to project upward in the Z direction from the back-up plate to support the circuit board from below at the printing position, and
 a distance between the back-up member transfer first fixed conveyer and the back-up member transfer second fixed conveyer in the Y direction corresponds to a dimension, in the Y direction, of the back-up plate that is capable of supporting a circuit board, of a plurality of types of circuit boards, that has the largest dimension in the Y direction.

3. The screen printing machine according to claim 2, wherein
 the transfer movable wall portion further includes a back-up member transfer movable conveyer disposed below the board transfer movable conveyer in the Z direction, facing the back-up member transfer first fixed conveyer in the Y direction, and extending in the X direction, and
 when the back-up member is carried in and out in the X direction, the transfer movable wall portion moves in the Y direction to be arranged in line with the transfer second fixed wall portion in the X direction so that the back-up member transfer movable conveyer and the back-up member transfer second fixed conveyer are arranged in line in the X direction.

4. A printing unit comprising:
the screen printing machine according to claim 1; and
a board supply device including
a plurality of supply modules each including:
a board supply section that transfers the circuit board in the X direction and that is variable in dimension in the Y direction, the board supply section being arranged on an upstream side of the board transfer section in the X direction; and
a back-up member supply section disposed below the board supply section in the Z direction and allowing the back-up member to be carried in and out in the X direction via the replacement access port, the back-up member supply section being arranged on an upstream side of the back-up member transfer section in the X direction.

5. The printing unit according to claim 4, wherein
the supply modules each further include:
a supply first fixed wall portion that includes a board supply fixed conveyer extending in the X direction and a back-up member supply first fixed conveyer disposed below the board supply fixed conveyer in the Z direction and extending in the X direction;
a supply movable wall portion that is movable in the Y direction and that includes a board supply movable conveyer facing the board supply fixed conveyer in the Y direction and extending in the X direction; and
a supply second fixed wall portion that includes a back-up member supply second fixed conveyer facing the back-up member supply first fixed conveyer in the Y direction and extending in the X direction,
the board supply section includes the board supply fixed conveyer and the board supply movable conveyer,
the back-up member supply section includes the back-up member supply first fixed conveyer and the back-up member supply second fixed conveyer,
the back-up member includes a back-up plate and a support member that is provided to project upward in the Z direction from the back-up plate to support the circuit board from below at the printing position, and
a distance between the back-up member supply first fixed conveyer and the back-up member supply second fixed conveyer in the Y direction corresponds to a dimension, in the Y direction, of the back-up plate that is capable of supporting a circuit board, of a plurality of types of circuit boards, that has the largest dimension in the Y direction.

6. A screen printing machine comprising:
a plurality of lanes arranged in a Y direction and each having a printing position at which solder is printed on a circuit board;
a housing surrounding the printing position and having a replacement access port which opens in an X direction,
the X direction being a direction in which the circuit board is transferred, the Y direction being a generally horizontal direction which is generally perpendicular to the X direction, and a Z direction being a generally vertical direction which is generally perpendicular to the X direction and the Y direction;
a plurality of transfer modules each including:
a board transfer section that transfers the circuit board in the X direction;
a back-up member transfer section disposed below the board transfer section in the Z direction and allowing a back-up member to be moved in the X direction; and
a printing portion including:
a pair of guide portions extending in the X direction and facing each other in the Y direction, one end of each of the pair of guide portions being disposed in proximity to the replacement access port; and
a screen frame over which a screen mask is spread and which is detachably accommodated in the pair of guide portions via the replacement access port, the screen mask being disposed above the circuit board in the Z direction at the printing position and having screen holes through which the solder passes, wherein
the back-up member supports the circuit board from below at the printing position,
a replacement part disposed in the plurality of lanes is replaceable from the replacement access port during a tooling change in which a type of the circuit board is changed, the replacement part being movably disposed in the plurality of lanes with respect to the housing, and
the replacement part is one or more of (1) the screen mask, (2) a squeegee disposed above the screen mask in the Z direction at the printing position to squeeze the solder into the screen holes, and (3) the back-up member.

* * * * *